(12) United States Patent
Seong et al.

(10) Patent No.: US 9,899,323 B2
(45) Date of Patent: Feb. 20, 2018

(54) INTEGRATED CIRCUIT DEVICE AND METHOD OF MANUFACTURING THE SAME

(71) Applicant: Samsung Electronics Co., Ltd., Suwon-si, Gyeonggi-do (KR)

(72) Inventors: Ho-jun Seong, Suwon-si (KR); Jae-hwang Sim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/377,723

(22) Filed: Dec. 13, 2016

(65) Prior Publication Data

US 2017/0309568 A1 Oct. 26, 2017

(30) Foreign Application Priority Data

Apr. 22, 2016 (KR) .................. 10-2016-0049393

(51) Int. Cl.
*H01L 21/28* (2006.01)
*H01L 23/00* (2006.01)
*H01L 23/528* (2006.01)

(52) U.S. Cl.
CPC .......... *H01L 23/5283* (2013.01); *H01L 24/09* (2013.01)

(58) Field of Classification Search
CPC ........... H01L 21/28123; H01L 21/3213; H01L 21/7685; H01L 21/76897; H01L 23/5283; H01L 24/09; H01L 21/768; H01L 23/528; H01L 21/28; H01L 23/00
See application file for complete search history.

(56) References Cited

U.S. PATENT DOCUMENTS

| 8,142,986 | B2 | 3/2012 | Sim et al. |
| 8,390,051 | B2 | 3/2013 | Bicksler |
| 8,541,306 | B2 | 9/2013 | Yang et al. |
| 8,617,998 | B2 | 12/2013 | Min et al. |
| 8,618,679 | B2 | 12/2013 | Sim et al. |
| 8,629,052 | B2 | 1/2014 | Park et al. |
| 8,785,327 | B2 | 7/2014 | Kikutani |
| 8,874,253 | B2 | 10/2014 | Chen et al. |
| 8,901,746 | B2 | 12/2014 | Park et al. |
| 8,969,215 | B2 | 3/2015 | Sim et al. |
| 8,975,178 | B2 | 3/2015 | Kikutani et al. |
| 9,099,532 | B2 | 8/2015 | Sel et al. |
| 9,147,692 | B2 | 9/2015 | Yang |
| 9,177,854 | B2 | 11/2015 | Nakajima et al. |
| 9,389,472 | B2 * | 7/2016 | Ochiai ................ G02F 1/13458 |
| 9,659,772 | B2 * | 5/2017 | Seong ................ H01L 21/3086 |

(Continued)

FOREIGN PATENT DOCUMENTS

KR 10-2015-0069423 A 6/2015

*Primary Examiner* — Alexander Oscar Williams
(74) *Attorney, Agent, or Firm* — Myers Bigel, P.A.

(57) ABSTRACT

An integrated circuit device includes a first conductive line and a second conductive line that are spaced apart from each other and extend in a first direction to be parallel to each other; and a contact pad including a pad body including a first branch portion from which the first conductive line branches and a second branch portion from which the second conductive line branches and a loop branch portion that is located between the first branch portion and the second branch portion and protrudes from the pad body. Related devices and fabrication methods are also discussed.

20 Claims, 93 Drawing Sheets

(56) References Cited

U.S. PATENT DOCUMENTS

| | | | |
|---|---|---|---|
| 2012/0049377 A1* | 3/2012 | Yang | H01L 21/0337 |
| | | | 257/773 |
| 2013/0048603 A1 | 2/2013 | Kim et al. | |
| 2014/0264893 A1* | 9/2014 | Pratt | H01L 23/528 |
| | | | 257/773 |
| 2015/0255304 A1 | 9/2015 | Kang | |
| 2015/0325478 A1* | 11/2015 | Seong | H01L 21/0337 |
| | | | 257/773 |
| 2016/0197066 A1* | 7/2016 | Uchida | H01L 28/10 |
| | | | 438/3 |
| 2017/0200705 A1* | 7/2017 | Zhang | H01L 25/072 |
| 2017/0212167 A1* | 7/2017 | Wu | G01R 31/2896 |
| 2017/0287825 A1* | 10/2017 | Lee | H01L 23/49827 |

\* cited by examiner

INTEGRATED CIRCUIT DEVICE AND METHOD OF MANUFACTURING THE SAME

CROSS-REFERENCE TO RELATED APPLICATION

This application claims the benefit of and priority from Korean Patent Application No. 10-2016-0049393, filed on Apr. 22, 2016, in the Korean Intellectual Property Office, the disclosure of which is incorporated herein in its entirety by reference.

BACKGROUND

The inventive concepts relate to integrated circuit devices and methods of manufacturing the same.

Pattern miniaturization can be desirable in manufacturing highly integrated semiconductor devices. In order to integrate many devices in a small area, each individual device should be as small as possible, and to this end, a pitch that is a sum of a width of each of patterns to be formed and an interval between the patterns should be as small as possible. As design rules for semiconductor devices have been reduced, there may be limitations in forming patterns having fine pitches due to resolution limits of photolithography processes.

SUMMARY

Embodiments of the inventive concepts provide an integrated circuit device having a layout structure in which higher-density patterns having relatively small widths and relatively small pitches may be formed to have various widths within a resolution limit of a photolithography process.

Embodiments of the inventive concepts also provide methods of manufacturing an integrated circuit device that may enable higher-density patterns having relatively small widths and relatively small pitches to be formed to have various widths within a resolution limit of a photolithography process, may ensure a sufficient process margin when the higher-density patterns are formed, and may simplify or otherwise improve a manufacturing process.

According to some embodiments of the inventive concepts, an integrated circuit device includes conductive lines that extend parallel to one another from a memory cell region to a connection region having a lower pattern density than the memory cell region; and a first contact pad and a second contact pad in the connection region that are integrally connected to a first pair of the conductive lines and a second pair of the conductive lines, respectively, by respective branch portions that extend non-parallel to the conductive lines. At least one of the first and second contact pads comprises a loop branch portion having opposing ends that are integrally connected thereto between the respective branch portions thereof. The loop branch portion extends away from the at least one of the first and second contact pads and toward another of the first and second contact pads in a space therebetween.

In some embodiments, the first pair of the conductive lines and the first contact pad may be arranged in a nested configuration relative to the second pair of the conductive lines and the second contact pad such that the first contact pad is between the second pair of the conductive lines and the loop branch portion extends beyond the first pair of the conductive lines.

In some embodiments, the loop branch portion may be a first loop branch portion having the opposing ends that are integrally connected to the first contact pad between the respective branch portions thereof, and the second contact pad may include a second loop branch portion facing the first loop branch portion and having opposing ends that are integrally connected to the second contact pad between the respective branch portions thereof. In some embodiments, one of the first and second loop branch portions may define a concave shape, and another of the first and second loop branch portions may define a convex shape that is matably adapted to fit the concave shape.

In some embodiments, at least one dummy conductive pattern may be arranged in the space between the first and second contact pads adjacent the loop branch portion thereof and may be electrically isolated from the first and second contact pads.

In some embodiments, the first contact pad may include a first divided portion integrally connected to one of the first pair of the conductive lines, and a second divided portion integrally connected to another of the first pair of the conductive lines and separated from the first divided portion. The second contact pad may include a third divided portion integrally connected to one of the second pair of the conductive lines, and a fourth divided portion integrally connected to another of the second pair of the conductive lines and separated from the third divided portion.

According to some aspects of the inventive concepts, there is provided an integrated circuit device including: a first conductive line and a second conductive line that are spaced apart from each other and extend in a first direction to be parallel to each other; and a contact pad including a pad body comprising a first branch portion from which the first conductive line branches and a second branch portion from which the second conductive line branches and a loop branch portion that is located between the first branch portion and the second branch portion and protrudes from the pad body.

According to some aspects of the inventive concepts, there is provided an integrated circuit device including: a plurality of conductive lines that are spaced apart from one another; a first contact pad shared by a first conductive line and a second conductive line selected from among the plurality of conductive lines and integrally formed with the first conductive line and the second conductive line; and a second contact pad shared by a third conductive line and a fourth conductive line selected from among the plurality of conductive lines and integrally formed with the third conductive line and the fourth conductive line, wherein the first contact pad includes: a first pad body including a first branch portion from which the first conductive line branches and a second branch portion from which the second conductive line branches; and a first loop branch portion that protrudes from the first pad body toward the second contact pad and has both ends integrally connected to the first pad body.

According to some aspects of the inventive concepts, there is provided an integrated circuit device including: a plurality of conductive lines that are spaced apart from one another and extend in a first direction to be parallel to one another; a first divided contact pad integrally connected to a first conductive line selected from among the plurality of conductive lines and including a first branch portion that extends in a second direction that intersects the first direction; a second divided contact pad integrally connected to a second conductive line selected from among the plurality of conductive lines and including a second branch portion that extends in the second direction; a third divided contact pad integrally connected to a third conductive line that is selected from among the plurality of conductive lines and is adjacent to the first conductive line, and including a third branch portion that extends in the second direction to be parallel to the first branch portion; and a fourth divided contact pad integrally connected to a fourth conductive line that is selected from among the plurality of conductive lines and is adjacent to the second conductive line, and including a fourth branch portion that extends in the second direction to be parallel to the second branch portion.

According to another aspect of the inventive concepts, there is provided a method of manufacturing an integrated circuit device, the method including: forming a to-be-etched film on a substrate in a first region and a second region; forming a mask layer on the to-be-etched film in the first region and the second region; forming on the mask layer a first structure including two linear or line portions that longitudinally extend in a first direction over the first region and the second region and have a first width in a second direction that intersects the first direction and a main body portion that has a second width greater than the first width in the second direction, is integrally connected to the two linear or line portions in the second region, and includes a reference hole through which the mask layer is exposed; forming on the mask layer a first spacer layer that covers side walls of the first structure; forming on the first spacer layer in the second region a pad defining mask that covers a part of the reference hole and a portion of the first structure and includes an opening that perpendicularly overlaps the part of the reference hole; forming a first spacer including a first portion that longitudinally extends in the first direction over the first region and the second region and a second portion that is located in the opening in the second region by etching the first spacer layer and the first structure by using the pad defining mask as an etch mask, and removing a portion of the first structure other than the portion that is covered by the pad defining mask; forming a second structure including a first line structure that extends in the first direction over the first region and the second region, two pad holes through which the mask layer is exposed in the second region and a second line structure that separates the two pad holes by etching the mask layer by using the first spacer and a remaining portion of the first structure by using an etch mask; forming a second spacer on side walls of the second structure in the first region and the second region; removing a portion of the second structure, the portion including the first line structure and the second line structure; and etching the to-be-etched film by using the second spacer and a remaining portion of the second structure as an etch mask.

BRIEF DESCRIPTION OF THE DRAWINGS

Embodiments of the inventive concepts will be more clearly understood from the following detailed description taken in conjunction with the accompanying drawings in which:

FIG. 5Q is a block diagram of a memory system employing a memory card including an integrated circuit device according to embodiments.

DETAILED DESCRIPTION OF THE EMBODIMENTS

Figure 1:
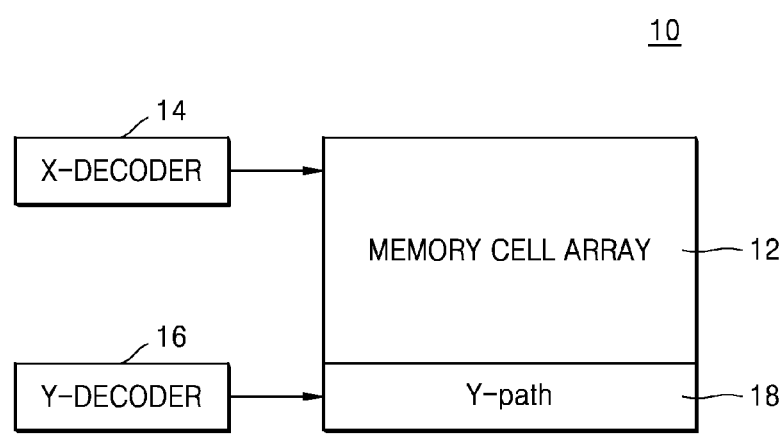
FIG. 1 is a block diagram illustrating a memory cell array and peripheral circuits of an integrated circuit device according to some embodiments.

FIG. 1 is a block diagram illustrating a memory cell array 12 and peripheral circuits of an integrated circuit device 10 according to some embodiments.

Figure 2:
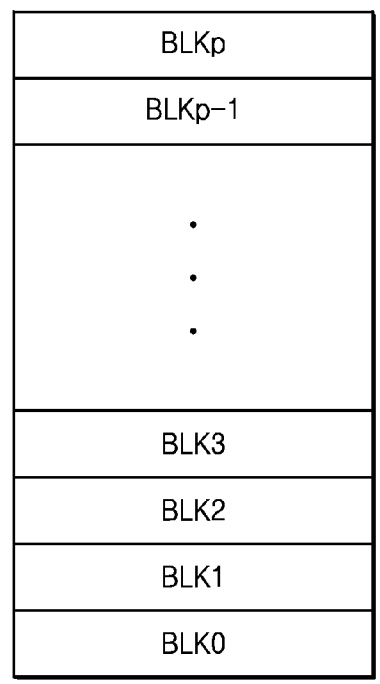
FIG. 2 is a diagram illustrating a plurality of memory cell blocks of the memory cell array of the integrated circuit device of FIG. 1.

FIG. 2 is a diagram illustrating a plurality of memory cell blocks BLK0, BLK1, . . . , BLKp−1, and BLKp of the memory cell array 12 of the integrated circuit device 10 of FIG. 1.

Referring to FIGS. 1 and 2, the integrated circuit device 10 includes the memory cell array 12. The memory cell array 12 includes the plurality of memory cell blocks BLK0, BLK1, . . . , BLKp−1, and BLKp (see FIG. 2).

Figure 3A:
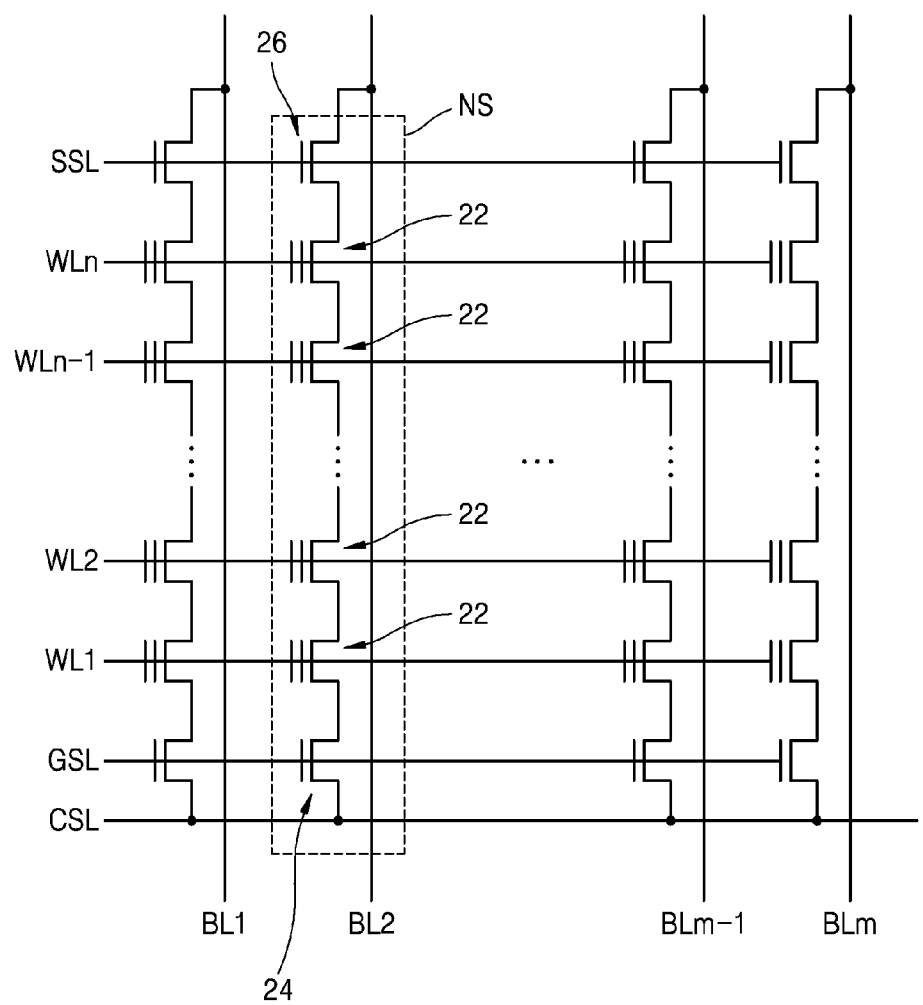
FIG. 3A is a circuit diagram illustrating each of the plurality of memory cell blocks of the memory cell array of FIG. 1.
Figure 3B:
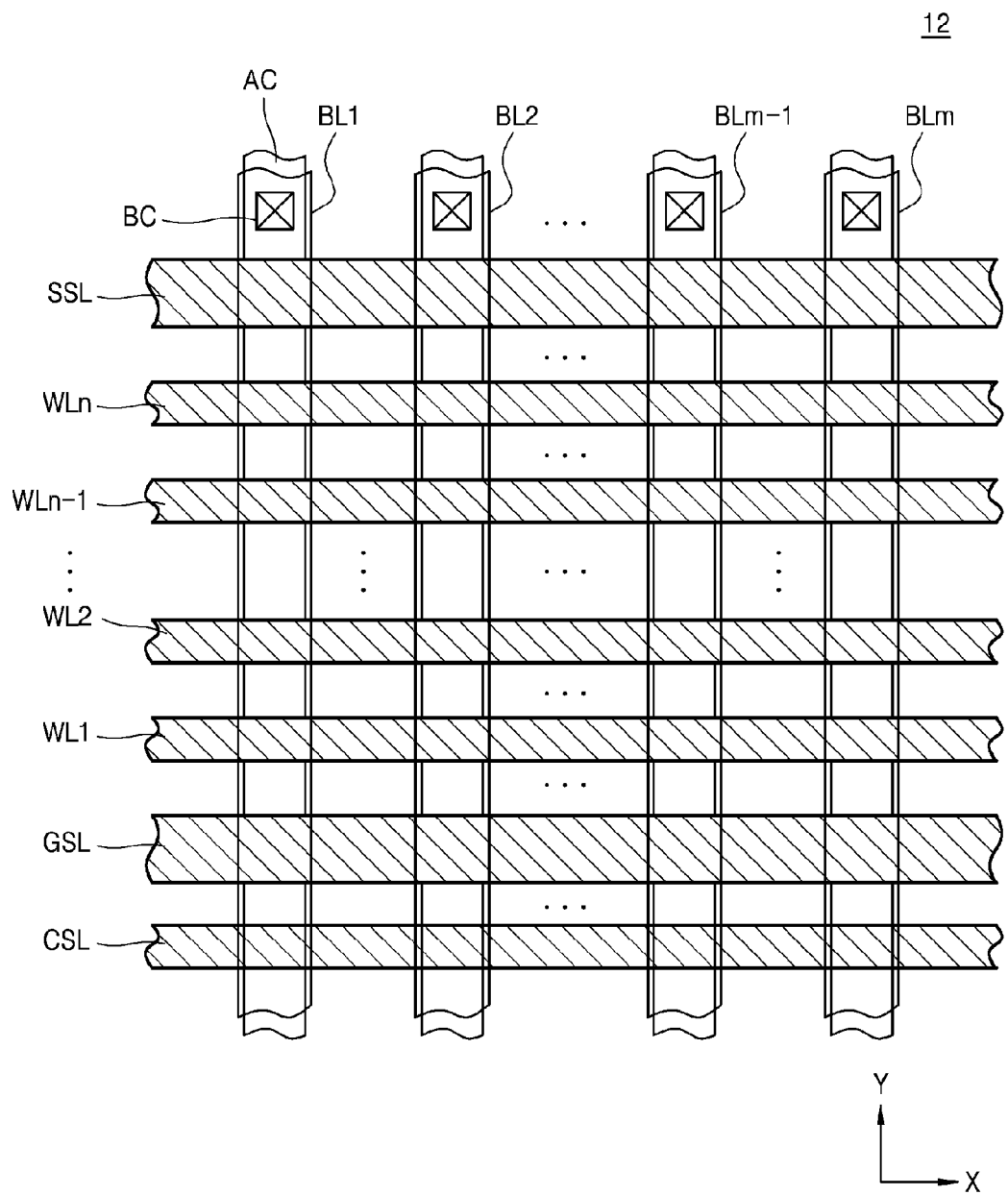
FIG. 3B is a layout diagram illustrating some of the plurality of memory cell blocks of the memory cell array of FIG. 1.
Figure 3C:
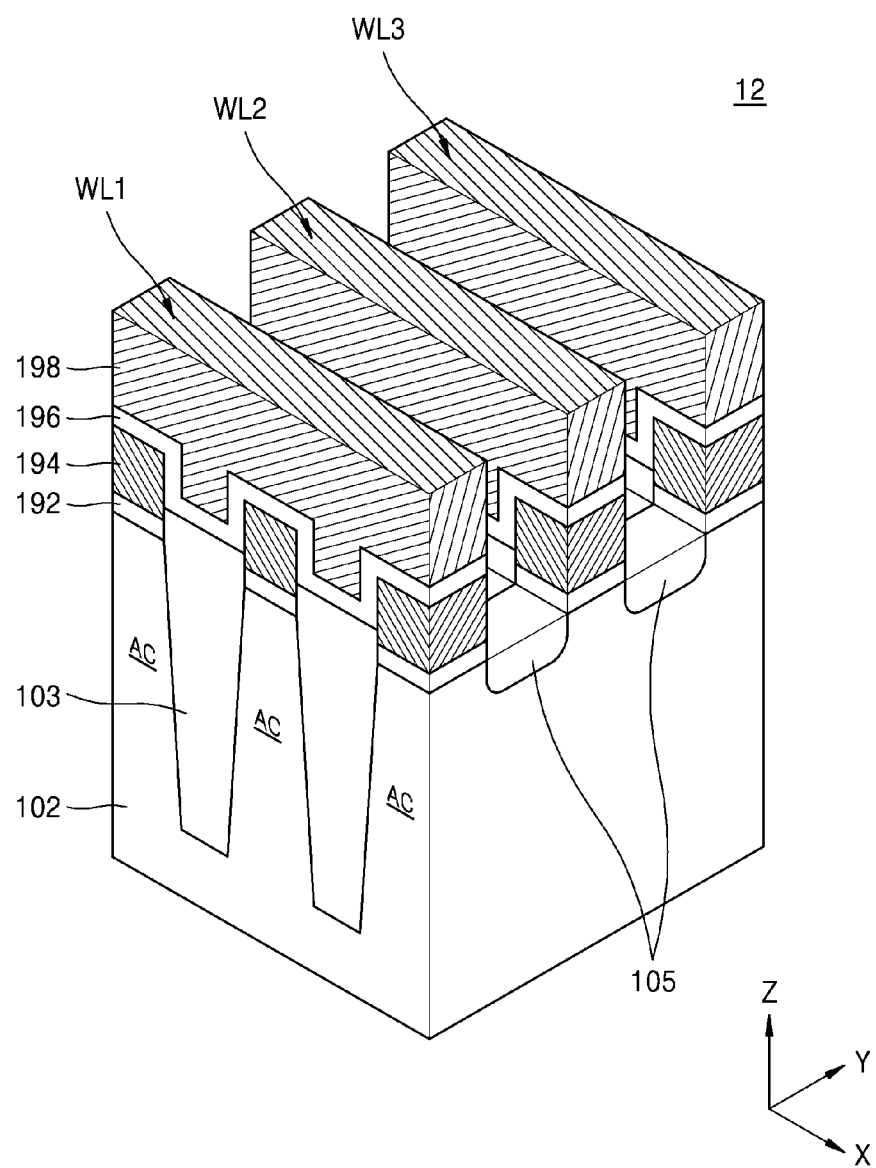
FIG. 3C is a perspective view illustrating some elements of the memory cell array of FIG. 1.

FIGS. 3A through 3C are diagrams for explaining a structure of the memory cell array 12 of FIG. 1. FIG. 3A is a circuit diagram illustrating each of the plurality of memory cell blocks BLK0, BLK1, . . . , BLKp−1, and BLKp of the memory cell array 12. FIG. 3B is a layout diagram illustrating some of the plurality of memory cell blocks BLK0, BLK1, . . . , BLKp−1, and BLKp of the memory cell array 12. FIG. 3C is a perspective view illustrating some elements of the memory cell array 12.

Referring to FIGS. 1 through 3C, the plurality of memory cell blocks BLK0, BLK1, . . . , BLKp−1, and BLKp may respectively include a plurality of cell strings NS (see FIG. 3A).

The plurality of cell strings NS may be connected to bit lines BL0, BL1, . . . , BLm−1, and BLm, a string selection line SSL, word lines WL0, WL1, . . . , WLn−1, and WLn, a ground selection line GSL, and a common source line CSL.

The integrated circuit device 10 includes an X-decoder 14 for selecting the word lines WL0, WL1, . . . , WLn−1, and WLn of the memory cell blocks BLK0, BLK1, . . . , BLKp−1, and BLKp and a Y-decoder 16 for selecting the bit lines BL0, BL1, . . . , BLm−1, and BLm of the memory cell blocks BLK0, BLK1, . . . , BLKp−1, and BLKp. A Y-path circuit 18 may be connected to the Y-decoder 16 and may designate a bit line path in the memory cell array 12.

The plurality of cell strings NS of the memory cell blocks BLK0, BLK1, . . . , BLKp−1, and BLKp of the memory cell array 12 are formed between the bit lines BL0, BL1, . . . , BLm−1, and BLm and the common source line CSL. Each of the plurality of cell strings NS includes a plurality of memory cells 22 that are connected in series. Gate electrodes of the plurality of memory cells 22 included in one cell string NS may be connected to different word lines WL0, WL1, . . . , WLn−1, and WLn. A ground selection transistor 24 connected to the ground selection line GSL and a string selection transistor 26 connected to the string selection line SSL are disposed at both ends of the cell string NS. The ground selection transistor 24 and the string selection transistor 26 may control electrical connection between the plurality of memory cells 22 and the bit lines BL0, BL1, . . . , BLm−1, and BLm and the common source line CSL. Memory cells connected to one of the word lines WL0, WL1, . . . , WLn−1, and WLn through the plurality of cell string NS may form one page or byte.

In the integrated circuit device 10, in order to perform a read operation or a write operation by selecting a predetermined memory cell, the predetermined memory cell may be selected by selecting the word lines WL0, WL1, . . . , WLn−1, and WLn and the bit lines BL0, BL1, . . . , BLm−1, and BLm by using the X-decoder 14 and the Y-decoder 16.

A NAND flash memory device may have a relatively high integration degree due to a structure in which a plurality of memory cells are connected in series. However, it may be desirable to further reduce design rules for a NAND flash memory device in order to reduce a size of a chip. Also, as design rules have been reduced, a minimum pitch of patterns that are needed to form a NAND flash memory device has also been greatly reduced. According to the inventive concepts, in order to form fine patterns according to reduced design rules, a semiconductor device having a layout structure that may use patterns having sizes within a resolution limit that may be obtained by exposure equipment and exposure technology provided in lithography and may ensure a sufficient process margin and methods of manufacturing the semiconductor device are provided.

FIGS. 3B and 3C illustrate a part of a memory cell array of a NAND flash memory device that is a nonvolatile memory device.

Referring to FIGS. 3B and 3C, the memory cell array 12 may include a plurality of active regions AC that are defined by a plurality of device isolation regions 103 formed on a substrate 102. The plurality of active regions AC may include a plurality of line patterns that are parallel to one another.

The string selection line SSL and the ground selection line GSL that cross over the plurality of active regions AC may be located on the plurality of active regions AC. The plurality of word lines WL1, WL2, . . . , WLn−1, and WLn that cross over the plurality of active regions AC may be disposed between the string selection line SSL and the ground selection line GSL. The string selection line SSL, the ground selection line GSL, and the plurality of word lines WL1, WL2, . . . , WLn−1, and WLn may be parallel to one another.

A plurality of impurity regions 105 may be formed in the plurality of active regions AC adjacent to both sides of the plurality of word lines WL1, WL2, . . . , WLn−1, and WLn, the string selection line SSL, and the ground selection line GSL. Accordingly, a string selection transistor, memory cell transistors, and a ground selection transistor that are connected in series may be formed. The string selection transistor, the ground selection transistor, and memory cell transistors located between the string selection transistor and the ground selection transistor may constitute one unit memory string.

Each of the plurality of active regions AC that are adjacent to the string selection line SSL and are opposite to the ground selection line GSL may be defined as a drain region of the string selection transistor. Also, each of the plurality of active regions AC that are adjacent to the ground selection line GSL and are opposite to the string selection line SSL may be defined as a source region of the ground selection transistor.

The plurality of word lines WL1, WL2, . . . , WLn−1, and WLn may extend to respectively intersect the plurality of active regions AC. Each of the plurality of word lines WL1, WL2, . . . , WLn−1, and WLn may include a tunneling insulating layer 192, a charge storage layer 194, a blocking insulating layer 196, and a gate electrode layer 198 that are sequentially stacked on the substrate 102.

Portions of each of the tunneling insulating layer 192 and the charge storage layer 194 may be separated according to memory cell transistors that are adjacent in an extension direction in which the plurality of word lines WL1, WL2, . . . , WLn−1, and WLn extend.

The tunneling insulating layer 192 may be formed of silicon oxide, silicon oxynitride, silicon oxide doped with impurities, or a low-k dielectric material having a dielectric constant lower than that of silicon oxide. The charge storage layer 194 may be a charge trap layer or a conductive layer. The charge storage layer 194 may include a semiconductor doped with a dopant, for example, doped polysilicon. The charge storage layer 194 may be electrically isolated from the tunneling insulating layer 192 by the blocking insulating layer 196.

The blocking insulating layer 196 may be shared by the memory cell transistors that are adjacent in the extension direction of the plurality of word lines WL1, WL2, . . . , WLn-1, and WLn. The blocking insulating layer 196 may include a silicon oxide film, a silicon nitride film, or a stack of a silicon oxide film and a silicon nitride film. In some embodiments, the blocking insulating layer 196 may include an oxide-nitride-oxide (ONO) film. Alternatively, the blocking insulating layer 196 may include a high-k material having a dielectric constant higher than that of silicon oxide.

The gate electrode layer 198 may be an electrode that controls a program operation and an erase operation. The gate electrode layer 198 may be formed to be connected between the memory cell transistors that are adjacent in the extension directions of the plurality of word lines WL1, WL2, . . . , WLn-1, and WLn. In some embodiments, the gate electrode layer 198 may be a conductive film including a doped semiconductor, metal silicide, or a combination thereof. For example, the gate electrode layer 198 may include doped polysilicon.

At least one of the string selection line SSL and the ground selection line GSL may have the same stacked structure as a stacked structure of the plurality of word lines WL1, WL2, . . . , WLn-1, and WLn at intersections with the plurality of active regions AC. In some embodiments, the charge storage layer 194 and the gate electrode layer 198 may be electrically connected. Widths of the string selection line SSL and the ground selection line GSL may be greater than widths of the plurality of word lines WL1, WL2, . . . , WLn-1, and WLn. However, the inventive concepts are not limited thereto.

As shown in FIG. 3B, the memory cell array 12 may include the plurality of bit lines BLQ, BL1, . . . , BLm-1, and BLm that cross over the plurality of word lines WL1, WL2, . . . , WLn-1, and WLn. Each of the plurality of bit lines BL0, BL1, . . . , BLm-1, and BLm may be connected to a drain region of the string selection line SSL through a bit line contact BC. The plurality of bit lines BL0, BL1, . . . , BLm-1, and BLm may be disposed in parallel to the plurality of active regions AC.

In some embodiments, the plurality of active regions AC, the plurality of device isolation regions 103, and the plurality of word lines WL1, WL2, . . . , WLn-1, and WLn of FIGS. 3B and 3C may be arranged in various ways within the scope of the inventive concepts.

Figure 4:
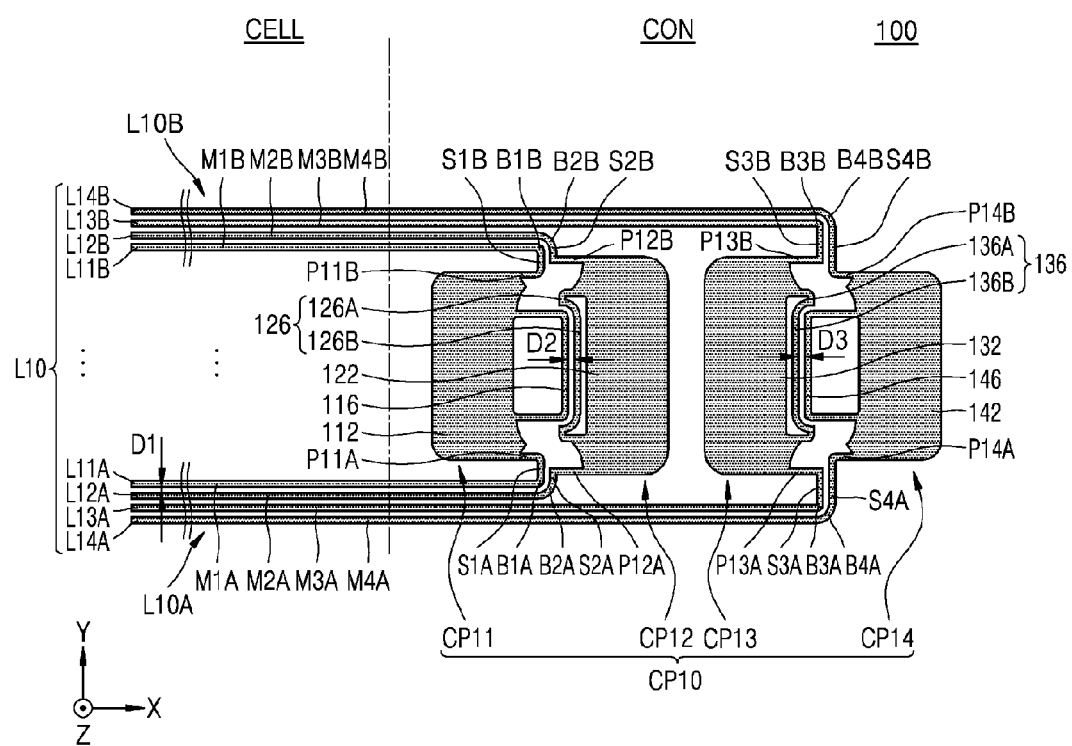
FIG. 4 is a plan view for explaining an integrated circuit device according to some embodiments.

FIG. 4 is a plan view for explaining an integrated circuit device 100 according to some embodiments.

Referring to FIG. 4, the integrated circuit device 100 includes a cell array region CELL and a connection region CON that is adjacent to the cell array region CELL.

The cell array region CELL may correspond to the memory cell array 12 of the integrated circuit device 10 of FIG. 1. The cell array region CELL may include the memory cell blocks BLK0, BLK1, . . . , BLKp-1, and BLKp of FIG. 2.

The connection region CON may be a region for connecting a plurality of conductive lines, for example, word lines or bit lines, disposed in the cell array region CELL to a peripheral circuit such as a decoder.

The integrated circuit device 100 includes a plurality of conductive lines L10 that extend in a first direction (e.g., an X direction) from the cell array region CELL to the connection region CON to be parallel to one another. The plurality of conductive lines L10 include a first line block L10A including a plurality of conductive lines L11A, L12A, L13A, and L14A that extend in parallel to one another with a predetermined interval therebetween, and a second line block L10B including a plurality of conductive lines L11B, L12B, L13B, and L14B that extend in parallel to one another with a predetermined interval therebetween.

In some embodiments, both the first line block L10A and the second line block L10B may be included in one memory cell block selected from among the memory cell blocks BLK0, BLK1, . . . , BLKp-1, and BLKp of FIG. 2.

In other embodiments, the first line block L10A and the second line block L10B may be included in different memory cell blocks selected from among the memory cell blocks BLK0, BLK1, . . . , BLKp-1, and BLKp of FIG. 2. For example, the first line block L10A and the second line block L10B may be respectively included in two adjacent memory cells from among the memory cell blocks BLK0, BLK1, . . . , BLKp-1, and BLKp.

The plurality of conductive lines L10 may correspond to the plurality of cell strings NS (see FIG. 3A).

The plurality of conductive lines L10 extend over the cell array region CELL and the connection region CON. In order to connect the plurality of conductive lines L10 to an external circuit such as a decoder, a plurality of contact pads CP10 are connected to ends of the plurality of conductive lines L10 in the connection region CON. The plurality of contact pads CP10 may include first through fourth contact pads CP11, CP12, CP13, and CP14.

The plurality of conductive lines L10 include a first pair of conductive lines L11A and L11B, a second pair of conductive lines L12A and L12B, a third pair of conductive lines L13A and L13B, and a fourth pair of conductive lines L14A and L14B.

The first pair of conductive lines L11A and L11B are integrally connected to one first contact pad CP11 and share the first contact pad CP11. The second pair of conductive pads L12A and L12B are integrally connected to one second contact pad CP12 and share the second contact pad CP12. The third pair of conductive lines L13A and L13B are integrally connected to one third contact pad CP13 and share the third contact pad CP13. The fourth pair of conductive lines L14A and L14B are integrally connected to one fourth contact pad CP14 and share the fourth contact pad CP14. As shown in FIG. 4, the third pair of the conductive lines L13A and L13B and the third contact pad CP13 are arranged in a nested configuration relative to the fourth pair of the conductive lines L14A and L14B and the fourth contact pad CP14. The second pair of the conductive lines L12A and L12B and the second contact pad CP12 are arranged in a nested configuration relative to the third pair of the conductive lines L13A and L13B and the third contact pad CP13. The first pair of the conductive lines L11A and L11B and the first contact pad CP11 are arranged in a nested configuration relative to the second pair of the conductive lines L12A and L12B and the second contact pad CP12.

The plurality of conductive lines L10 have end portions disposed in the connection region CON. The end portions of the plurality of conductive lines L10 in the connection region CON include curved portions B1A, B1B, B2A, B2B, B3A, B3B, B4A, and B4B that are curved from the first direction (e.g., the X direction) to a second direction (e.g., a ±Y direction in FIG. 4) that intersects the first direction to face integrally connected contact pads from among the plurality of contact pads CP10. The plurality of conductive lines L10 include main lines M1A, M1B, M2A, M2B, M3A, M3B, M4A, and M4B that extend in the first direction (e.g., the X direction) from the cell array region CELL to the curved portions B1A, B1B, B2A, B2B, B3A, B3B, B4A, and B4B in the connection region CON. Also, the plurality of conductive lines L1Q include sub-lines S1A, S1B, S2A, S2B, S3A, S3B, S4A, and S4B that are located between the main lines M1A, M1B, M2A, M2B, M3A, M3B, M4A, and M4B and the contact pads CP10 and extend in the second direction (e.g., the ±Y direction in FIG. 4).

The plurality of conductive lines L10 and the plurality of contact pads CP10 may be formed of the same material and may be disposed on the same plane.

In some embodiments, the plurality of conductive lines L10 may be word lines that correspond to a plurality of memory cells in the cell array region CELL. For example, the plurality of conductive lines L10 may correspond to the plurality of word lines WL0, WL1, . . . , WLn−1, and WLn of FIGS. 3A and 3B.

In other embodiments, the plurality of conductive lines L10 may be bit lines that correspond to memory cells in the cell array region CELL. For example, the plurality of conductive lines L10 may correspond to the bit lines BL0, BL1, . . . , BLm−1, and BLm of FIGS. 3A and 3B.

In FIG. 4, the first pair of conductive lines L11A and L11B from among the plurality of conductive lines L10 are spaced apart from each other in the second direction (e.g., the Y direction) and extend in the first direction (e.g., the X direction) to be parallel to each other. The first contact pad CP11 shared by the first pair of conductive lines L11A and L11B includes a first pad body 112 including a first branch portion P11A from which one conductive line L11A from among the first pair of conductive lines L11A and L11B branches and a second branch portion P11B from which the other conductive line L11B branches.

The first contact pad CP11 includes a first loop branch portion 116 that is located between the first branch portion P11A and the second branch portion P11B and protrudes from the first pad body 112. The first loop branch portion 116 may protrude away from the first pair of conductive lines L11A and L11B. The first loop branch portion 116 may convexly curve away from the first pad body 112 in the first direction (e.g., the X direction). The first loop branch portion 116 has both ends integrally connected to the first pad body 112.

At least a part of the first contact pad CP11 may be disposed in a space between the first pair of conductive lines L11A and L11B. In FIG. 4, the first pad body 112 of the first contact pad CP11 is disposed in the space between the first pair of conductive lines L11A and L11B and the first loop branch portion 116 extends to a position beyond the space between the first pair of conductive lines L11A and L11B.

The second pair of conductive lines L12A and L12B from among the plurality of conductive lines L10 are spaced apart from each other in the second direction (e.g., the Y direction and extend in the first direction (e.g., the X direction) to be parallel to each other. The first pair of conductive lines L11A and L11B are disposed in a space between the second pair of conductive lines L12A and L12B. The second contact pad CP12 shared by the second pair of conductive lines L12A and L12B is adjacent to the first contact pad CP11. The second contact pad CP12 includes a second pad body 122 including a first branch portion P12A from which one conductive line L12A from among the second pair of conductive lines L12A and L12B branches and a second branch portion P12B from which the other conductive line L12B branches.

The second contact pad CP12 includes a second loop branch portion 126 that is located between the first branch portion P12A and the second branch portion P12B and protrudes from the second pad body 122. The second loop branch portion 126 has both ends integrally connected to the second pad body 122. The second loop branch portion 126 includes a protrusion 126A that faces the first contact pad CP11 and convexly curves away from the second pad body 122. The second loop branch portion 126 includes a recess 126B that concavely curves toward the second pad body 122.

The first loop branch portion 116 of the first contact pad CP11 may protrude toward the second contact pad CP12 and may face the second loop branch portion 126 of the second contact pad CP12. A part of the first loop branch portion 116 may be surrounded by the recess 126B of the second loop branch portion 126.

At least a part of the second contact pad CP12 may be disposed at a position beyond the space between the second pair of conductive lines L12A and L12B. In some embodiments, both the second pad body 122 and the second loop branch portion 126 of the second contact pad CP12 may be formed at positions beyond the space between the second pair of conductive lines L12A and L12B.

The third pair of conductive lines L13A and L13B from among the plurality of conductive lines L10 may be spaced apart from each other in the second direction (e.g., the Y direction) and may extend in the first direction (e.g., the X direction) to be parallel to each other. The first pair of conductive lines L11A and L11B and the second pair of conductive lines L12A and L12B are disposed in a space between the third pair of conductive lines L13A and L13B.

The third contact pad CP13 shared by the third pair of conductive lines L13A and L13B is adjacent to the second contact pad CP12. The third contact pad CP13 includes a third pad body 132 including a first branch portion P13A from which one conductive line L13A from among the third pair of conductive lines L13A and L13B branches and a second branch portion P13B from which the other conductive line L13B branches.

The third contact pad CP13 includes a third loop branch portion 136 that is located between the first branch portion P13A and the second branch portion P13B and protrudes from the third pad body 132. The third loop branch portion 136 has both ends integrally connected to the third pad body 132. The third loop branch portion 136 includes a protrusion 136A that convexly curves away from the third pad body 132 and a recess 136B that concavely curves toward the third pad body 132.

At least a part of the third contact pad CP13 may be disposed in the space between the third pair of conductive lines L13A and L13B. In some embodiments, both the third pad body 132 and the third loop branch portion 136 of the third contact pad CP13 may be disposed in the space between the third pair of conductive lines L13A and L13B.

The third contact pad CP13 may have substantially the same shape as that of the second contact pad CP12. The second contact pad CP12 and the third contact pad CP13 may be disposed to be symmetric (e.g., mirror symmetric) to each other.

The fourth pair of conductive lines L14A and L14B from among the plurality of conductive lines L10 are spaced apart from each other in the second direction (e.g., the Y direction)

and extend in the first direction (e.g., the X direction) to be parallel to each other. The first pair of conductive lines L11A and L11B, the second pair of conductive lines L12A and L12B, and the third pair of conductive lines L13A and L13B are disposed in a space between the fourth pair of conductive lines L14A and L14B.

The fourth contact pad CP14 shared by the fourth pair of conductive lines L14A and L14B includes a fourth pad body 142 including a first branch portion P14A from which one conductive line L14A from among the fourth pair of conductive lines L14A and L14B branches and a second branch portion P14B from which the other conductive line L14B branches.

The fourth contact pad CP14 includes a fourth loop branch portion 146 that is located between the first branch portion P14A and the second branch portion P14B and protrudes from the fourth pad body 142. The fourth loop branch portion 146 convexly protrudes from the fourth pad body 142 toward the fourth pair of conductive lines L14A and L14B. The fourth loop branch portion 146 has both ends integrally connected to the fourth pad body 142.

The fourth loop branch portion 146 of the fourth contact pad CP14 may protrude toward the third contact pad CP13 and may face the third loop branch portion 136 of the third contact pad CP13. A part of the fourth loop branch portion 146 may be surrounded by the recess 136B of the third loop branch portion 136.

At least a part of the fourth contact pad CP14 may be disposed at a position beyond the space between the fourth pair of conductive lines L14A and L14B. In FIG. 4, the fourth pad body 142 of the fourth contact pad CP14 is disposed at a position beyond the space between the fourth pair of conductive lines L14A and L14B and the fourth loop branch portion 146 extends from the fourth pad body 142 to the space between the fourth pair of conductive lines L14A and L14B.

The fourth contact pad CP14 may have substantially the same shape as that of the first contact pad CP11. The first contact pad CP11 and the fourth contact pad CP14 may be disposed to be symmetric (e.g., mirror symmetric) to each other.

A shape of a combination of the first contact pad CP11 and the second contact pad CP12 may be the same as a shape of a combination of the third contact pad CP13 and the fourth contact pad CP14. The combination of the first contact pad CP11 and the second contact pad CP12 and the combination of the third contact pad CP13 and the fourth contact pad CP14 may be disposed to be symmetric (e.g., mirror symmetric) to each other.

In the cell array region CELL, minimum distances between the plurality of conductive lines L10 may be the same. For example, a minimum distance between one conductive line L11A from among the first pair of conductive lines L11A and L11B and one conductive line L12A from among the second pair of conductive lines L12A and L12B may be the same as a minimum distance between the other conductive line L11B from among the first pair of conductive lines L11A and L11B and the other conductive line L12B from among the second pair of conductive lines L12A and L12B. Also, a minimum distance between one conductive line L13A from among the third pair of conductive lines L13A and L13B and one conductive line L14A from among the fourth pair of conductive lines L14A and L14B may be the same as a minimum distance between the other conductive line L13B from among the third pair of conductive lines L13A and L13B and the other conductive line L14B from among the fourth pair of conductive lines L14A and L14B.

In some embodiments, a first distance D1 that is a minimum distance between the plurality of conductive lines L10 may be 1 F that is a minimum feature size of the integrated circuit device 100 to be formed. In some embodiments, the first distance D1 may range, but not limited to, from several nanometers (nm) to tens of nm.

In some embodiments, at least one of a second distance D2 that is a minimum distance between the first contact pad CP11 and the second contact pad CP12 and a third distance D3 that is a minimum distance between the third contact pad CP13 and the fourth contact pad CP14 may be substantially the same as the first distance D1. For example, each of the first distance D1, the second distance D2, and the third distance D3 may be 1 F. In other embodiments, at least one of the second distance D2 and the third distance D3 may be less or greater than the first distance D1.

A minimum distance between the second contact pad CP12 and the third contact pad CP13 may be greater than the second distance D2 and may be greater than the third distance D3.

From among the first through fourth contact pads CP11, CP12, CP13, and CP14, the first contact pad CP11 and the second contact pad CP12 may have different lengths in the second direction (e.g., the Y direction) and the third contact pad CP13 and the fourth contact pad CP14 may have different lengths in the second direction (e.g., the Y direction). In some embodiments, a length of the second contact pad CP12 in the second direction (e.g., the Y direction) may be greater than a length of the first contact pad CP11, and a length of the third contact pad CP13 in the second direction (e.g., the Y direction) may be greater than a length of the fourth contact pad CP14. In some embodiments, the first contact pad CP11 and the fourth contact pad CP14 may have substantially the same length in the second direction (e.g., the Y direction) and the second contact pad CP12 and the third contact pad CP13 may have substantially the same length in the second direction (e.g., the Y direction).

In some embodiments, the first through fourth contact pads CP11, CP12, CP13, and CP14 may be sequentially formed to be aligned in the first direction (e.g., the X direction) as shown in FIG. 4. However, according to the inventive concepts, an arrangement of the first through fourth contact pads CP11, CP12, CP13, and CP14 is not limited thereto. For example, the first through fourth contact pads CP11, CP12, CP13, and CP14 may not be aligned in the first direction (e.g., the X direction).

FIGS. 5 through 10 are plan views for explaining integrated circuit devices according to other embodiments. In FIGS. 5 through 10, the same elements as those in FIG. 4 are denoted by the same reference numerals, and thus a detailed explanation thereof will not be given.

Figure 5:
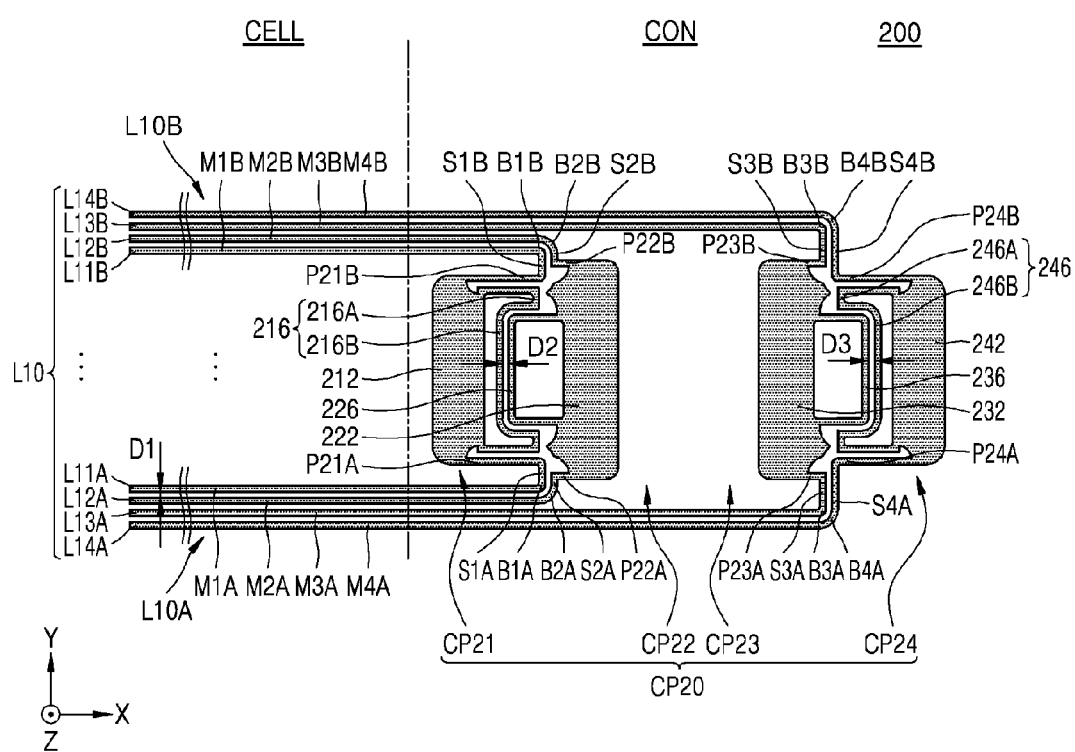
FIGS. 5 through 10 are plan views for explaining integrated circuit devices according to other embodiments.

Referring to FIG. 5, an integrated circuit device 200 includes a plurality of contact pads CP20 connected to ends of the plurality of conductive lines L10 in the connection region CON. The plurality of contact pads CP20 may include first through fourth contact pads CP21, CP22, CP23, and CP24.

The first pair of conductive lines L11A and L11B are integrally connected to one first contact pad CP21 and share the first contact pad CP21. The second pair of conductive lines L12A and L12B are integrally connected to one second contact pad CP22 and share the second contact pad CP22. The third pair of conductive lines L13A and L13B are integrally connected to one third contact pad CP23 and share the third contact pad CP23. The fourth pair of conductive lines L14A and L14B are integrally connected to a fourth contact pad CP24 and share the fourth contact pad CP24.

The plurality of conductive lines L10 and the plurality of conductive lines CP20 may be formed of the same material and may be disposed on the same plane.

The first contact pad CP21 includes a first pad body 212 including a first branch portion P21A from which one conductive line L11A from among the first pair of conductive lines L11A and L11B branches and a second branch portion P21B from which the other conductive line L11B branches.

The first contact pad CP21 includes a first loop branch portion 216 that is located between the first branch portion P21A and the second branch portion P21B and protrudes from the first pad body 212. The first loop branch portion 216 may protrude away from the first pair of conductive lines L11A and L11B. The first loop branch portion 216 may protrude away from the first pad body 212 in the first direction (e.g., the X direction). The first loop branch portion 216 has both ends integrally connected to the first pad body 212. The first loop branch portion 216 includes a protrusion 216A that convexly curves away from the first pad body 212. The first loop branch portion 216 includes a recess 216B that concavely curves toward the first pad body 212.

At least a part of the first contact pad CP21 may be disposed in a space between the first pair of conductive lines L11A and L11B. In FIG. 5, the first pad body 212 and the first loop branch portion 216 of the first contact pad CP21 are disposed in the space between the first pair of conductive lines L11A and L11B.

The second contact pad CP22 is adjacent to the first contact pad CP21 from among the plurality of contact pads CP20. The second contact pad CP22 includes a second pad body 222 including a first branch portion P22A from which one conductive line L12A from among the second pair of conductive lines L12A and L12B branches and a second branch portion P22B from which the other conductive line L12B branches.

The second contact pad CP22 includes a second loop branch portion 226 that is located between the first branch portion P22A and the second branch portion P22B and protrudes from the second pad body 222. The second loop branch portion 226 has both ends integrally connected to the second pad body 222. The second loop branch portion 226 faces the first contact pad CP21 and convexly curves away from the second pad body 222. The second loop branch portion 226 of the second contact pad CP22 may protrude toward the first contact pad CP21 and may face the first loop branch portion 216 of the first contact pad CP21. A part of the second loop branch portion 226 may be surrounded by the recess 216B of the first loop branch portion 216.

At least a part of the second contact pad CP22 may be disposed at a position beyond a space between the second pair of conductive lines L12A and L12B. In some embodiments, the second pad body 222 from among the second contact pads CP22 may be disposed at a position beyond the space between the second pair of conductive lines L12A and L12B, and the second loop branch portion 226 may be disposed in the space between the second pair of conductive lines L12A and L12B.

The third contact pad CP23 is adjacent to the second contact pad CP22 from among the plurality of contact pads CP20. The third contact pad CP23 includes a third pad body 232 including a first branch portion P23A from which one conductive line L13A from among the third pair of conductive lines L13A and L13B branches and a second branch portion P23B from which the other conductive line L13B branches.

The third contact pad CP23 includes a third loop branch portion 236 that is located between the first branch portion P23A and the second branch portion P23B and protrudes from the third pad body 232. The third loop branch portion 236 has both ends integrally connected to the third pad body 232. The third loop branch portion 236 convexly curves away from the third pad body 232.

At least a part of the third contact pad CP23 may be disposed in a space between the third pair of conductive lines L13A and L13B. In some embodiments, the third pad body 232 of the third contact pad CP23 may be disposed in the space between the third pair of conductive lines L13A and L13B and the third loop branch portion 136 may extend from the third pad body 232 to a position beyond the space between the third pair of conductive lines L13A and L13B.

The third contact pad CP23 may have substantially the same shape as that of the second contact pad CP22. The second contact pad CP22 and the third contact pad CP23 may be disposed to be symmetric (e.g., mirror symmetric) to each other.

The fourth contact pad CP24 includes a fourth pad body 242 including a first branch portion P24A from which one conductive line L14A from among the fourth pair of conductive lines L14A and L14B branches and a second branch portion P24B from which the other conductive line L14B branches.

The fourth contact pad CP24 includes a fourth loop branch portion 246 that is located between the first branch portion P24A and the second branch portion P24B and protrudes from the fourth pad body 242. The fourth loop branch portion 246 includes a protrusion 246A that convexly curves toward the fourth pair of conductive lines L14A and L14B away from the fourth pad body 242 and a recess 246B that concavely curves toward the fourth pad body 242. The fourth loop branch portion 246 has both ends integrally connected to the fourth pad body 242.

At least a part of the fourth contact pad CP24 may be disposed at a position beyond a space between the fourth pair of conductive lines L14A and L14B. As show in FIG. 5, the fourth pad body 242 and the fourth loop branch portion 246 of the fourth contact pad CP24 may be disposed at positions beyond the space between the fourth pair of conductive lines L14A and L14B.

The fourth contact pad CP24 may have substantially the same shape as that of the first contact pad CP21. The first contact pad CP21 and the fourth contact pad CP24 may be disposed to be symmetric (e.g., mirror symmetric) to each other.

The fourth loop branch portion 246 of the fourth contact pad CP24 may protrude toward the third contact pad CP23 and may face the third loop branch portion 236 of the third contact pad CP23. A part of the third loop branch portion 236 may be surrounded by the recess 246B of the fourth loop branch portion 246.

A shape of a combination of the first contact pad CP21 and the second contact pad CP22 may be the same as a shape of a combination of the third contact pad CP23 and the fourth contact pad CP24. The combination of the first contact pad CP21 and the second contact pad CP22 and the combination of the third contact pad CP23 and the fourth contact pad CP24 may be disposed to be symmetric (e.g., mirror symmetric) to each other.

From among the first through fourth contact pads CP21, CP22, CP23, and CP24, the first contact pad CP21 and the second contact pad CP22 may have different lengths in the second direction (e.g., the Y direction) and the third contact pad CP23 and the fourth contact pad CP24 may have different lengths in the second direction (e.g., the Y direction). In some embodiments, a length of the second contact pad CP22 in the second direction (e.g., the Y direction) may be greater than a length of the first contact pad CP21, and a length of the third contact pad CP23 in the second direction (e.g., the Y direction) may be greater than a length of the fourth contact pad CP24. In some embodiments, the first contact pad CP21 and the fourth contact pad CP24 may have substantially the same length in the second direction (e.g., the Y direction) and the second contact pad CP22 and the third contact pad CP23 may have substantially the same length in the second direction (e.g., the Y direction).

Figure 6:
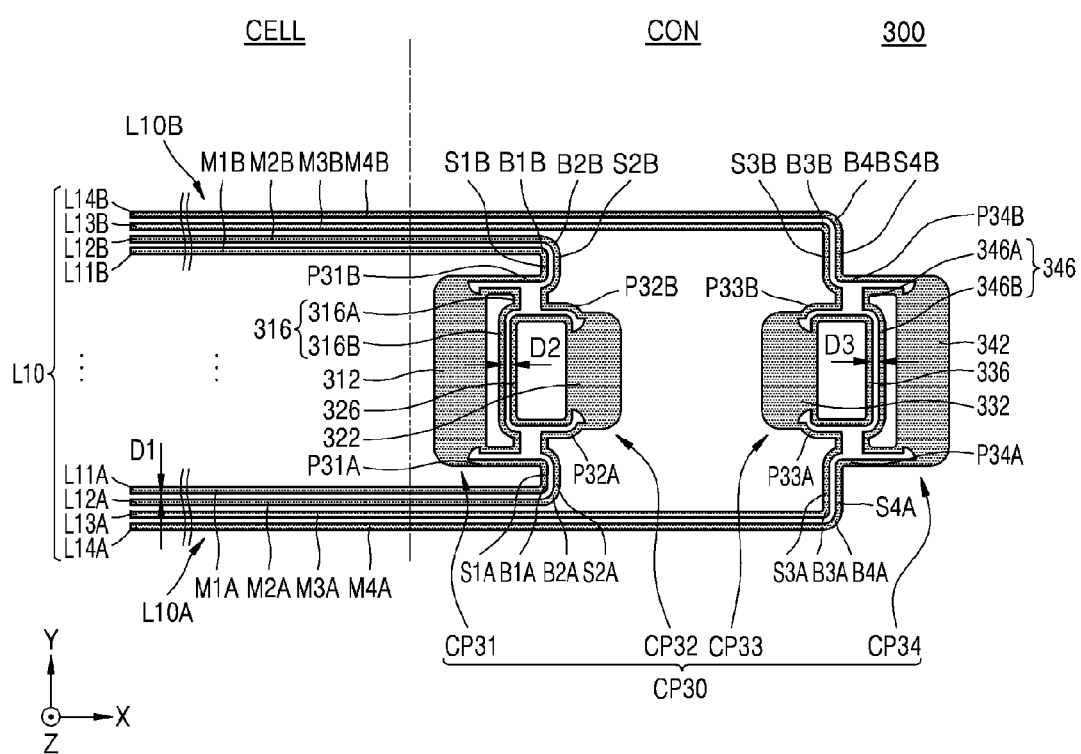

Referring to FIG. 6, an integrated circuit device 300 is substantially the same as the integrated circuit device 200 of FIG. 5. However, a plurality of contact pads CP30 are connected to ends of the plurality of conductive lines L10 in the connection region CON of the integrated circuit device 300. The plurality of contact pads CP30 include first through fourth contact pads CP31, CP32, CP33, and CP34. In the second direction (e.g., the Y direction), a length of the second contact pad CP32 is less than a length of the first contact pad CP31 and a length of the third contact pad CP33 is less than a length of the fourth contact pad CP34 from among the first through fourth contact pads CP31, CP32, CP33, and CP34.

In some embodiments, in the second direction (e.g., the Y direction), the first contact pad CP31 and the fourth contact pad CP34 may have substantially the same length and the second contact pad CP32 and the third contact pad CP33 may have substantially the same length.

The plurality of conductive lines L10 and the plurality of contact pads CP30 may be formed of the same material and may be disposed on the same plane.

The first contact pad CP31 integrally connected to the first pair of conductive lines L11A and L11B and the fourth contact pad CP34 integrally connected to the fourth pair of conductive lines L14A and L14B from among the plurality of contact pads CP30 have similar shapes to those of the first contact pad CP21 and the fourth contact pad CP24 of FIG. 5.

The first pair of conductive lines L11A and L11B are integrally connected to one first contact pad CP31 and share the first contact pad CP31. The second pair of conductive lines L12A and L12B are integrally connected to one second contact pad CP32 and share the second contact pad CP32. The third pair of conductive lines L13A and L13B are integrally connected to one third contact pad CP33 and share the third contact pad CP33. The fourth pair of conductive lines L14A and L14B are integrally connected to one fourth contact pad CP34 and share the fourth contact pad CP34.

The first contact pad CP31 includes a first pad body 312 including a first branch portion P31A from which one conductive line L11A from among the first pair of conductive lines L11A and L11B branches and a second branch portion P31B from which the other conductive line L11B branches.

The first contact pad CP31 includes a first loop branch portion 316 that is located between the first branch portion P31A and the second branch portion P31B and protrudes from the first pad body 312. The first loop branch portion 316 has both ends integrally connected to the first pad body 312. The first loop branch portion 316 includes a protrusion 316A that convexly curves away from the first pad body 312 and a recess 316B that concavely curves toward the first pad body 312. The first contact pad CP31 may be disposed in a space between the first pair of conductive lines L11A and L11B.

The second contact pad CP32 is adjacent to the first contact pad CP31 from among the plurality of contact pads CP30. The second contact pad CP32 includes a second pad body 322 including a first branch portion P32A from which one conductive line L12A from among the second pair of conductive lines L12A and L12B branches and a second branch portion P32B from which the other conductive line L12B branches.

The second contact pad CP32 includes a second loop branch portion 326 that is located between the first branch portion P32A and the second branch portion P32B and protrudes from the second pad body 322. The second loop branch portion 326 has both ends integrally connected to the second pad body 322. The second loop branch portion 326 faces the first contact pad CP31 and convexly curves away from the second pad body 322. The second loop branch portion 326 of the second contact pad CP32 may face the first loop branch portion 316 of the first contact pad CP31. A part of the second loop branch portion 326 may be surrounded by the recess 316B of the first loop branch portion 316. A part of the second contact pad CP32 may be disposed in a space between the second pair of conductive lines L12A and L12B and another part of the second contact pad CP32 may be disposed at a position beyond the space between the second pair of conductive lines L12A and L12B.

The third contact pad CP33 is adjacent to the second contact pad CP32 from among the plurality of contact pads CP30. The third contact pad CP33 includes a third pad body 332 including a first branch portion P33A from which one conductive line L13A from among the third pair of conductive lines L13A and L13B branches and a second branch portion P33B from which the other conductive line L13B branches.

The third contact pad CP33 includes a third loop branch portion 336 that is located between the first branch portion P33A and the second branch portion P33B and protrudes from the third pad body 332. The third loop branch portion 336 has both ends integrally connected to the third pad body 332. The third loop branch portion 336 convexly curves away from the third pad body 332. A part of the third contact pad CP23 may be disposed in a space between the third pair of conductive lines L13A and L13B and another part of the third contact pad CP23 may be disposed at a position beyond the space between the third pair of conductive lines L13A and L13B.

The third contact pad CP33 may have substantially the same shape as that of the second contact pad CP32. The second contact pad CP32 and the third contact pad CP33 may be disposed to be symmetric (e.g., mirror symmetric) to each other.

The fourth contact pad CP34 includes a fourth pad body 342 including a first branch portion P34A from which one conductive line L14A from among the fourth pair of conductive lines L14A and L14B branches and a second branch portion P34B from which the other conductive line L14B branches.

The fourth contact pad CP34 includes a fourth loop branch portion 346 that is located between the first branch portion P34A and the second branch portion P34B and protrudes from the fourth pad body 342. The fourth loop branch portion 346 includes a protrusion 346A that convexly curves away from the fourth pad body 342 and a recess 346B that concavely curves toward the fourth pad body 342. The fourth loop branch portion 346 has both ends integrally connected to the fourth pad body 342.

The fourth pad body 342 and the fourth loop branch portion 346 of the fourth contact pad CP34 may be disposed at positions beyond a space between the fourth pair of conductive lines L14A and L14B.

The fourth contact pad CP34 may have substantially the same shape as that of the first contact pad CP31. The first contact pad CP31 and the fourth contact pad CP34 may be disposed to be symmetric (e.g., mirror symmetric) to each other.

The fourth loop branch portion 346 of the fourth contact pad CP34 may protrude toward the third contact pad CP33 and may face the third loop branch portion 336 of the third contact pad CP33. A part of the third loop branch portion 336 may be surrounded by the recess 346B of the fourth loop branch portion 346.

A shape of a combination of the first contact pad CP31 and the second contact pad CP32 may be the same as a shape of a combination of the third contact pad CP33 and the fourth contact pad CP34. The combination of the first contact pad CP31 and the second contact pad CP32 and the combination of the third contact pad CP33 and the fourth contact pad CP34 may be disposed to be symmetric (e.g., mirror symmetric) to each other.

In some embodiments, the first through fourth contact pads CP31, CP32, CP33, and CP34 may be sequentially formed to be aligned in the first direction (e.g., the X direction) as shown in FIG. 6. However, according to the inventive concepts, an arrangement of the first through fourth contact pads CP31, CP32, CP33, and CP34 is not limited thereto. For example, the first through fourth contact pads CP31, CP32, CP33, and CP34 may not be aligned in the first direction (e.g., the X direction).

Figure 7:
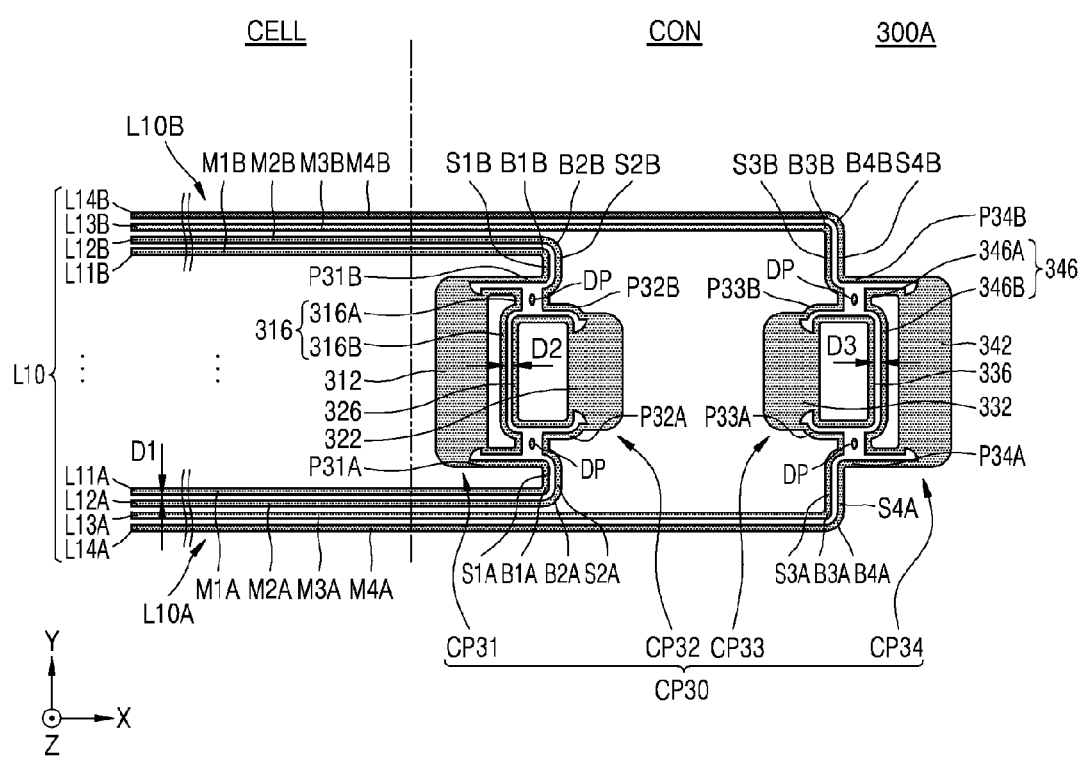

Referring to FIG. 7, an integrated circuit device 300A is substantially the same as the integrated circuit device 300 of FIG. 6. However, the integrated circuit device 300A further includes at least one dummy pattern DP having an island shape in at least one region selected from among a region between the first contact pad CP31 and the second contact pad CP32 and a region between the third contact pad CP33 and the fourth contact pad CP34 in the connection region CON.

Although the dummy patterns DP each having an island shape are located on both sides of the second loop branch portion 326 between the first contact pad CP31 and the second contact pad CP32 and the dummy patterns DP each having an island shape are located on both sides of the third loop branch portion 336 between the third contact pad CP33 and the fourth contact pad CP34 in FIG. 7, the inventive concepts are not limited thereto. For example, some of the dummy patterns DP having island shapes of FIG. 7 may be omitted.

Figure 8:
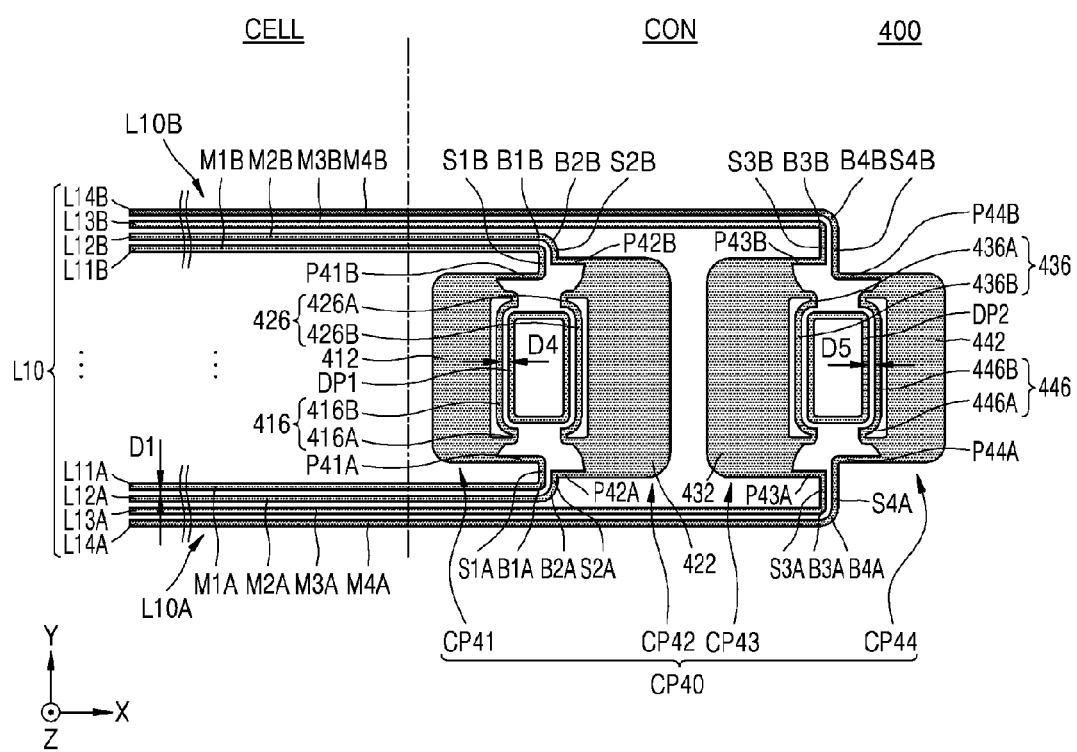

Referring to FIG. 8, an integrated circuit device 400 includes a plurality of contact pads CP40 respectively connected to ends of the plurality of conductive lines L10 in the connection region CON. The plurality of contact pads CP40 may include first through fourth contact pads CP41, CP42, CP43, and CP44.

The integrated circuit device 400 further includes a first dummy pad DP1 having a ring shape disposed between the first contact pad CP41 and the second contact pad CP42 and a second dummy pad DP2 having a ring shape disposed between the third contact pad CP43 and the fourth contact pad CP44. The first dummy pad DP1 is spaced apart by a fourth distance D4 from the first contact pad CP41 and the second contact pad CP42. The second dummy pad DP2 is spaced apart by a fifth distance D5 from the third contact pad CP43 and the fourth contact pad CP44. Accordingly, the first dummy pad DP1 and the second dummy pad DP2 may be electrically isolated from the plurality of contact pads CP40. In some embodiments, the fourth distance D4 and the fifth distance D5 may be the same as the first distance D1. In other embodiments, the fourth distance D4 and the fifth distance D5 may be less or greater than the first distance D1.

The first pair of conductive lines L11A and L11B from among the plurality of conductive lines L10 are integrally connected to one first contact pad CP41 and share the first contact pad CP41. The second pair of conductive lines L12A and L12B are integrally connected to one second contact pad CP42 and share the second contact pad CP42. The third pair of conductive lines L13A and L13B are integrally connected to one third contact pad CP43 and share the third contact pad CP43. The fourth pair of conductive lines L14A and L14B are integrally connected to one fourth contact pad CP44 and share the fourth contact pad CP44.

The plurality of conductive lines L10, the plurality of contact pads CP40, the first dummy pad DP1, and the second dummy pad DP2 may be formed of the same material and may be disposed on the same plane.

The first contact pad CP41 includes a first pad body 412 including a first branch portion P41A from which one conductive line L11A from among the first pair of conductive lines L11A and L11B branches and a second branch portion P41B from which the other conductive line L11B branches.

The first contact pad CP41 includes a first loop branch portion 416 that is located between the first branch portion P41A and the second branch portion P41B and protrudes from the first pad body 412. The first loop branch portion 416 includes a protrusion 416A that convexly curves away from the first pad body 412 and a recess 416B that concavely curves toward the first pad body 412.

The second contact pad CP42 includes a second pad body 422 including a first branch portion P42A from which one conductive lines L12A from among the second pair of conductive lines L12A and L12B branches and a second branch portion P42B from which the other conductive line L12B branches.

The second contact pad CP42 includes a second loop branch portion 426 that is located between the first branch portion P42A and the second branch portion P42B and protrudes from the second pad body 422. The second loop branch portion 426 includes a protrusion 426A that convexly curves away from the second pad body 422 and a recess 426B that concavely curves toward the second pad body 422. The second loop branch portion 426 may be disposed to face the first loop branch portion 416 with the first dummy pad DP1 therebetween. The second loop branch portion 426 may have substantially the same shape as that of the first loop branch portion 416.

The third contact pad CP43 includes a third pad body 432 including a first branch portion P43A from which one conductive line L13A from among the third pair of conductive lines L13A and L13B branches and a second branch portion P43B from which the other conductive line L13B branches.

The third contact pad CP43 includes a third loop branch portion 436 that is located between the first branch portion P43A and the second branch portion P43B and protrudes from the third pad body 432. The third loop branch portion 436 includes a protrusion 436A that convexly curves away from the third pad body 432 and a recess 436B that concavely curves toward the third pad body 432.

The third contact pad CP43 may have substantially the same shape as that of the second contact pad CP42. The second contact pad CP42 and the third contact pad CP43 may be disposed to be symmetric (e.g., mirror symmetric) to each other.

The fourth contact pad CP44 includes a fourth pad body 442 including a first branch portion P44A from which one conductive line L14A from among the fourth pair of conductive lines L14A and L14B branches and a second branch portion P44B from which the other conductive line L14B branches.

The fourth contact pad CP44 includes a fourth loop branch portion 446 that is located between the first branch portion P44A and the second branch portion P44B and protrudes from the fourth pad body 442. The fourth loop branch portion 446 includes a protrusion 446A that convexly curves away from the fourth pad body 442 and a recess 446B that concavely curves toward the fourth pad body 442. The fourth loop branch portion 446 may be disposed to face the third loop branch portion 436 with the second dummy pad DP2 therebetween. The fourth loop branch portion 446 may have substantially the same shape as that of the third loop branch portion 436.

The fourth contact pad CP44 may have substantially the same shape as that of the first contact pad CP41. The first contact pad CP41 and the fourth contact pad CP44 may be disposed to be symmetric (e.g., mirror symmetric) to each other.

A shape of a combination of the first contact pad CP41, the first dummy pad DP1, and the second contact pad CP42 may be the same as a shape of a combination of the third contact pad CP43, the second dummy pad DP2, and the fourth contact pad CP44. The combination of the first contact pad CP41, the first dummy pad DP1, and the second contact pad CP42 and the combination of the third contact pad CP43, the second dummy pad PD2, and the fourth contact pad CP44 may be disposed to be symmetric (e.g., mirror symmetric) to each other.

The first dummy pad DP1 may be disposed in a region surrounded by the first loop branch portion 416 and the second loop branch portion 426. The second dummy pad DP2 may be disposed in a region surrounded by the third loop branch portion 436 and the fourth loop branch portion 446.

From among the first through fourth contact pads CP41, CP42, CP43, and CP44, the first contact pad CP41 and the second contact pad CP42 may have different lengths in the second direction (e.g., the Y direction) and the third contact pad CP43 and the fourth contact pad CP44 may have different lengths in the second direction (e.g., the Y direction). In some embodiments, a length of the second contact pad CP42 in the second direction (e.g., the Y direction) may be greater than a length of the first contact pad CP41, and a length of the third contact pad CP43 in the second direction (e.g., the Y direction) may be greater than a length of the fourth contact pad CP44. In some embodiments, the first contact pad CP41 and the fourth contact pad CP44 may have substantially the same length in the second direction (e.g., the Y direction) and the second contact pad CP42 and the third contact pad CP43 may have substantially the same length in the second direction (e.g., the Y direction).

In some embodiments, the first through fourth contact pads CP41, CP42, CP43, and CP44 may be sequentially formed to be aligned in the first direction (e.g., the X direction) as shown in FIG. 8. However, according to the inventive concepts, an arrangement of the first through fourth contact pads CP41, CP42, CP43, and CP44 is not limited thereto. For example, the first through fourth contact pads CP41, CP42, CP43, and CP44 may not be aligned in the first direction (e.g., the X direction).

Figure 9:
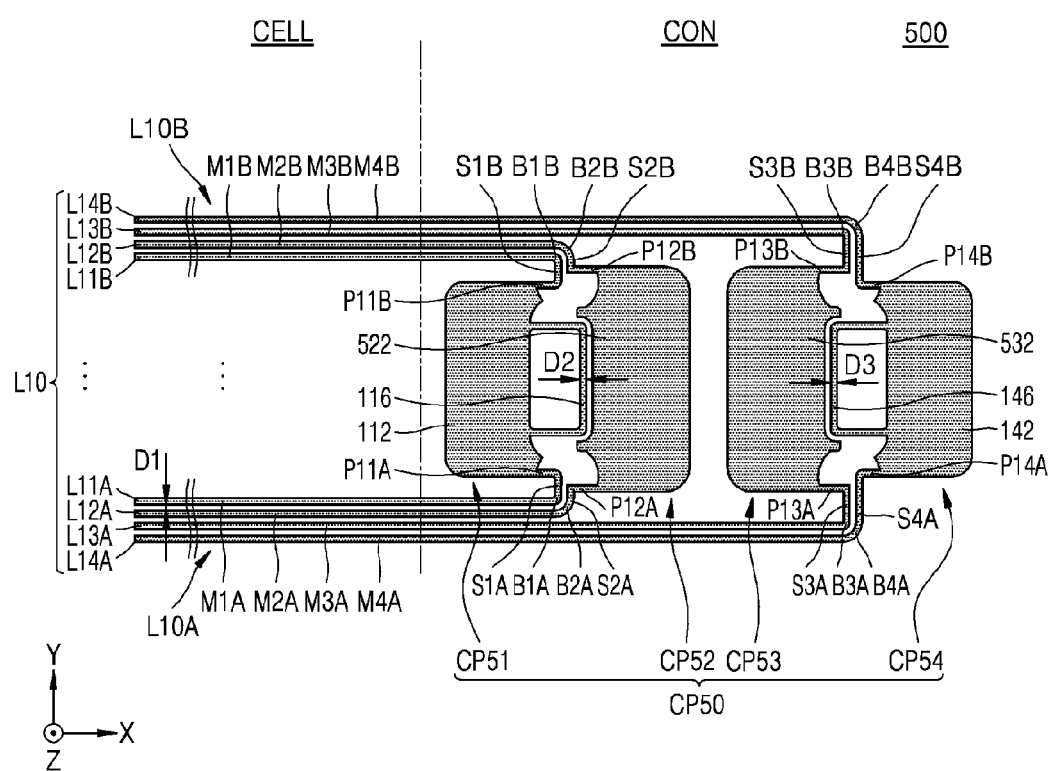

Referring to FIG. 9, an integrated circuit device 500 is substantially the same as the integrated circuit device 100 of FIG. 4. However, some of a plurality of contact pads CP50 may be different from the plurality of contact pads CP10 of FIG. 4.

In detail, a first contact pad CP51 and a fourth contact pad CP54 from among the plurality of contact pads CP50 are substantially the same as the first contact pad CP11 and the fourth contact pad CP14 of FIG. 4. However, a second contact pad CP52 and a third contact pad CP53 do not include elements corresponding to the second loop branch portion 126 and the fourth loop branch portion 146, unlike the second contact pad CP12 and the third contact pad CP13 of FIG. 4.

The second contact pad CP52 includes a second pad body 522 including a first branch portion P12A from which one conductive line L12A from among the second pair of conductive lines L12A and L12B branches and a second branch portion P12B from which the other conductive line L12B branches.

The third contact pad CP53 includes a third pad body 532 including a first branch portion P13A from which one conductive line L13A from among the third pair of conductive lines L13A and L13B branches and the second branch portion P13B from which the other conductive line L13B branches.

In some embodiments, a second distance D2 that is a minimum distance between the first loop branch portion 116 of the first contact pad CP51 and the second contact pad CP52 may be substantially the same as a first distance D1. A third distance D3 that is a minimum distance between the third contact pad CP53 and the fourth loop branch portion 146 of the fourth contact pad CP14 may be substantially the same as the first distance D1. In other embodiments, at least one of the second distance D2 and the third distance D3 may be less or greater than the first distance D1.

Figure 10:
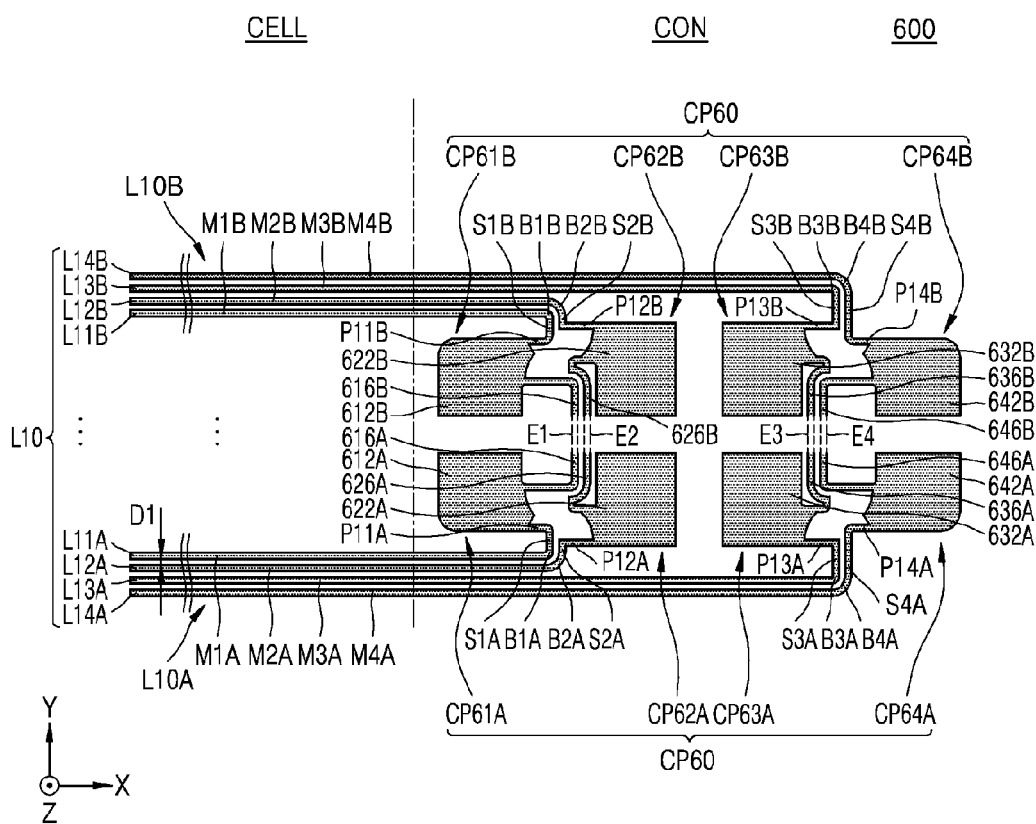

Referring to FIG. 10, an integrated circuit device 600 is substantially the same as the integrated circuit device 100 of FIG. 4. However, a plurality of contact pads CP60 disposed in the connection region CON include first through eighth divided contact pads CP61A, CP61B, CP62A, CP62B, CP63A, CP63B, CP64A, and CP64B respectively connected to conductive lines selected from among the plurality of conductive lines L10.

The plurality of contact pads CP60 include the first divided contact pad CP61A integrally connected to one conductive line L11A from among the first pair of conductive lines L11A and L11B and the second divided contact pad CP61B integrally connected to the other conductive line L11B from among the first pair of conductive lines L11A and L11B.

The first divided contact pad CP61A includes a first pad body 612A including a first branch portion P11A from which one conductive line from among the pair of first conductive lines L11A and L11B branches and a first hook branch portion 616A integrally connected to the first pad body 612A and including an end portion that extends in the second direction (e.g., the Y direction in FIG. 10) that intersects the first direction (e.g., the X direction).

The second divided contact pad CP61B includes a second pad body 612B including a second branch portion P11B from which the other conductive line L11B from among the first pair of conductive lines L11A and L11B branches and a second hook branch portion 616B including an end portion that extends in the second direction (e.g., the −Y direction in FIG. 10) that intersects the first direction (e.g., the X direction).

The first hook branch portion 616A and the second hook branch portion 616B may be arranged so that an extension line of the end portion of the first hook branch portion 616A and an extension line of the end portion of the second hook branch portion 616B are on the same line (e.g., aligned or co-linear) E1. The first hook branch portion 616A and the second hook branch portion 616B may have the same shape or similar shapes and may be disposed to be symmetric (e.g., mirror symmetric) to each other.

The plurality of contact pads CP60 includes the third divided contact pad CP62A integrally connected to one conductive line L12A from among the second pair of conductive lines L12A and L12B and the fourth divided contact pad CP62B integrally connected to the other conductive line L12B from among the second pair of conductive lines L12A and L12B.

The third divided contact pad CP62A includes a third pad body 622A including a first branch portion P12A from which one conductive line L12A from among the second pair of conductive lines L12A and L12B branches and a third hook branch portion 626A including an end portion that extends in the second direction (e.g., the Y direction in FIG. 10) that intersects the first direction (e.g., the X direction). The third hook branch portion 626A extends in the second direction (e.g., the Y direction) to be parallel to the first hook branch portion 616A.

The fourth divided contact pad CP62B includes a fourth pad body 622B including a second branch portion P12B from which the other conductive line L12B from among the second pair of conductive lines L12A and L12B branches and a fourth hook branch portion 626B including an end portion that extends in the second direction (e.g., the −Y direction in FIG. 10) that intersects the first direction (e.g., the X direction). The fourth hook branch portion 626B extends in the second direction (e.g., the −Y direction) to be parallel to the second hook branch portion 616B.

The third hook branch portion 626A and the fourth hook branch portion 626B may be arranged so that an extension line of the end portion of the third hook branch portion 626A and an extension line of the end portion of the fourth hook branch portion 626B are on the same line (e.g., aligned or co-linear) E2. The third hook branch portion 626A and the fourth hook branch portion 626B may have the same shape or similar shapes and may be disposed to be symmetric (e.g., mirror symmetric) to each other.

The third hook branch portion 626A may have a shape different from that of the first hook branch portion 616A and may face the first hook branch portion 616A. The fourth hook branch portion 626B may have a shape different from that of the second hook branch portion 616B and may face the second hook branch portion 616B.

The plurality of contact pads CP60 includes the fifth divided contact pad CP63A integrally connected to one conductive line L13A from among the third pair of conductive lines L13A and L13B and the sixth divided contact pad CP63B integrally connected to the other conductive line L13B from among the third pair of conductive lines L13A and L13B.

The fifth divided contact pad CP63A includes a fifth pad body 632A including a first branch portion P13A from which one conductive line L13A from among the third pair of conductive lines L13A and L13B branches and a fifth hook branch portion 636A integrally connected to the fifth pad body 632A and including an end portion that extends in the second direction (e.g., the Y direction in FIG. 10) that intersects the first direction (e.g., the X direction).

The sixth divided contact pad CP63B includes a sixth pad body 632B including a second branch portion P13B from which the other conductive line L13B from among the third pair of conductive lines L13A and L13B branches and a sixth hook branch portion 636B integrally connected to the sixth pad body 632B and including an end portion that extends in the second direction (e.g., the −Y direction in FIG. 10) that intersects the first direction (e.g., the X direction). The fifth hook branch portion 636A and the sixth hook branch portion 636B may be arranged so that an extension line of the end portion of the fifth hook branch portion 636A and an extension line of the end portion of the sixth hook branch portion 636B are on the same line (e.g., aligned or co-linear) E3. The fifth hook branch portion 636A and the sixth hook branch portion 636B may have the same shape or similar shapes and may be disposed to be symmetric (e.g., mirror symmetric) to each other. The fifth hook branch portion 636A and the third hook branch portion 626A may have the same shape or similar shapes and may be disposed to be symmetric (e.g., mirror symmetric) to each other. The sixth hook branch portion 636B and the fourth hook branch portion 626B may have the same shape or similar shapes and may be disposed to be symmetric (e.g., mirror symmetric) to each other.

The plurality of contact pads CP60 include the seventh divided contact pad CP64A integrally connected to one conductive line L14A from among the fourth pair of conductive lines L14A and L14B and the eighth divided contact pad CP64B integrally connected to the other conductive line L14B from among the fourth pair of conductive lines L14A and L14B.

The seventh divided contact pad CP64A includes a seventh pad body 642A including a first branch portion P14A from which one conductive line L14A from among the fourth pair of conductive lines L14A and L14B branches and a seventh hook branch portion 646A integrally connected to the seventh pad body 642A and including an end portion that extends in the second direction (e.g., the Y direction in FIG. 10) that intersects the first direction (e.g., the X direction).

The eighth divided contact pad CP64B includes an eighth pad body 642B including a second branch portion P14B from which one conductive line L14B from among the fourth pair of conductive lines L14A and L14B branches and an eighth hook branch portion 646B integrally connected to the eighth pad body 642B and including an end portion that extends in the second direction (e.g., the −Y direction in FIG. 10) that intersects the first direction (e.g., the X direction).

The seventh hook branch portion 646A and the eighth hook branch portion 646B may be arranged so that an extension line of the end portion of the seventh hook branch portion 646A and an extension line of the end portion of the eighth hook branch portion 646B are on the same line (e.g., aligned or co-linear) E4. The seventh hook branch portion 646A and the eighth hook branch portion 646B may have the same shape or similar shapes and may be disposed to be symmetric (e.g., mirror symmetric) to each other.

The seventh hook branch portion 646A and may have a shape different from that of the fifth hook branch portion 636A and may face the fifth hook branch portion 636A. The eighth hook branch portion 646B may have a shape different from that of the sixth hook branch portion 636B and may face the sixth hook branch portion 636B.

The seventh hook branch portion 646A and the first hook branch portion 616A may have the same shape or similar shapes and may be disposed to be symmetric (e.g., mirror symmetric) to each other. The eighth hook branch portion 646B and the second hook branch portion 616B may have the same shape or similar shapes and may be disposed to be symmetric (e.g., mirror symmetric) to each other.

Methods of manufacturing integrated circuit devices according to embodiments will now be explained in detail.

Figure 11A:
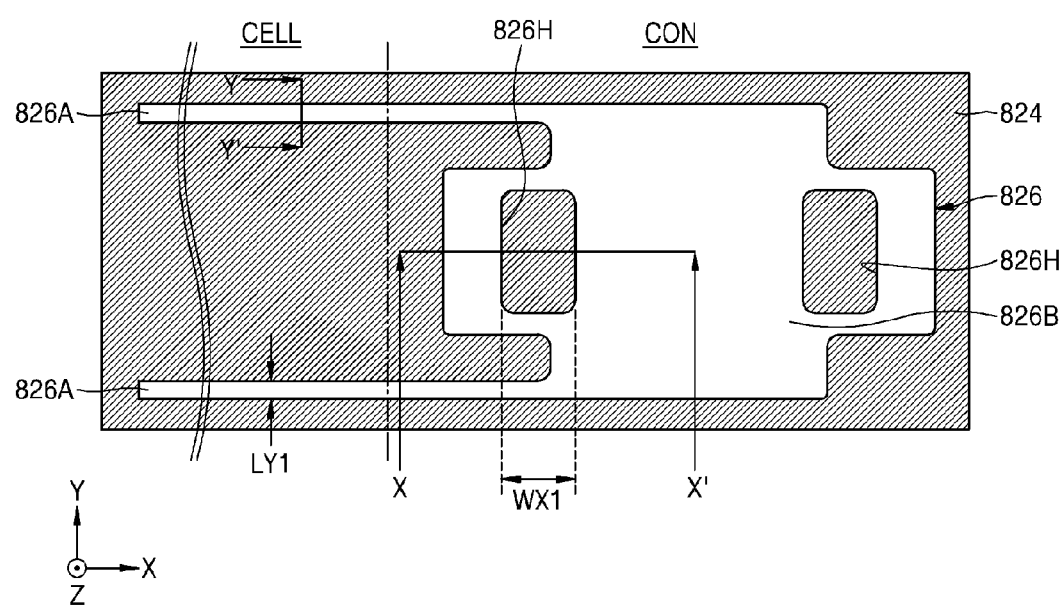
FIGS. 11A through 20B are views for explaining methods of manufacturing an integrated circuit device according to embodiments, FIGS. 11A, 12A, . . . , and 20A being plan views for explaining methods of manufacturing the integrated circuit device of FIG. 4 according to an example process order, FIGS. 11B, 12B, . . . , and 20B being cross-sectional views taken along lines X-X' and Y-Y' of FIGS. 11A, 12A, . . . , and 20A.

FIGS. 11A through 20B are views for explaining methods of manufacturing an integrated circuit device according to embodiments. FIGS. 11A, 12A, . . . , and 20A are plan views for explaining methods of manufacturing the integrated circuit device 100 of FIG. 4 according to an example process order. FIGS. 11B, 12B, . . . , and 20B are cross-sectional views taken along lines X-X' and Y-Y' of FIGS. 11A, 12A, . . . , and 20A. In FIGS. 11A through 20B, the same elements as those in FIGS. 1 through 4 are denoted by the same reference numerals, and thus a detailed explanation thereof will not be given.

Figure 11B:
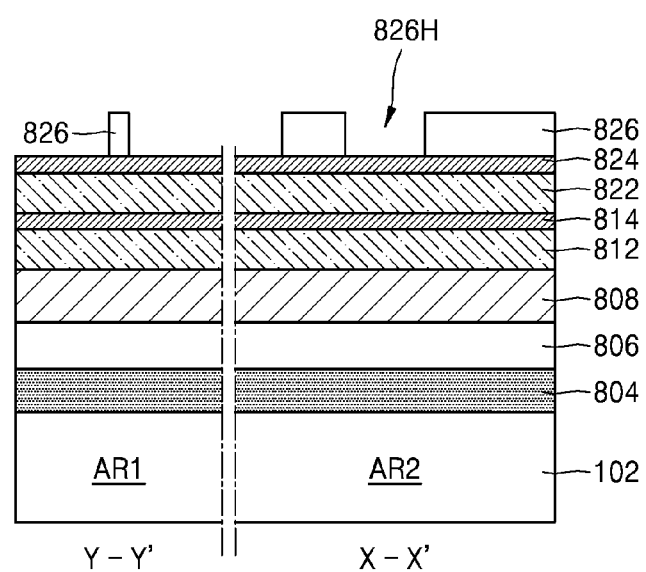

Referring to FIGS. 11A and 11B, a feature layer 804, a first hard mask layer 806, a second hard mask layer 808, a third hard mask layer 812, a fourth hard mask layer 814, a fifth hard mask layer 822, and a sixth hard mask layer 824 are sequentially formed on a substrate 102, and a mask pattern 826 is formed on the sixth hard mask layer 824.

The substrate 102 may be a semiconductor substrate. In some embodiments, the substrate 102 may be formed of a semiconductor such as silicon (Si) or germanium (Ge). In other embodiments, the substrate 102 may include a compound semiconductor such as SiGe, SiC, GaAs, InAs, or InP. In other embodiments, the substrate 102 may have a silicon-on-insulator (SOI) structure. The substrate 102 may include a conductive region, for example, a well doped with impurities or a structure doped with impurities. Also, the substrate 102 may have any of various device isolation structures such as a shallow trench isolation (STI) structure.

The substrate 102 includes a first region AR1 in which patterns are arranged at a relatively high density and a second region AR2 in which patterns are arranged at a relatively low density. The first region AR1 of the substrate 102 is a part of the cell array region CELL and the second region AR2 of the substrate 102 is a part of the connection region CON.

In some embodiments, the feature layer 804 may include a conductive film. In other embodiments, the feature layer 804 may have a stacked structure in which films needed to form the tunneling insulating layer 192, the charge storage layer 194, the blocking insulating layer 196, and the gate electrode layer 198 of FIG. 3C are stacked.

The first hard mask layer 806, the second hard mask layer 808, the third hard mask layer 812, the fourth hard mask layer 814, the fifth hard mask layer 822, and the sixth hard mask layer 824 may be formed of materials having etch selectivities with respect to adjacent layers.

In some embodiments, the first hard mask layer 806 may include a silicon oxide film and the second hard mask layer 808 may include polysilicon. The third hard mask layer 812 and the fifth hard mask layer 822 may be formed of, but not limited to, an SOH material and the fourth hard mask layer 814 and the sixth hard mask layer 824 may be formed of, but not limited to, silicon oxynitride.

In some embodiments, the mask pattern 826 may include a photoresist pattern. The mask pattern 826 may integrally extend from the first region AR1 to the second region AR2 of the substrate 102. The mask pattern 826 includes two linear or line portions 826A that extend in the first direction (e.g., the X direction) over the cell array region CELL and the connection region CON and a main body portion 826B that is integrally connected to the two linear or line portions 826A, is disposed in the second region AR2, and has a width greater than that of the linear or line portions 826A in the second direction (e.g., the Y direction). Two mask holes 826H are formed in the main body portion 826B. Sizes of the main body portion 826B in the first direction (e.g., the X direction) and the second direction (e.g., the Y direction), positions of the two mask holes 826H in the main body portion 826B, and sizes of the two mask holes 826H in the first direction (e.g., the X direction) may be determined in consideration of a width of a contact pad to be finally formed in the first direction (e.g., the X direction).

In some embodiments, when a minimum feature size of an integrated circuit device to be formed is 1 F, a length LY1 of each line portion 826A in the second direction (e.g., the Y direction) may be, but not limited to, at least 3 F and a width WX1 of each mask hole 826H formed in the main body portion 826B in the first direction (e.g., the X direction) may be, but not limited to, at least 5 F.

Figure 12A:
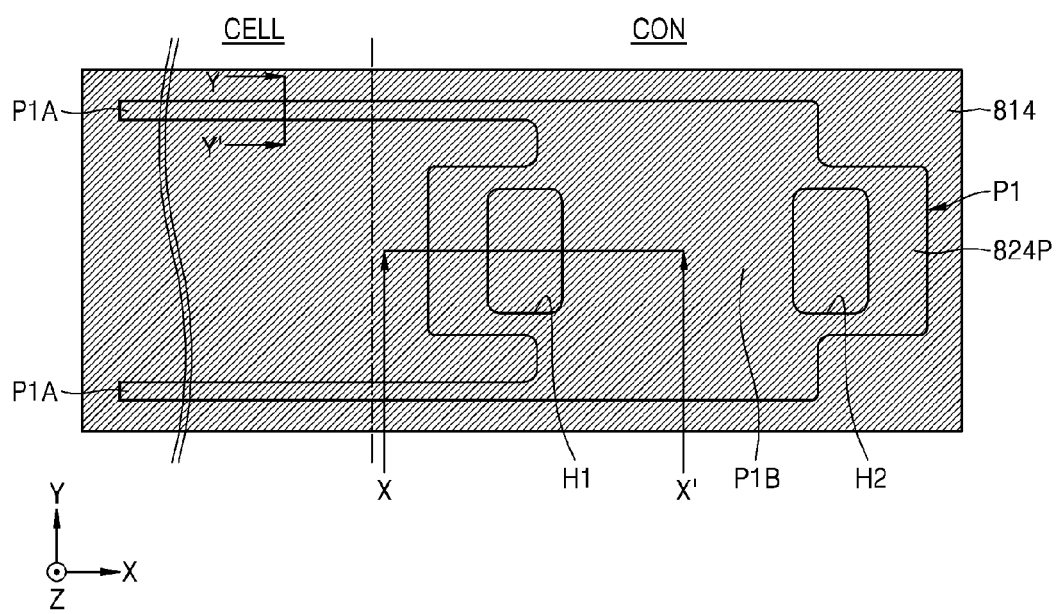
Figure 12B:
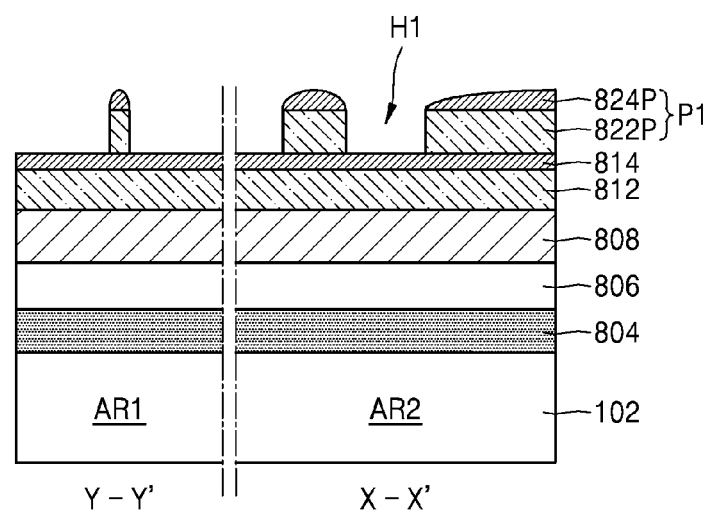

Referring to FIGS. 12A and 12B, a first structure P1 including a fifth hard mask pattern 822P and a sixth hard mask pattern 824P is formed by sequentially etching the sixth hard mask layer 824 and the fifth hard mask layer 822 by using the mask pattern 826 (see FIGS. 11A and 11B) as an etch mask.

The first structure P1 includes two linear or line portions P1A that extend in the first direction (e.g., the X direction) over the cell array region CELL and the connection region CON and a main body portion P1B that is integrally connected to the two linear or line portions P1A, is disposed in the second region AR2, and has a width greater than that of the linear or line portions P1A in the second direction (e.g., the Y direction).

Two reference holes H1 and H2 are formed in the main body portion P1B of the first structure P1 to correspond to the two mask holes 826H. The two reference holes H1 and H2 may have the same size in the first direction (e.g., the X direction). The fourth hard mask layer 814 is exposed through the two reference holes H1 and H2. The first structure P1 may be used as a reference structure for forming a desired final pattern.

While or after the sixth hard mask layer 824 and the fifth hard mask layer 822 are sequentially etched, the mask pattern 826 may be consumed or removed. While the fifth hard mask layer 822 is etched, the sixth hard mask pattern 824P may be used as an etch mask.

Figure 13A:
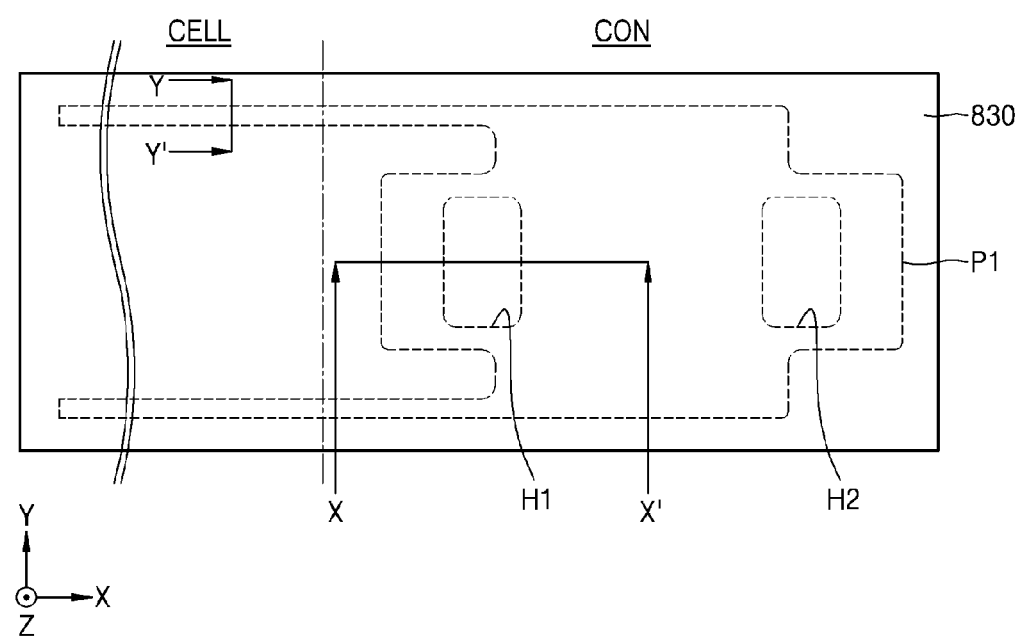
Figure 13B:
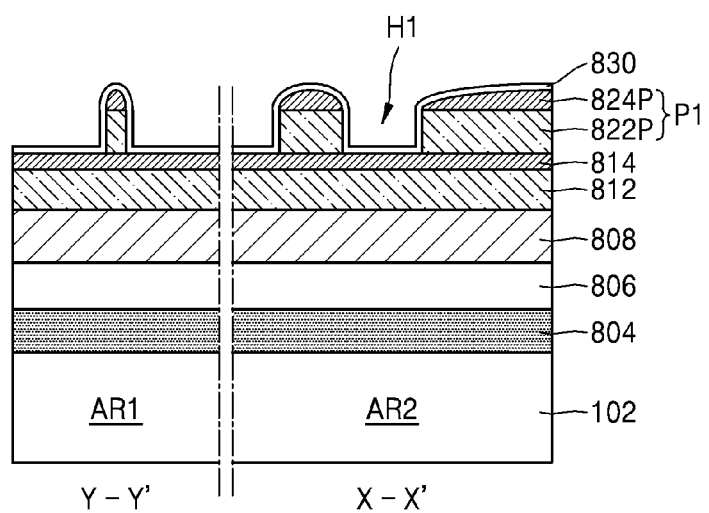

Referring to FIGS. 13A and 13B, a first spacer layer 830 that covers exposed surfaces of the first structure P1 and exposed surfaces of the fourth hard mask layer 814 to a uniform thickness is formed.

The first spacer layer 830 may include a silicon oxide film formed by using an atomic layer deposition (ALD) process. The first spacer layer 830 may be formed to cover side walls of the first structure P1 to a width of about 1 F.

Figure 14A:
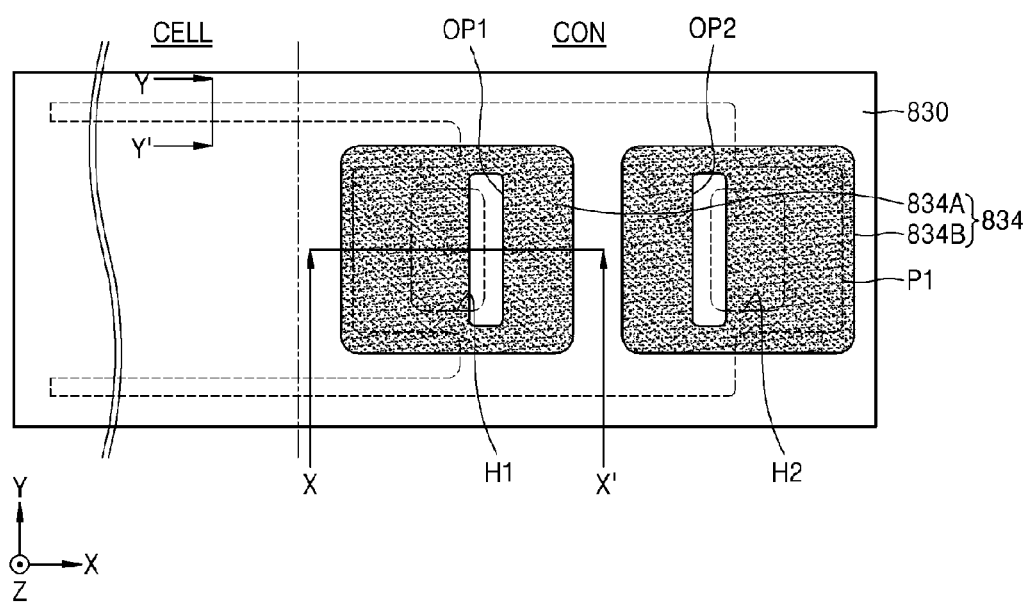
Figure 14B:
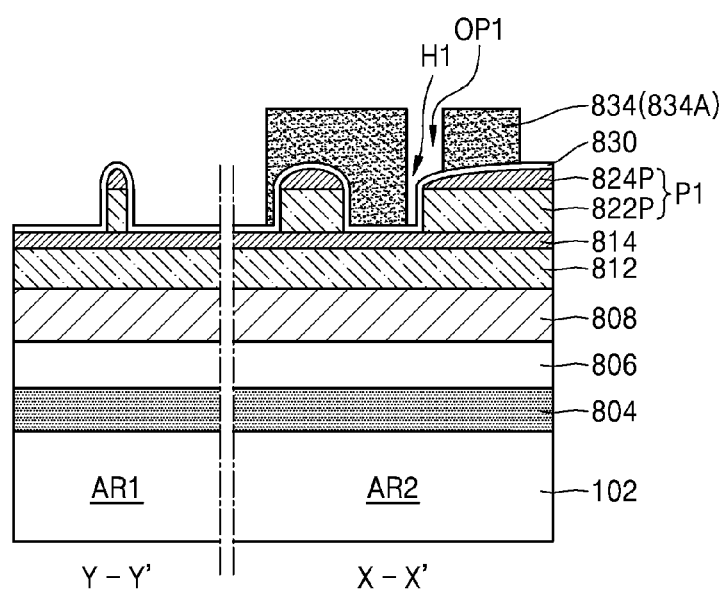

Referring to FIGS. 14A and 14B, a pad defining mask 834 that covers a portion of the first structure P1 is formed on the first spacer layer 830.

The pad defining mask 834 includes a first pad defining mask 834A that covers a part of one reference hole H1 from among the two reference holes H1 and H2 formed in the first structure P1 and a second pad defining mask 834B that covers a part of the other reference hole H2 from among the two reference holes H1 and H2. The first pad defining mask 834A and the second pad defining mask 834B may be formed to be spaced apart from each other. A first opening OP1 that perpendicularly overlaps a part of the reference hole H1 is formed in the first pad defining mask 834A and a second opening OP2 that perpendicularly overlaps a part of the reference hole H2 is formed in the second pad defining mask 834B. In some embodiments, the pad defining mask 834 may include a photoresist pattern.

Figure 15A:
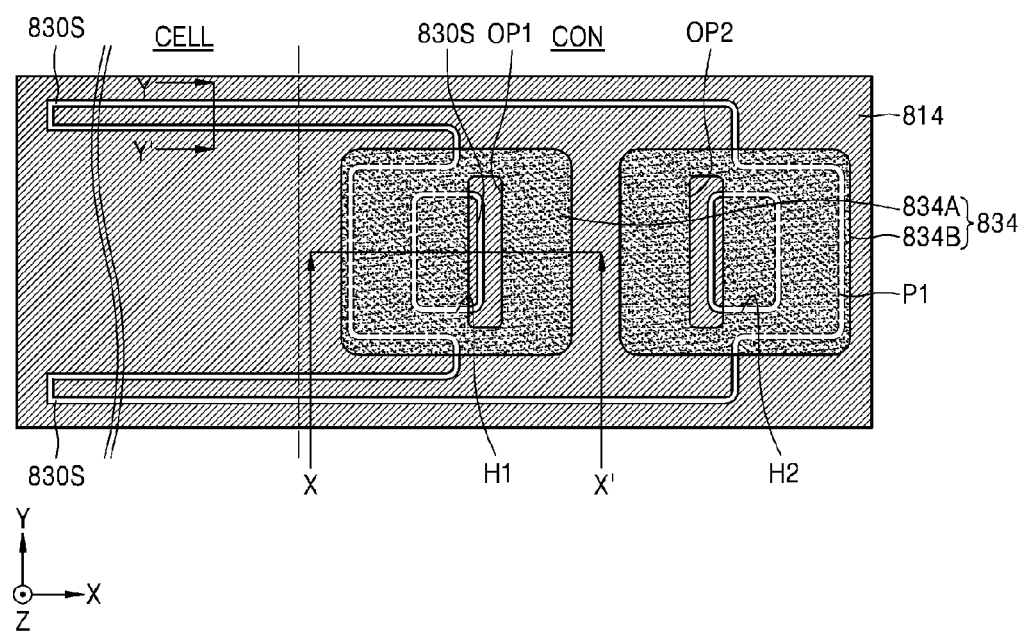
Figure 15B:
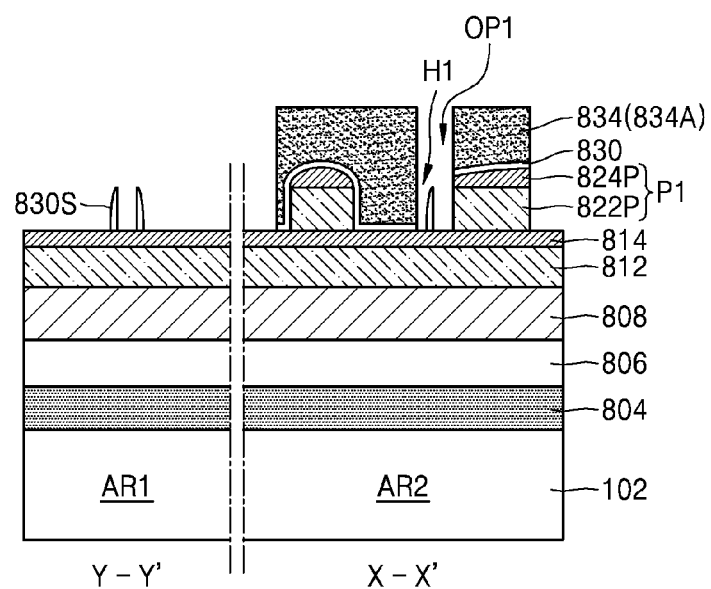

Referring to FIGS. 15A and 15B, a first spacer 830S is formed by performing etch-back on a part of the first spacer layer 830 that is exposed around the pad defining mask 834 by using the pad defining mask 834 as an etch mask, and the fourth hard mask layer 814 is exposed around the first spacer 830S and the pad defining mask 834 by removing portions of the first structure P1 that are exposed around the pad defining mask 834.

A part of the first spacer 830S may be exposed through the first opening OP1 formed in the first pad defining mask 834A and the second opening OP2 formed in the second pad defining mask 834B. A portion of the first spacer 830S that is exposed through the first opening OP1 may be used to provide a minimum distance between the first contact pad CP11 and the second contact pad CP12 in the integrated circuit device 100 (see FIG. 4) to be formed. A portion of the first spacer 830S that is exposed through the second opening OP2 may be used to provide a minimum distance between the third contact pad CP13 and the fourth contact pad CP14 in the integrated circuit device 100 (see FIG. 4) to be formed.

Figure 16A:
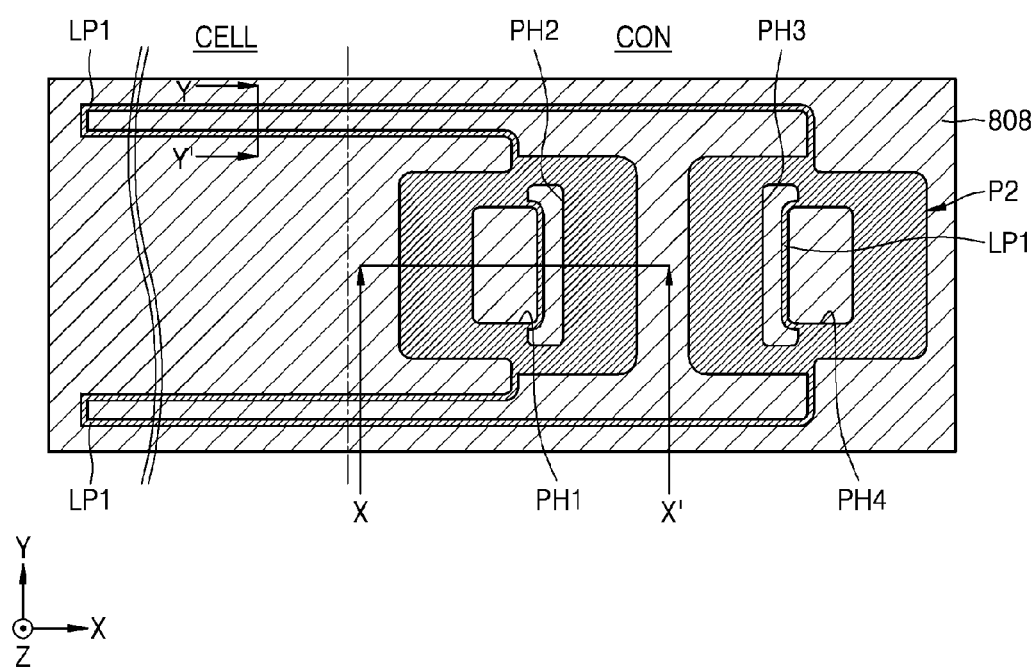
Figure 16B:
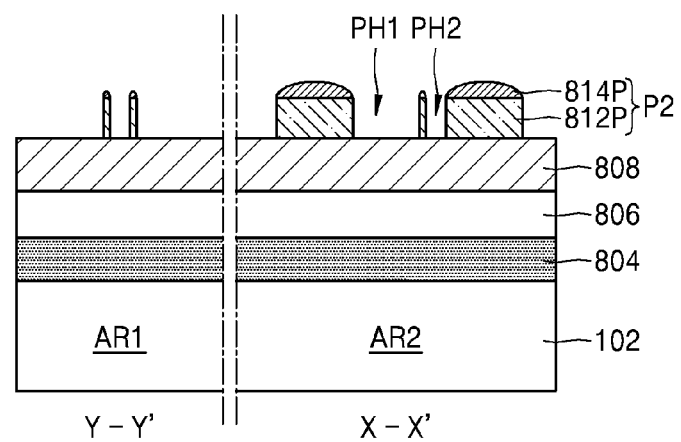

Referring to FIGS. 16A and 16B, a second structure P2 including a third hard mask pattern 812P and a fourth hard mask pattern 814P is formed by removing the first pad defining mask 834A and the second pad defining mask 834B from a resultant structure of FIGS. 15A and 15B and sequentially etching the fourth hard mask layer 814 and the third hard mask layer 812 by using the first spacer 830S, a remaining portion of the first spacer layer 830, and a remaining portion of the first structure P1 as an etch mask.

A first pad hole PH1, a second pad hole PH2, a third pad hole PH3, and a fourth pad hole PH4 are formed in the second structure P2 to respectively correspond to the reference hole H1 of the first structure P1 of FIG. 15A, the first opening OP1 of the first pad defining mask 834A, the second opening OP2 of the second pad defining mask 834B, and the reference hole H2 of the first structure P1. Also, the second structure P2 includes a line structure LP1 having a shape corresponding to that of the first spacer 830S of FIG. 15A.

While or after the fourth hard mask layer 814 and the third hard mask layer 812 are sequentially etched, the first spacer 830S may be consumed or removed. While the third hard mask layer 812 is etched, the fourth hard mask pattern 814P may be used as an etch mask.

A thickness of a portion of the fourth hard mask pattern 814P that corresponds to the line structure LP1 of the second structure P2 may be less than a thickness of other portions of the fourth hard mask pattern 814P that correspond to other portions of the second structure P2. This is because a portion of the fourth hard mask pattern 814P that corresponds to the line structure LP1 has a width smaller than those of other portions. That is, since a portion of the fourth hard mask pattern 814P that corresponds to the line structure LP1 has a width smaller than those of other portions, a removal amount of the portion having the smaller width of the fourth hard mask pattern 814P from a top surface and side walls while the third hard mask layer 812 is etched by using the fourth hard mask pattern 814P as an etch mask may be high due to 3D etching effect, and thus the portion may remain to a smaller thickness than other portions having larger widths.

Figure 17A:
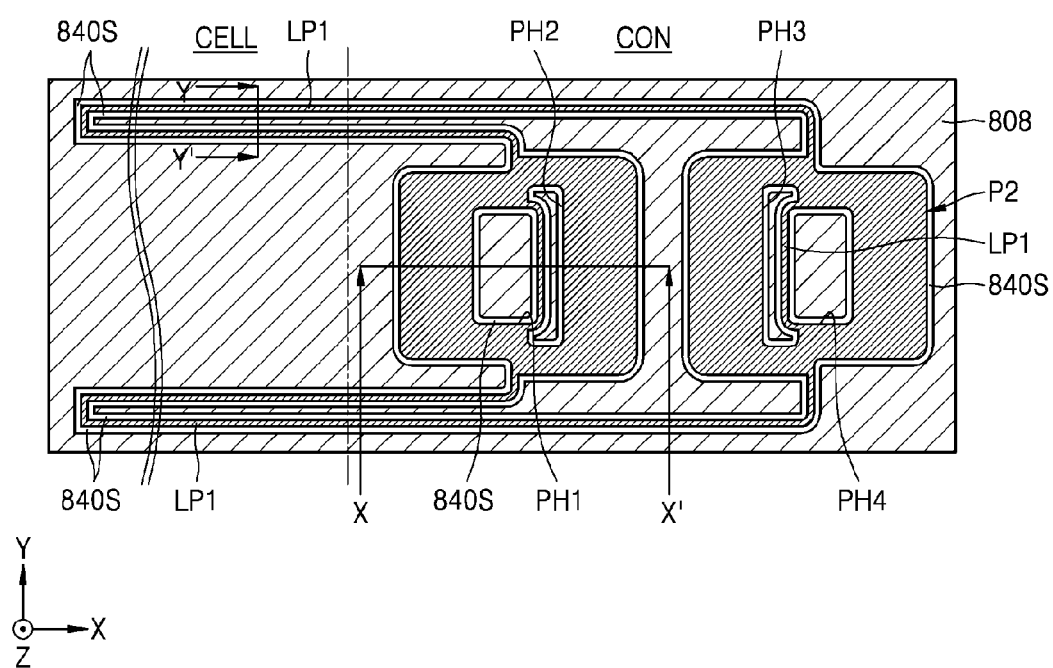
Figure 17B:
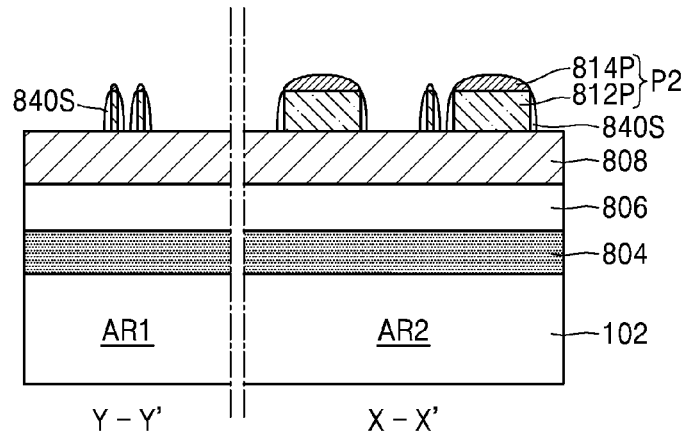

Referring to FIGS. 17A and 17B, a second spacer 840S that covers side walls of the second structure P2 is formed by forming a second spacer layer that covers exposed surfaces of the second structure P2 and the second hard mask layer 808 to a uniform thickness and then performing etch-back on the second spacer layer.

The second spacer layer may include a silicon oxide film formed by using an ALD process. The second spacer 840S may be formed to cover inner side walls of the first through fourth pad holes PH1, PH2, PH3, and PH4 and outer side walls of the second structure P2 to a width of about 1 F.

Figure 18A:
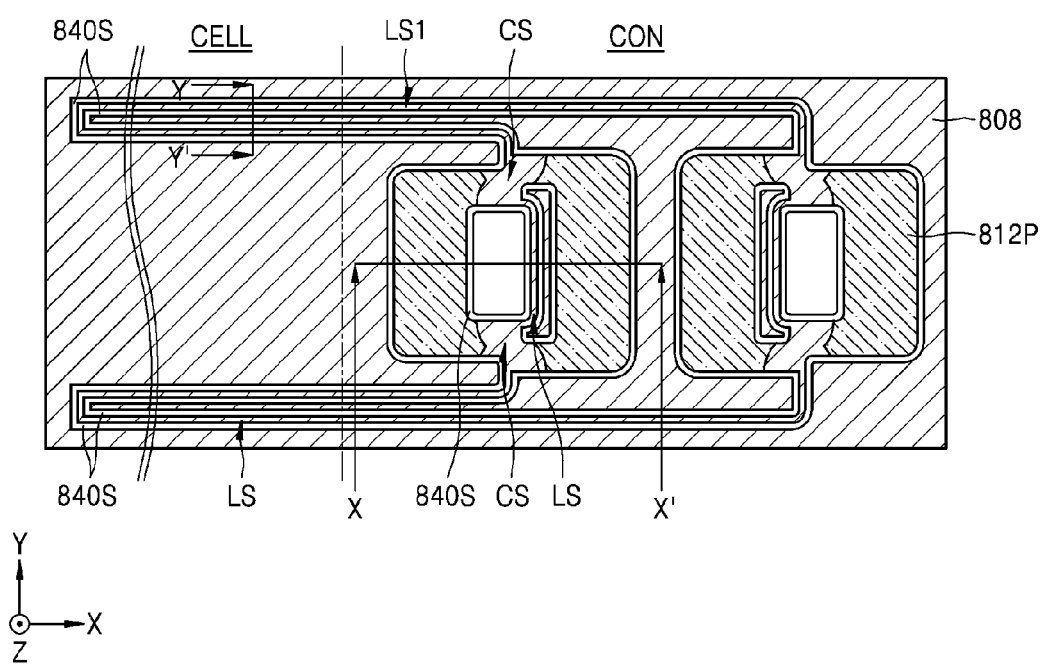
Figure 18B:
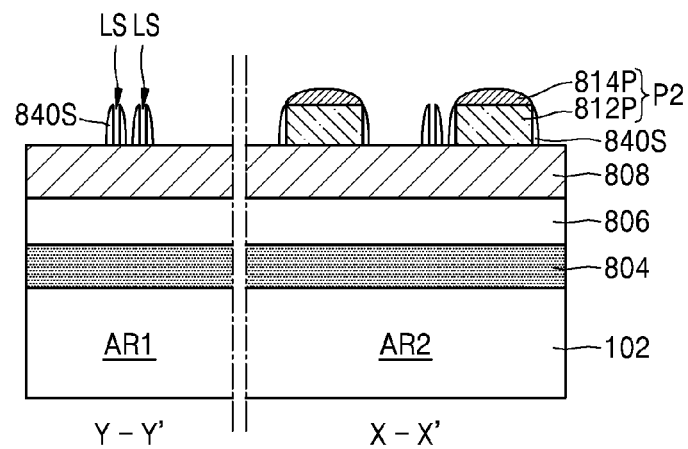

Referring to FIGS. 18A and 18B, only a portion of the second structure P2 that corresponds to the line structure LP1 (see FIGS. 17A and 17B) is selectively removed. For convenience of explanation, the fourth hard mask pattern 814P that covers the third hard mask pattern 812P is not shown in FIG. 18A.

In order to selectively remove only the portion of the second structure P2 that corresponds to the line structure LP1, a thickness difference of the fourth hard mask pattern 814P of the second structure P2 may be used. The fourth hard mask pattern 814P may be removed by a predetermined thickness so that the third hard mask pattern 812P is covered by portions other than a portion of the fourth hard mask pattern 814P that corresponds to the line structure LP1 and the third hard mask pattern 812P is exposed on the portion of the fourth hard mask pattern 814P that corresponds to the line structure LP1. As a result, the third hard mask pattern 812P may be exposed on the portion of the second structure P2 that corresponds to the line structure LP1 and the third hard mask pattern 812P may not be exposed on a portion other than the portion of the second structure P2 that corresponds to the line structure LP1. Next, a line space LS defined by the second spacer 840S may remain by removing exposed portions of the third hard mask pattern 812P that correspond to the line structure LP1. In some embodiments, an isotropic dry etching process may be used to remove the exposed portions of the third hard mask pattern 812P that correspond to the line structure LP1.

While the exposed portions of the third hard mask pattern 812P that correspond to the line structure LP1 are removed, from among portions of the third hard mask pattern 812P that have relatively large widths and are covered by the fourth hard mask pattern 814P, a portion of the third hard mask pattern 812P that is adjacent to the line space LS may be removed due to the spread of an etching atmosphere, and thus a communication space CS that enables different line spaces LS that are spaced apart from each other to communicate with each other (by defining an electrically isolating space or cavity without obstructions therebetween) may be formed. While the communication space CS is formed, from among portions other than a portion of the fourth hard mask pattern 814P that corresponds to the line structure LP1, a portion of the fourth hard mask pattern 814P that covers the third hard mask pattern 812P may remain without being removed, and thus after the communication space CS is formed, the communication space CS may still be covered by the fourth hard mask pattern 814P.

Figure 19A:
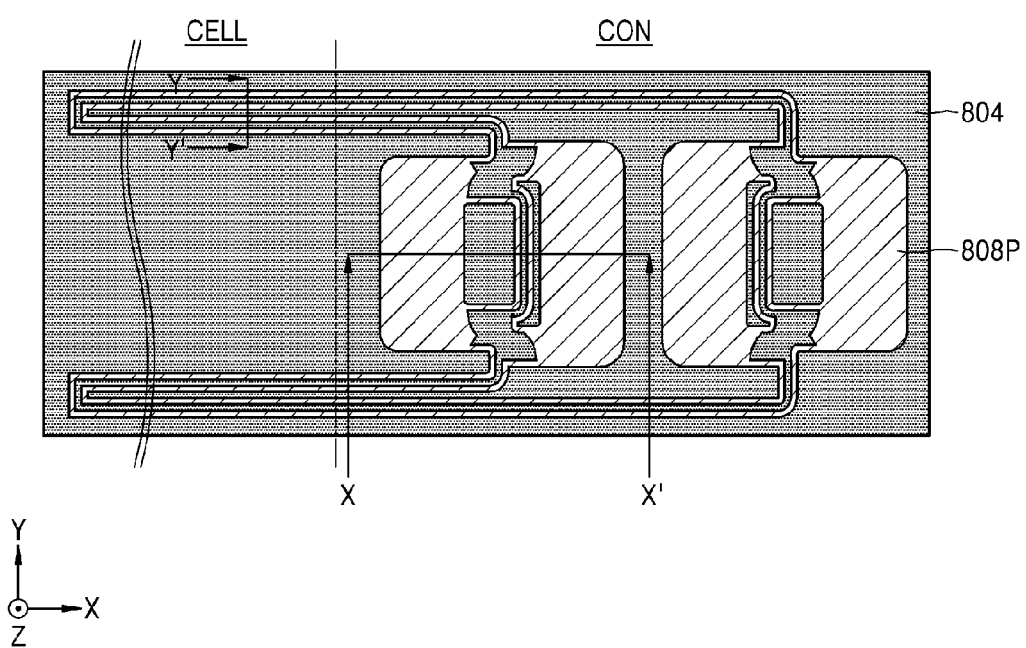
Figure 19B:
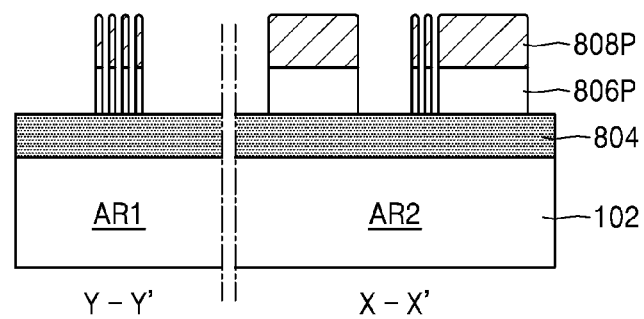

Referring to FIGS. 19A and 19B, a second hard mask pattern 808P is formed by etching the second hard mask layer 808 by using the second structure P2 and the second spacer 840S that remain in a resultant structure of FIGS. 18A and 18B as an etch mask. Next, a first hard mask pattern 806P is formed by etching the first hard mask layer 806 by using the second hard mask pattern 808P as an etch mask, and the feature layer 804 is exposed.

Figure 20A:
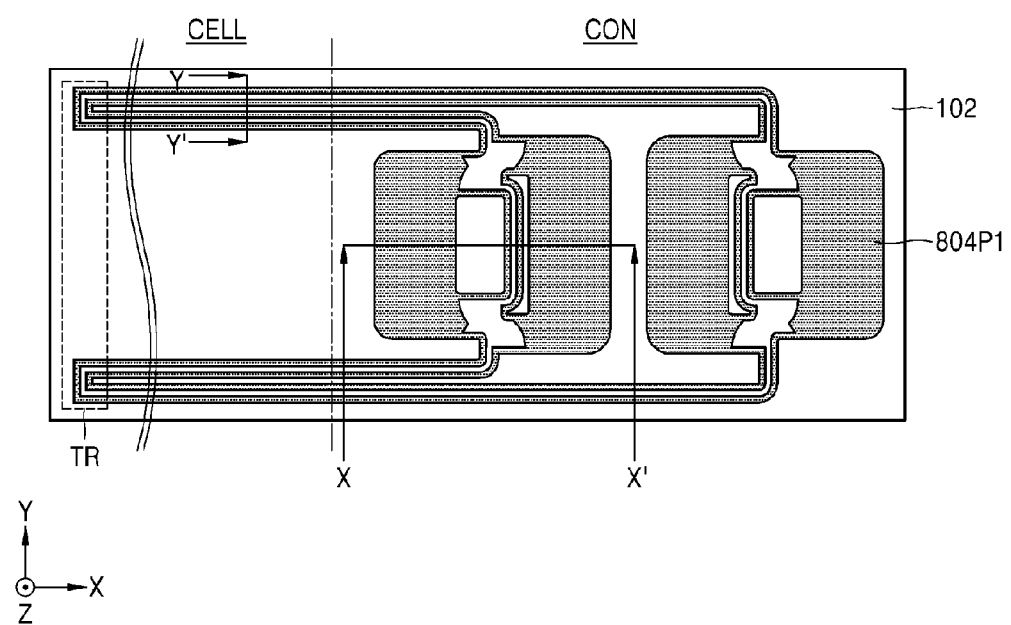
Figure 20B:
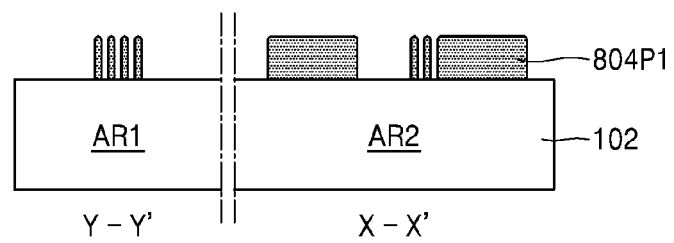

Referring to FIGS. 20A and 20B, a feature pattern 804P1 is formed by etching the feature layer 804 (see FIGS. 19A and 19B) by using the first hard mask pattern 806P as an etch mask.

Next, unnecessary films remaining on the feature pattern 804P1 may be removed, and some portions of the feature pattern 804P1, for example, portions "TR" of the feature pattern 804P1, may be removed. The feature pattern 804P1 remaining as a result may include the plurality of conductive lines L10 and the plurality of contact pads CP10 of FIG. 4.

Although methods of manufacturing the integrated circuit device 100 of FIG. 4 have been described with reference to FIGS. 11A through 20B, the inventive concepts are not limited thereto. Various modifications and changes to the description of FIGS. 11A through 20B may be made without departing from the scope of the inventive concepts.

In the method of manufacturing an integrated circuit device of FIGS. 11A through 20B, a plurality of patterns having different widths according positions may be formed in the first region AR1 having a relatively small pattern width and the second region AR2 having a relatively large pattern width. Accordingly, a plurality of fine patterns that have small widths and are repeatedly formed at small pitches exceeding a resolution limit of a photolithography process may be easily formed to have different widths according to positions. Also, when an integrated circuit device having a structure in which a plurality of contact pads share two conductive lines that are spaced apart from each other is formed, an additional trimming process for separating each contact pad into two in the connection region CON may be omitted. Accordingly, a process of manufacturing an integrated circuit device may be simplified and a sufficient process margin for forming a plurality of fine patterns may be ensured.

Figure 21A:
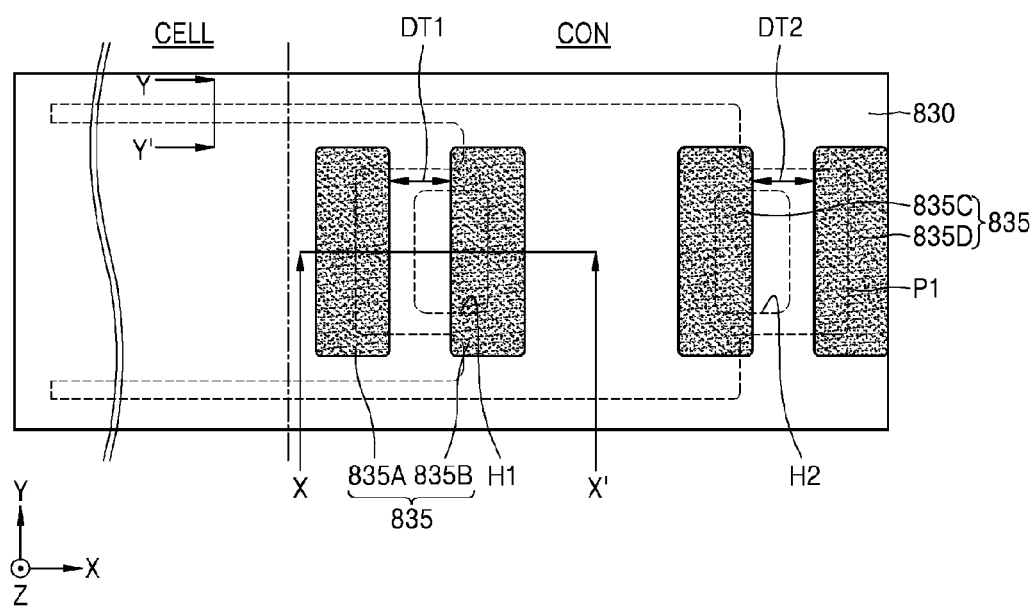
FIGS. 21A through 26B are views for explaining methods of manufacturing an integrated circuit device according to embodiments, FIGS. 21A, 22A, . . . , and 26A being plan views for explaining methods of manufacturing the integrated circuit device of FIG. 5 according to an example process order, FIGS. 21B, 22B, . . . , and 26B being cross-sectional views taken along lines X-X' and Y-Y' of FIGS. 21A, 22A, . . . , and 26A.

FIGS. 21A through 26B are views for explaining methods of manufacturing an integrated circuit device according to embodiments. FIGS. 21A, 22A, . . . , and 26A are plan views for explaining methods of manufacturing the integrated circuit device 200 of FIG. 5 according to an example process order. FIGS. 21B, 22B, . . . , and 26B are cross-sectional views taken along lines X-X' and Y-Y' of FIGS. 21A, 22A, . . . , and 26A. In FIGS. 21A through 26B, the same elements as those in FIGS. 1 through 6 are denoted by the same reference numerals, and thus a detailed explanation thereof will not be given.

Figure 21B:
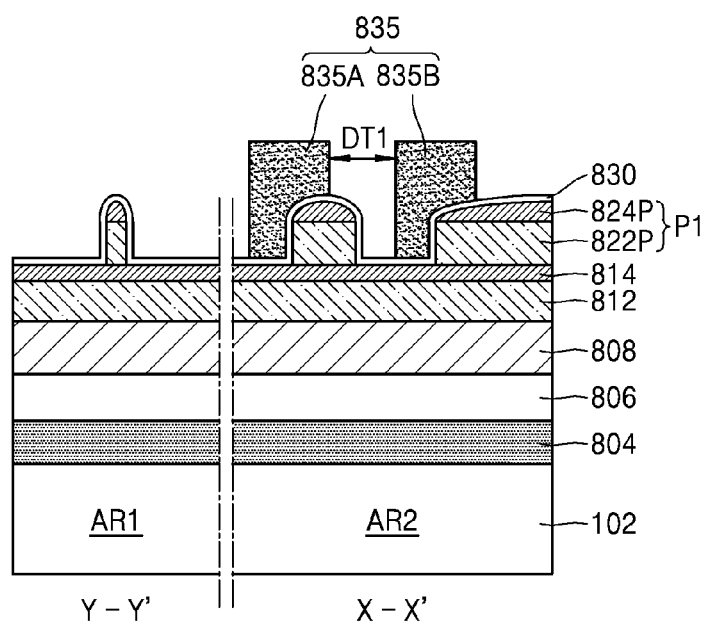

Referring to FIGS. 21A and 21B, the first spacer layer 830 that covers exposed surfaces of the first structure P1 and exposed surfaces of the fourth hard mask layer 814 to a uniform thickness is formed in the same manner as that described with reference to FIGS. 11A through 13B, and then a pad defining mask 835 that covers a portion of the first structure P1 is formed on the first spacer layer 830.

The pad defining mask 835 includes first through fourth pad defining masks 835A, 835B, 835C, and 835D that are spaced apart from one another. The first and fourth pad defining masks 835A and 835D from among the first through fourth pad defining masks 835A, 835B, 835C, and 835D may be formed to cover edge portions of the first structure P1 in the connection region CON and the second and third pad defining masks 835B and 835C may be formed to cover parts of the reference holes H1 and H2 formed in the first structure P1. The first and second pad defining masks 835A and 835B may be spaced apart from each other with a first interval DT1 therebetween. The first interval DT1 may correspond to a portion that perpendicularly overlaps a part of the reference hole H1. The third and fourth pad defining masks 835C and 835D may be spaced apart from each other with a second interval DT2 therebetween. The second interval DT2 may correspond to a portion that perpendicularly overlaps a part of the reference hole H2. In the first direction (e.g., the X direction), the first interval DT1 and the second interval DT2 may be the same. In some embodiments, the pad defining mask 835 may include a photoresist pattern.

Figure 22A:
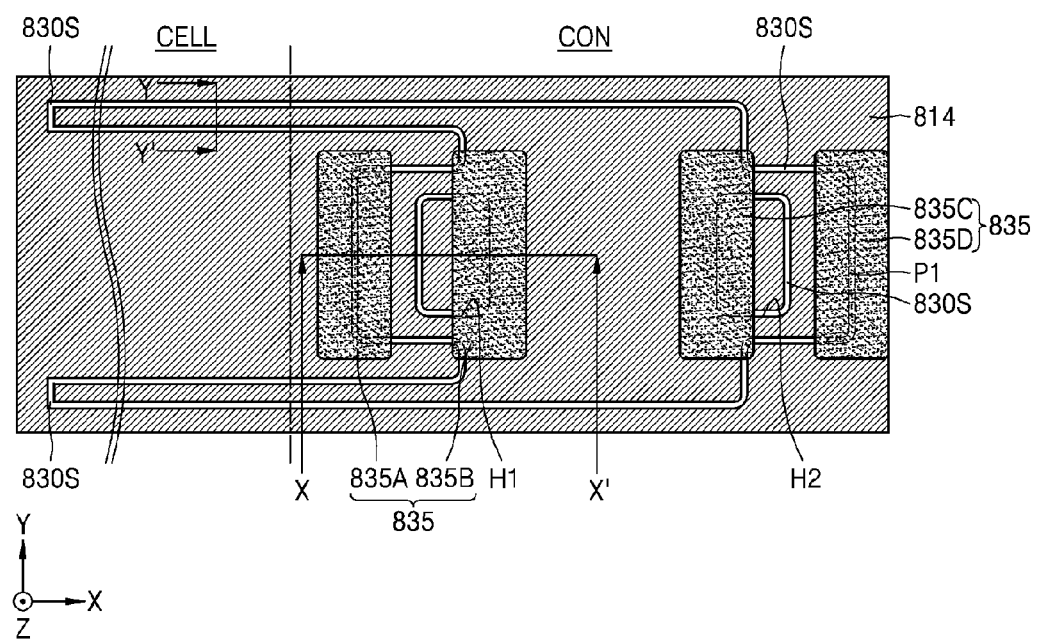
Figure 22B:
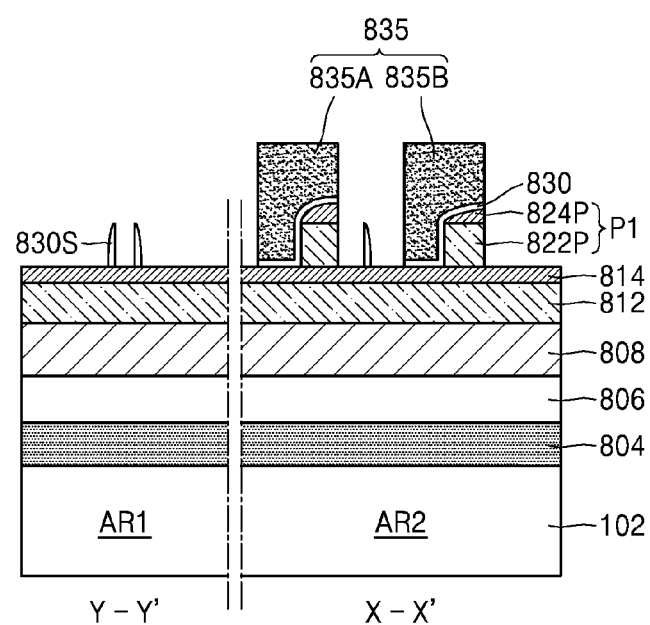

Referring to FIGS. 22A and 22B, the first spacer 830S is formed by performing etch-back on a part of the first spacer layer 830 that is exposed around the pad defining mask 835 by using the pad defining mask 835 as an etch mask and the fourth hard mask layer 814 is exposed around the first spacer 830S and the pad defining mask 835 by removing portions of the structure P1 that are exposed around the pad defining mask 835, in a manner similar to that described with reference to FIGS. 15A and 15B.

A part of the first spacer 830S may be exposed through the first interval DT1 between the first and second pad defining masks 835A and 835B and the second interval DT2 between the third and fourth pad defining masks 835C and 835D of FIG. 21A. A portion of the first spacer 830S that is exposed through the first interval DT1 may be used to provide a minimum distance between the first contact pad CP21 and the second contact pad CP22 in the integrated circuit device 200 (see FIG. 5) to be formed. A portion of the first spacer 830S that is exposed through the second interval DT2 may be used to provide a minimum distance between the third contact pad CP23 and the fourth contact pad CP24 in the integrated circuit device 200 (see FIG. 5) to be formed.

Figure 23A:
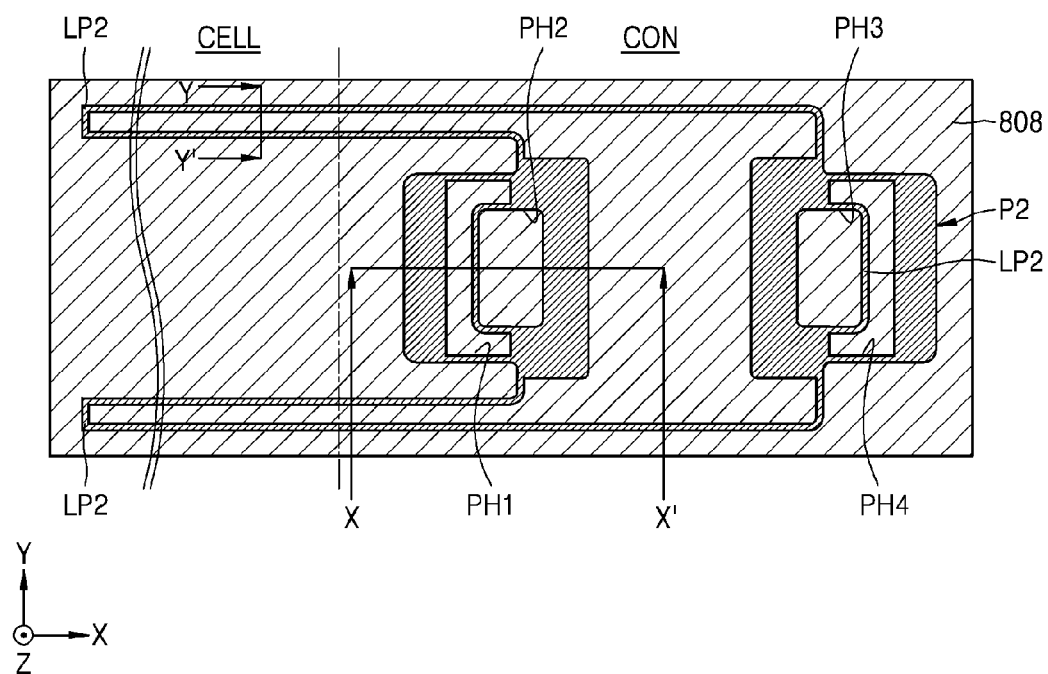
Figure 23B:
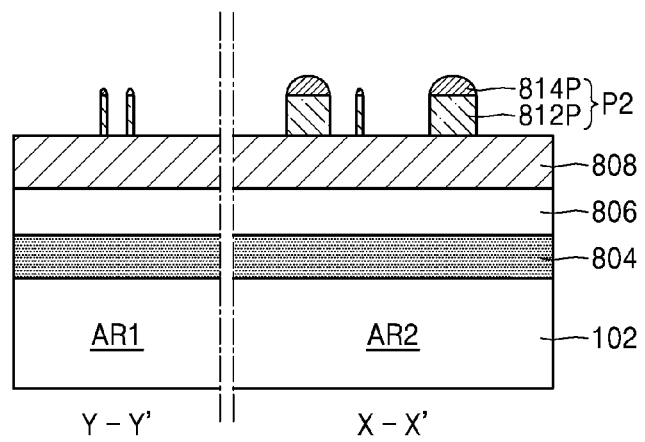

Referring to FIGS. 23A and 23B, the second structure P2 including the third hard mask pattern 812P and the fourth hard mask pattern 814P is formed by removing the pad defining mask 835 from a resultant structure of FIGS. 22A and 22B and then sequentially etching the fourth hard mask layer 814 and the third hard mask layer 812 by using the first spacer 830S, a remaining portion of the first spacer layer 830, and a remaining portion of the first structure P1 as an etch mask, in a manner similar to that described with reference to FIGS. 16A and 16B.

The first pad hole PH1, the second pad hole PH2, the third pad hole PH3, and the fourth pad hole PH4 may be formed in the second structure P2 to respectively correspond to the first interval DT1, the reference hole H1 of the first structure P1, the reference hole H2 of the first structure P1, and the second interval DT2 of FIG. 21A. Also, the second structure P2 includes a line structure LP2 having a shape corresponding to that of the first spacer 830S of FIG. 22A.

Figure 24A:
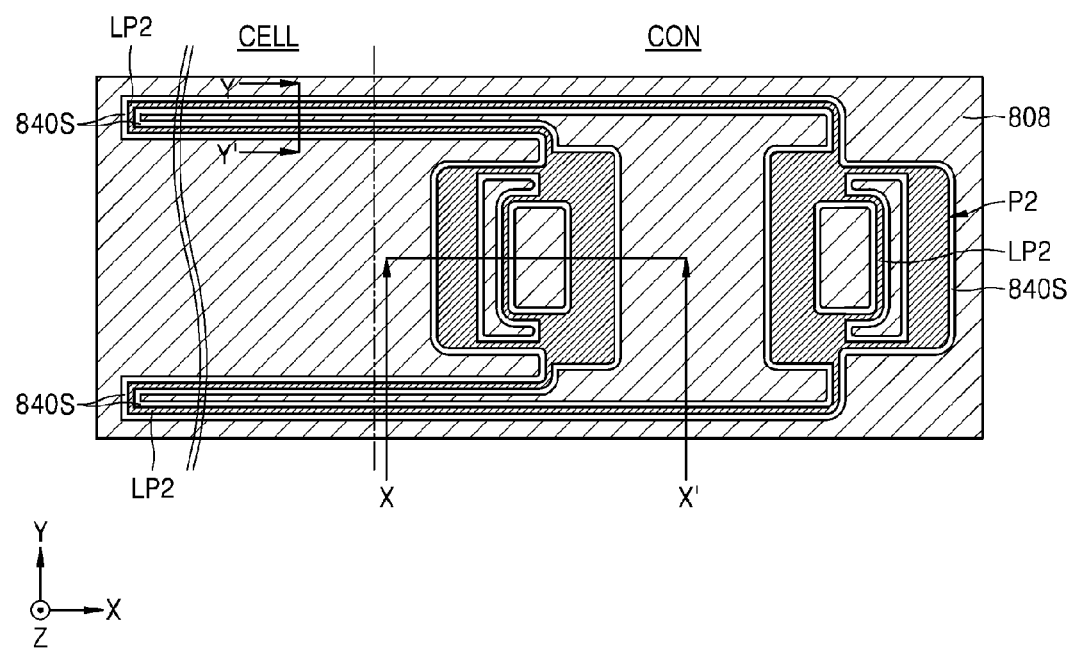
Figure 24B:
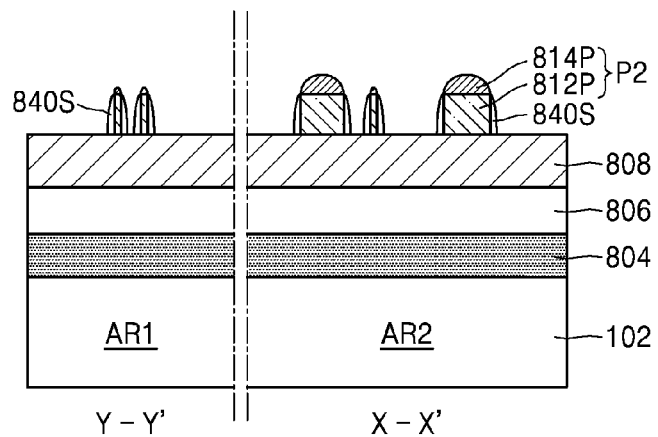

Referring to FIGS. 24A and 24B, the second spacer 840S that covers side walls of the second structure P2 is formed by forming a second spacer layer that covers exposed surfaces of the second structure P2 and the second hard mask layer 808 to a uniform thickness and then performing etch-back on the second spacer layer, in a manner similar to that described with reference to FIGS. 17A and 17B.

Figure 25A:
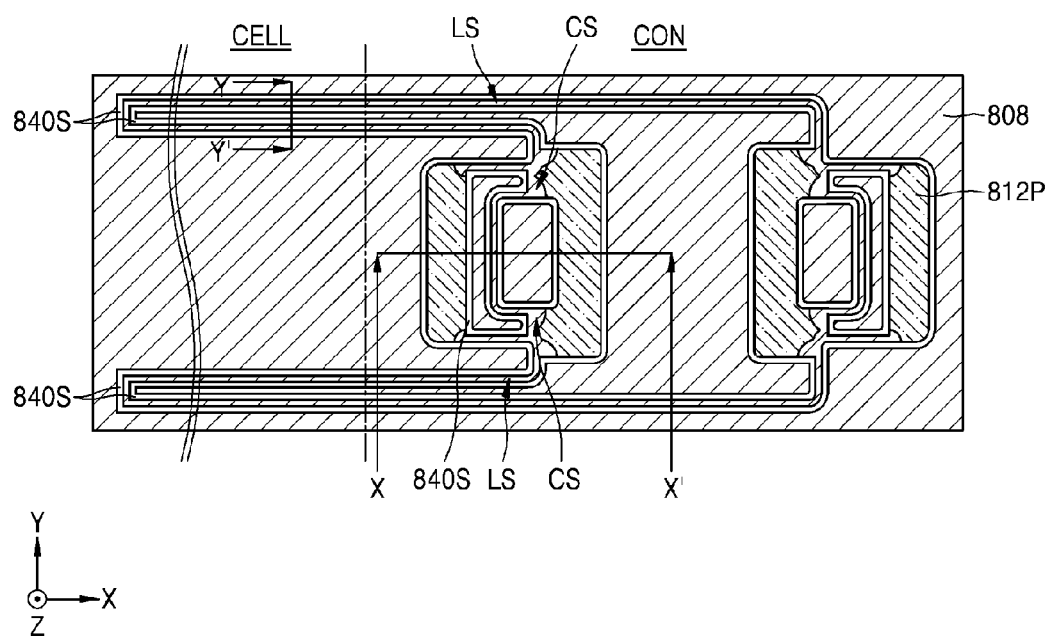
Figure 25B:
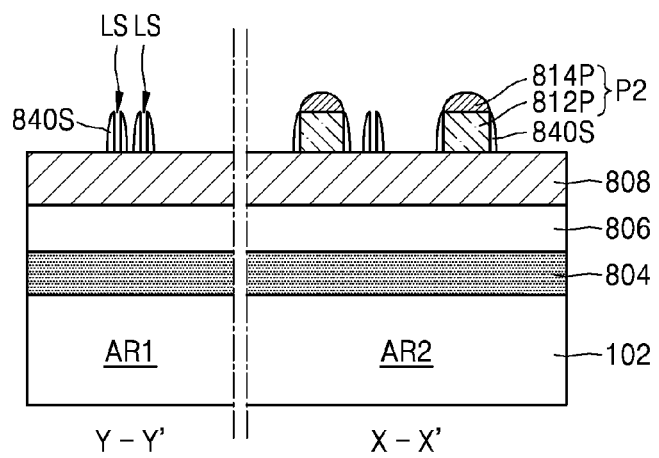

Referring to FIGS. 25A and 25B, only a portion of the second structure P2 that corresponds to the line structure LP2 (see FIGS. 24A and 24B) is removed, in a manner similar to that described with reference to FIGS. 18A and 18B. For convenience of explanation, the fourth hard mask pattern 814P that covers the third hard mask pattern 812P is not shown in FIG. 25A.

In order to selectively remove only the portion of the second structure P2 that corresponds to the line structure LP2, a thickness difference of the fourth hard mask pattern 814P of the second structure P2 may be used. That is, the fourth hard mask pattern 814P may be removed by a predetermined thickness so that the third hard mask pattern 812P is covered by portions other than a portion of the fourth hard mask pattern 814P that corresponds to the line structure LP2 and the third hard mask pattern 812P is exposed on the portion of the fourth hard mask pattern 814P that corresponds to the line structure LP2. As a result, the third hard mask pattern 812P may be exposed on a portion of the second structure P2 that corresponds to the line structure LP2. Next, the line space LS defined by the second spacer 840S may remain by removing exposed portions of the third hard mask pattern 812P that correspond to the line structure LP2. In some embodiments, an isotropic dry etching process may be used to remove the exposed portions of the third hard mask pattern 812P that correspond to the line structure LP2.

While the exposed portions of the third hard mask pattern 812P that correspond to the line structure LP2 are removed, from among portions of the third hard mask pattern 812P that have a relatively large widths and are covered by the fourth hard mask pattern 814P, a portion of the third hard mask pattern 812P that is adjacent to the line space LS may be removed due to the spread of an etching atmosphere, and thus the communication space CS that enables different line spaces LS that are spaced apart from each other to communicate with each other (by defining an electrically isolating space or cavity without obstructions therebetween) may be formed.

Figure 26A:
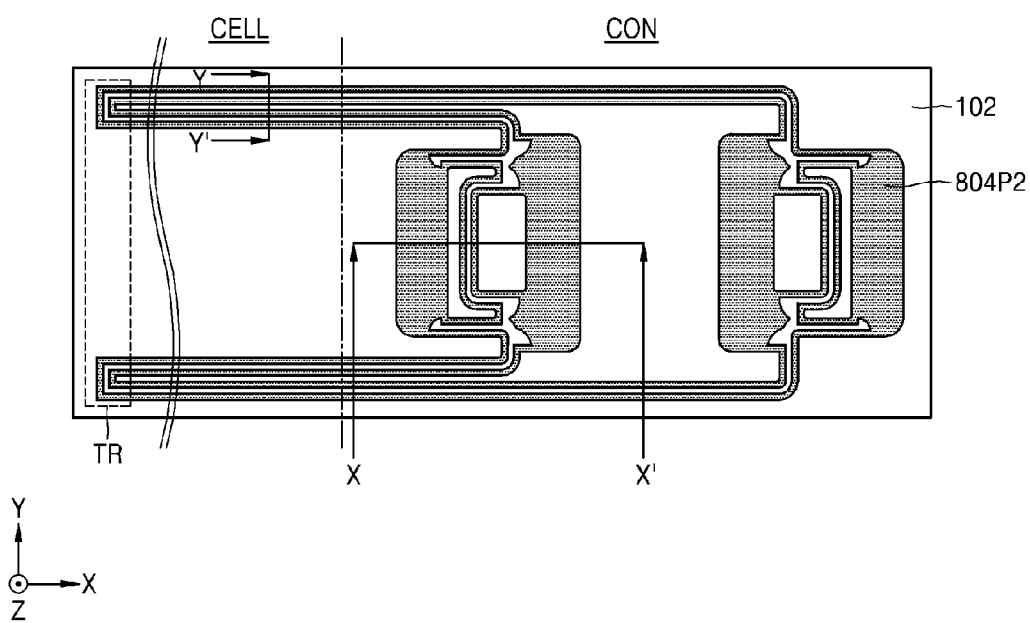
Figure 26B:
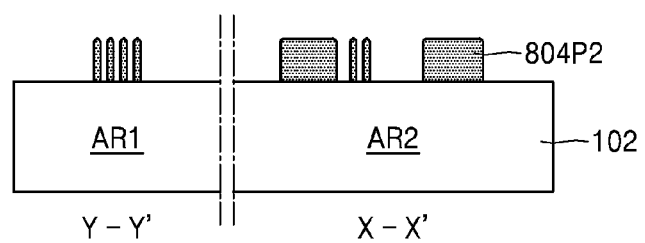

Referring to FIGS. 26A and 26B, the second hard mask pattern 808P is formed by etching the second hard mask layer 808 by using the second structure P2 and the second spacer 840S that remain in a resultant structure of FIGS. 25A and 25B as an etch mask and the first hard mask pattern 806P is formed by etching the first hard mask layer 806 by using the second hard mask pattern 808P as an etch mask, in a manner similar to that described with reference to FIGS. 19A through 20B. Next, a feature pattern 804P2 may be formed by etching the feature layer 804 by using the first hard mask pattern 806P as an etch mask, and the plurality of conductive lines L10 and the plurality of contact pads CP20 of FIG. 5 may be formed by removing unnecessary films remaining on the feature pattern 804P2 and removing some portions of the feature pattern 804P2, for example, portions "TR" of the feature pattern 804P2.

Although methods of manufacturing the integrated circuit device 200 of FIG. 5 have been described with reference to FIGS. 21A through 26B, the inventive concepts are not limited thereto. Various modifications and changes to the description of FIGS. 21A through 26B may be made without departing from the scope of the inventive concepts.

In the method of manufacturing an integrated circuit device of FIGS. 21A through 26B, a plurality of patterns having different widths according to positions may be formed in the first region AR1 having a relatively small pattern width and the second region AR2 having a relatively large pattern width. Accordingly, a plurality of fine patterns that have small widths and are repeatedly formed at small pitches exceeding a resolution limit of a photolithography process may be easily formed to have different widths according to positions. Also, when an integrated circuit device having a structure in which a plurality of contact pads share two conductive lines that are spaced apart from each other is formed, an additional trimming process for separating each contact pad into two in the connection region CON may be omitted. Accordingly, a process of manufacturing an integrated circuit device may be simplified and a sufficient process margin for forming a plurality of fine patterns may be ensured.

Figure 27A:
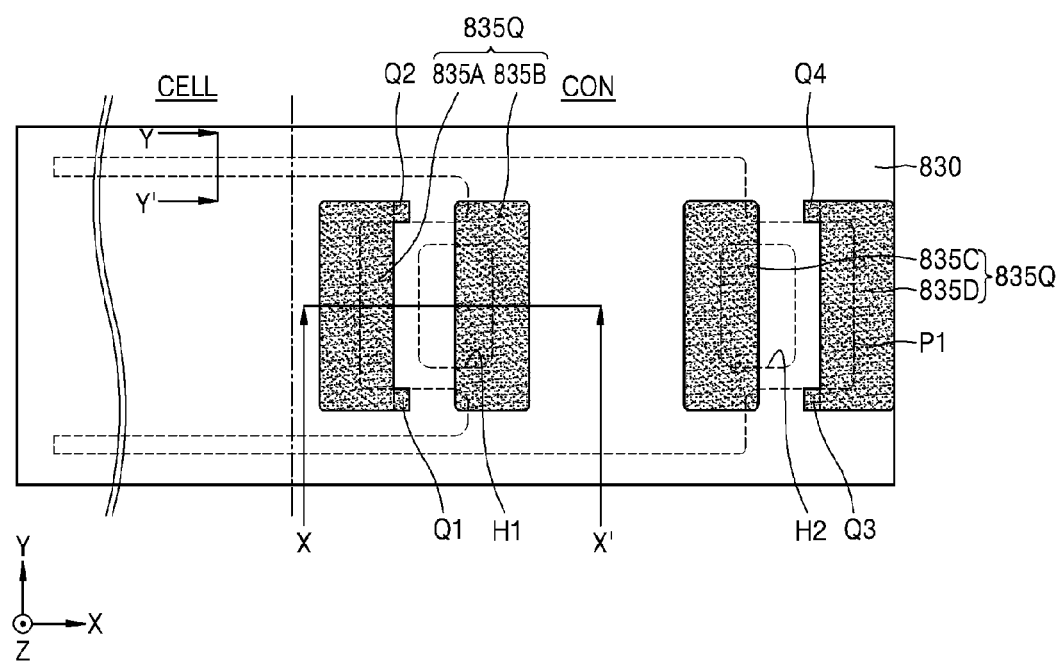
FIGS. 27A through 27C are plan views for explaining methods of manufacturing an integrated circuit device according to embodiments according to an example process order.
Figure 27B:
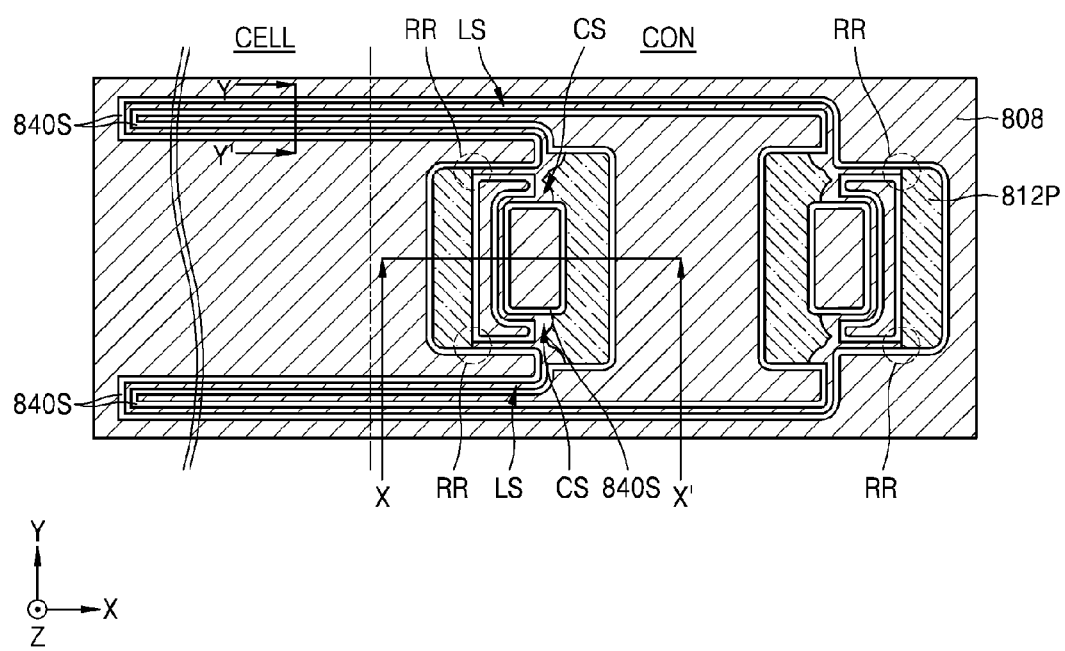
Figure 27C:
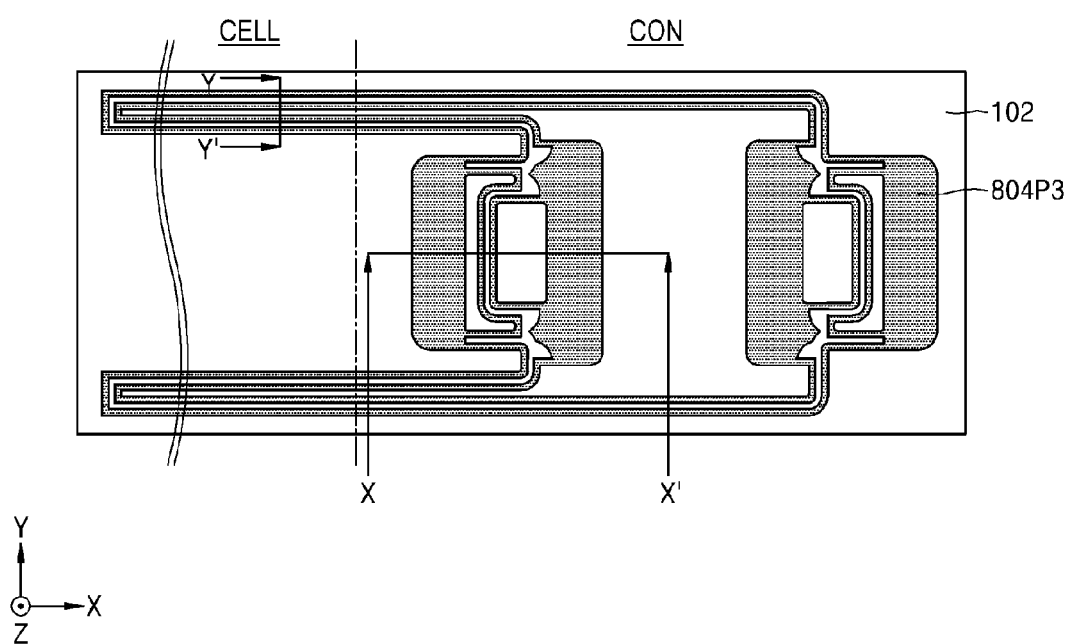

FIGS. 27A through 27C are views for explaining methods of manufacturing an integrated circuit device according to embodiments. FIGS. 27A through 27C are plan views for explaining a modification of the method of manufacturing an integrated circuit device of FIGS. 21A through 26B. In FIGS. 27A through 27C, the same elements as those in FIGS. 1 through 26B are denoted by the same reference numerals, and thus a detailed explanation thereof will not be given.

Referring to FIG. 27A, as described with reference to FIGS. 21A and 21B, a pad defining mask 835Q that covers the first structure P1 is formed on the first spacer layer 830. The pad defining mask 835Q is substantially the same as the pad defining mask 835 of FIGS. 21A and 21B except that the first through fourth pad defining masks 835A, 835B, 835C, and 835D further include recess preventing mask portions Q1, Q2, Q3, and Q4.

Referring to FIG. 27B, only a portion of the second structure P2 that corresponds to the line structure LP2 (see FIGS. 24A and 24B) is selectively removed by performing processes described with reference to FIGS. 22A through 25B While exposed portions of the third hard mask pattern 812P that correspond to the line structure LP2 are removed, from among portions of the third hard mask pattern 812P that have relatively large widths and are covered by the fourth hard mask pattern 814P, a portion of the third hard mask pattern 812P that is adjacent to the line space LS may be removed due to the spread of an etching atmosphere, and thus the communication space CS that enables different line spaces LS that are spaced apart from each other to communicate with each other (by defining an electrically isolating space or cavity without obstructions therebetween) may be formed as described with reference to FIGS. 25A and 25B. However, since the recess preventing mask portions Q1, Q2, Q3, and Q4 are further included in the pad defining mask 835Q, the third hard mask pattern 812P may be prevented from being unnecessarily removed from a portion, for example, a portion "RR" of FIG. 27B, other than a portion needed to form the communication space CS.

Referring to FIG. 27C, a feature pattern 804P3 is formed by using the second structure P2 and the second spacer 840S remaining in a resultant structure of FIG. 27B, in a manner similar to that described with reference to FIGS. 26A and 26B.

According to the method of manufacturing an integrated circuit device of FIGS. 27A through 27C, a hard mask pattern needed to form contact pads may be prevented from being excessively consumed, thereby increasing an effective area of the contact pads formed in the connection region CON.

Figure 28A:
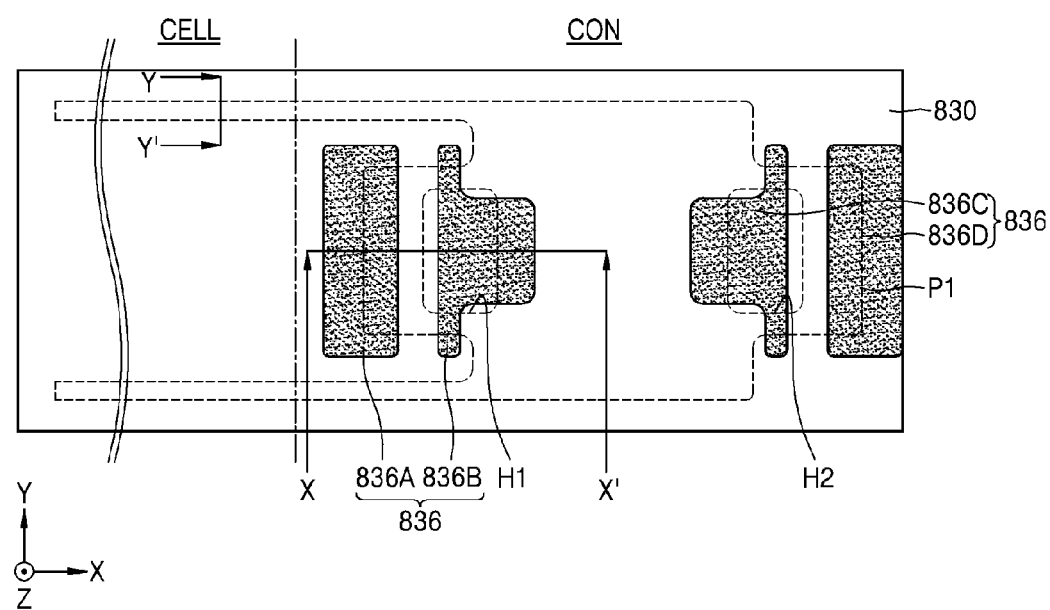
FIGS. 28A through 33B are views for explaining methods of manufacturing an integrated circuit device according to embodiments, FIGS. 28A, 29A, . . . , and 33A being plan views for explaining methods of manufacturing the integrated circuit device of FIG. 6 according to an example process order, FIGS. 28B, 29B, . . . , and 33B being cross-sectional views taken along lines X-X' and Y-Y' of FIGS. 28A, 29A, . . . , and 33A.

FIGS. 28A through 33B are views for explaining methods of manufacturing an integrated circuit device according to embodiments. FIGS. 28A, 29A, . . . , and 33A are plan views for explaining methods of manufacturing the integrated circuit device 300 of FIG. 6 according to an example process order. FIGS. 28B, 29B, . . . , and 33B are cross-sectional views taken along lines X-X' and Y-Y' of FIGS. 28A, 29A, . . . , and 33A. In FIGS. 28A through 33B, the same elements as those in FIGS. 1 through 27B are denoted by the same reference numerals, and thus a detailed explanation thereof will not be given.

Figure 28B:
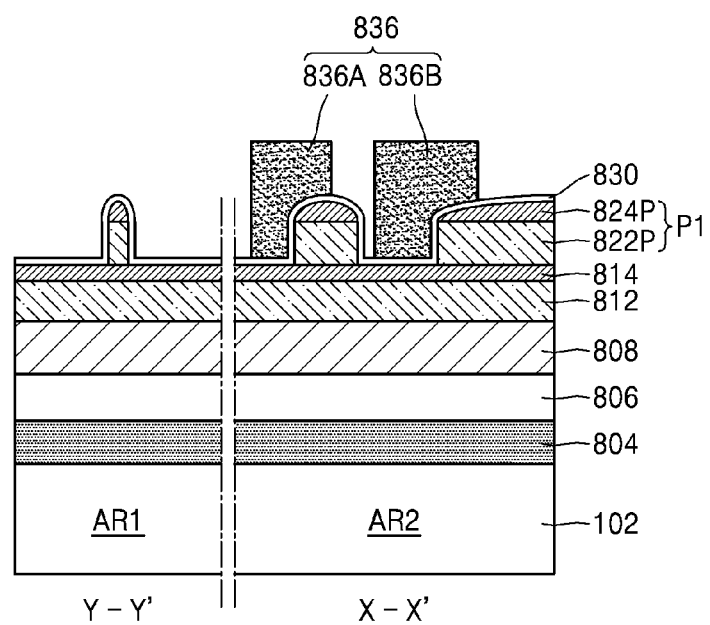

Referring to FIGS. 28A and 28B, the first spacer layer 830 that covers exposed surfaces of the first structure P1 and exposed surfaces of the fourth hard mask layer 814 to a uniform thickness is formed in a manner similar to that described with reference to FIGS. 11A through 13B, and then a pad defining mask 836 that covers the first structure P1 is formed on the first spacer layer 830.

The pad defining mask 836 includes first through fourth pad defining masks 836A, 836B, 836C, and 836D that are spaced apart from one another. The first and fourth pad defining masks 836A and 836D from among the first through fourth pad defining masks 836A, 836B, 836C, and 836D may be formed to cover edge portions of the first structure P1 in the connection region CON and the second and third pad defining masks 836B and 836C may be formed to cover parts of the reference holes H1 and H2 formed in the first structure P1. The second and third pad defining masks 836B and 836C may have planar shapes so that a plurality of portions that are spaced apart from one another about the reference holes H1 and H2 are not covered by the second and third pad defining masks 836B and 836C, unlike the second and third pad defining masks 835B and 835C of FIG. 21A. For example, as shown in FIG. 28A, the second and third pad defining masks 836B and 836C may have planar shapes including a plurality of protrusions. In some embodiments, the pad defining mask 836 may include a photoresist pattern.

Figure 29A:
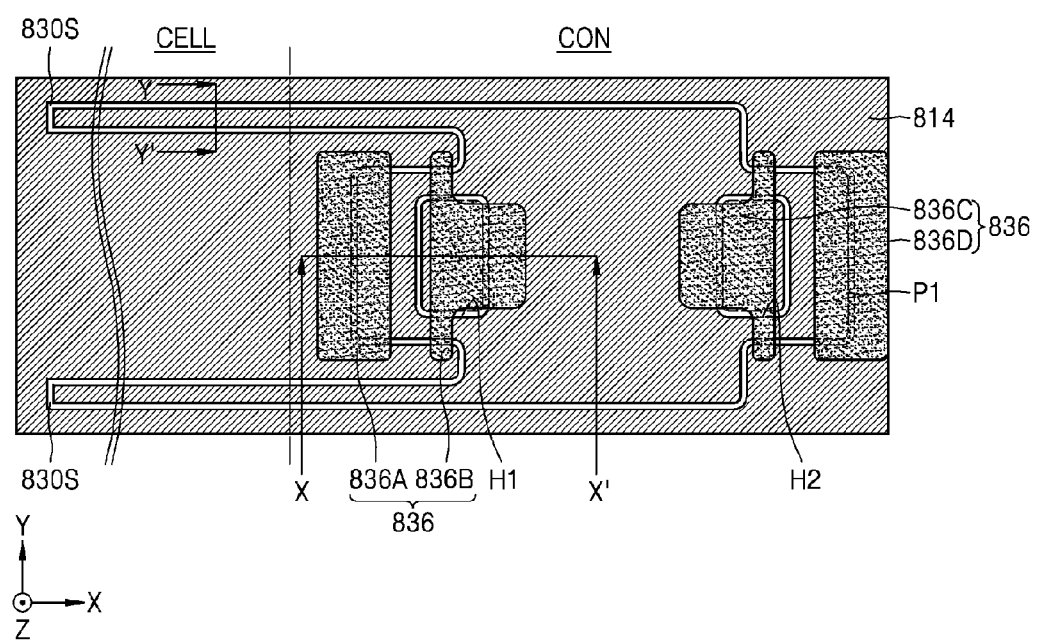
Figure 29B:
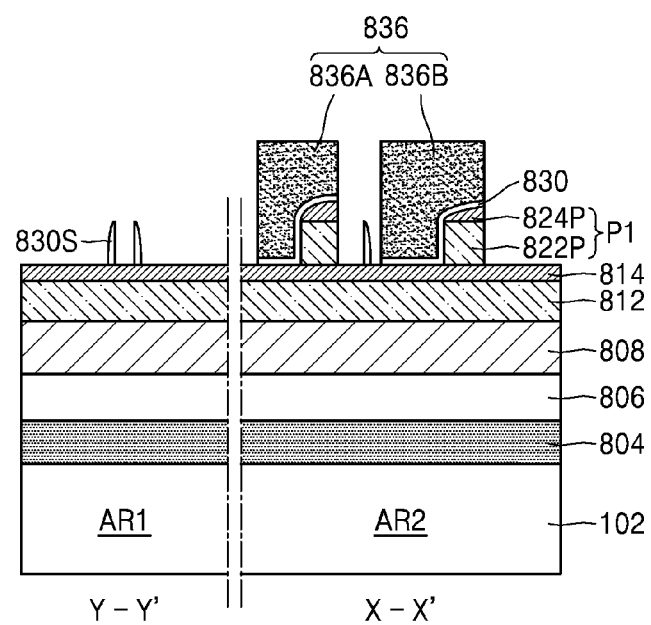

Referring to FIGS. 29A and 29B, the first spacer 830S is formed by performing etch-back on a part of the first spacer layer 830 that is exposed around the pad defining mask 836 by using the pad defining mask 836 as an etch mask and the fourth hard mask layer 814 is exposed around the first spacer 830S and the pad defining mask 836 by removing portions of the first structure P1 that are exposed around the pad defining mask 836, in a manner similar to that described with reference to FIGS. 15A and 15B.

Figure 30A:
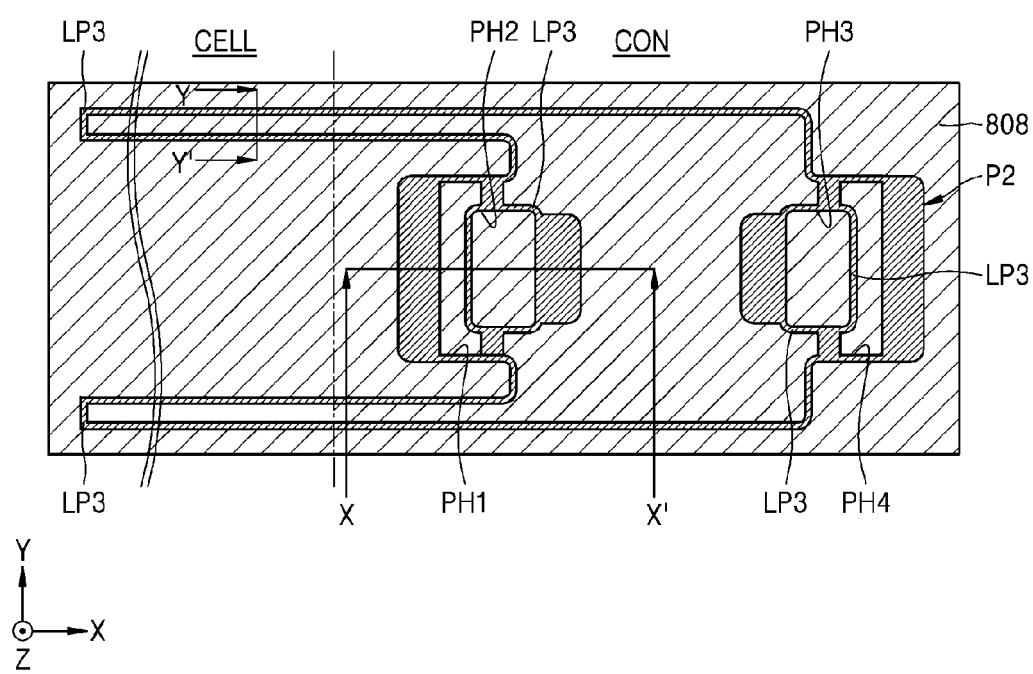
Figure 30B:
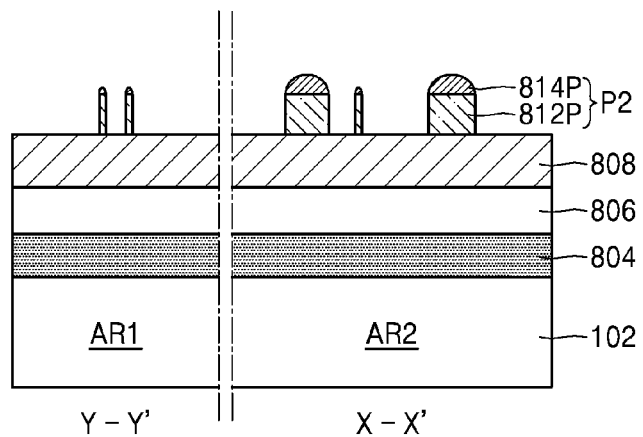

Referring to FIGS. 30A and 30B, the second structure P2 including the third hard mask pattern 812P and the fourth hard mask pattern 814P is formed by removing the pad defining mask 836 from a resultant structure of FIGS. 29A and 29B and sequentially etching the fourth hard mask layer 814 and the third hard mask layer 812 by using the first spacer 830S, a remaining portion of the first spacer layer 830, and a remaining portion of the first structure P1 as an etch mask, in a manner similar to that described with reference to FIGS. 16A and 16B.

The first through fourth pad holes PH1, PH2, PH3, and PH4 may be formed in the second structure P2. Also, the second structure P2 includes a line structure LP3 having a shape corresponding to that of the first spacer 830S of FIG. 22A.

Figure 31A:
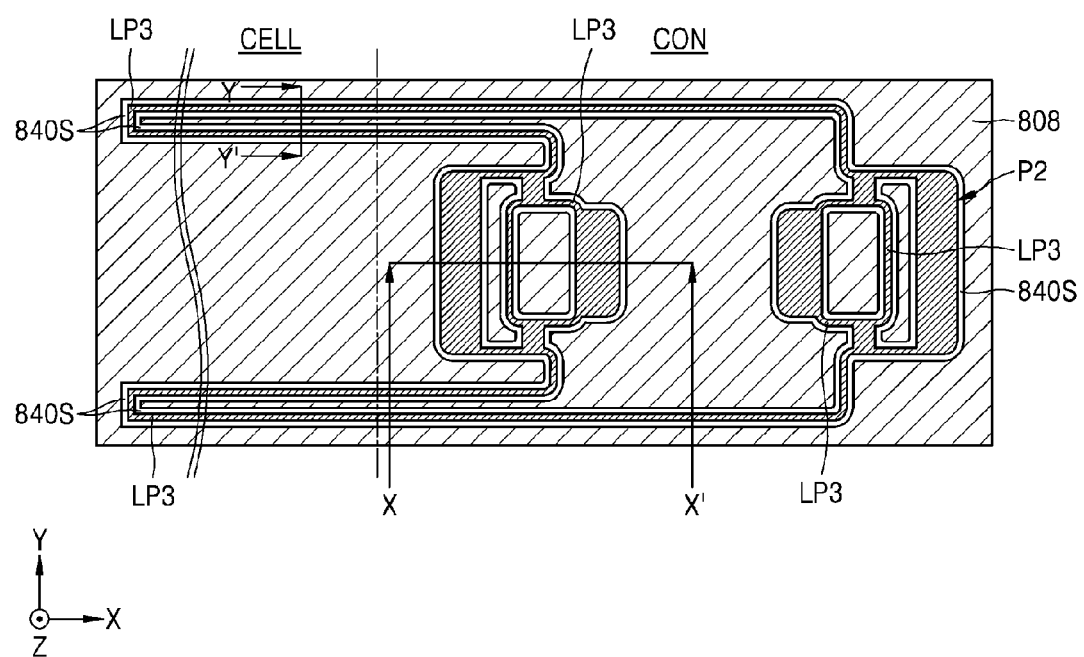
Figure 31B:
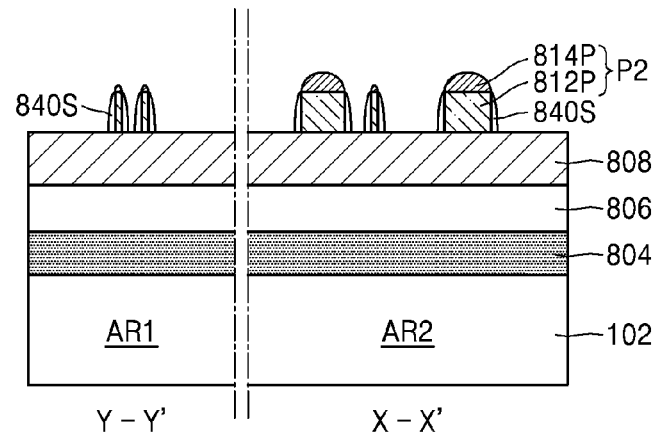

Referring to FIGS. 31A and 31B, the second spacer 840S that covers side walls of the second structure P2 is formed by forming a second spacer layer that covers exposed surfaces of the second structure P2 and the second hard mask layer 808 to a uniform thickness and then performing etch-back on the second spacer layer, in a manner similar to that described with reference to FIGS. 17A and 17B.

Figure 32A:
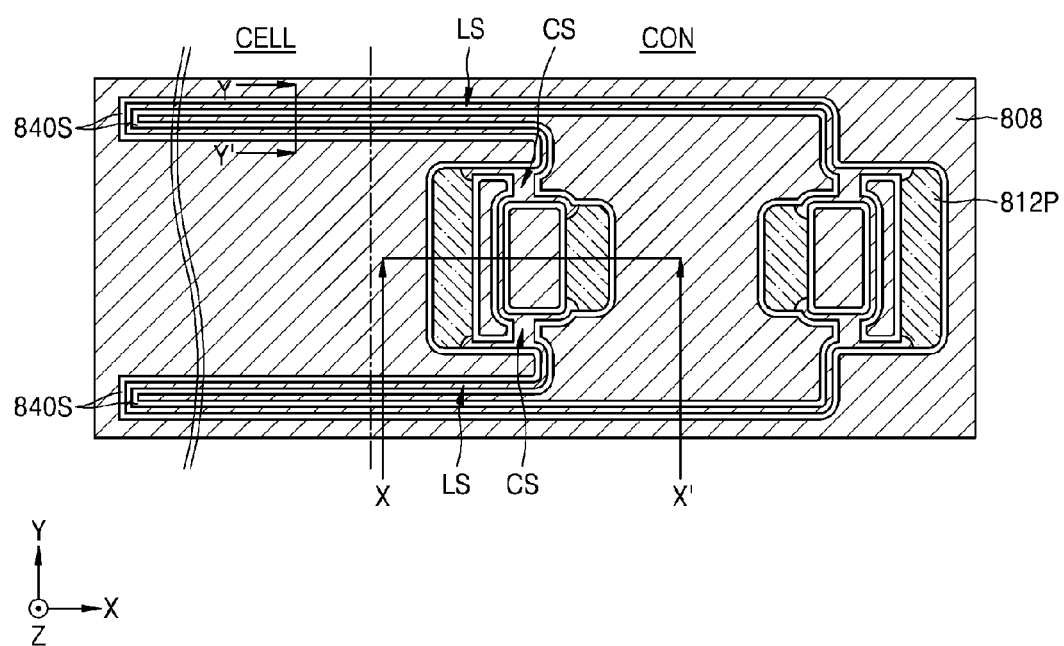
Figure 32B:
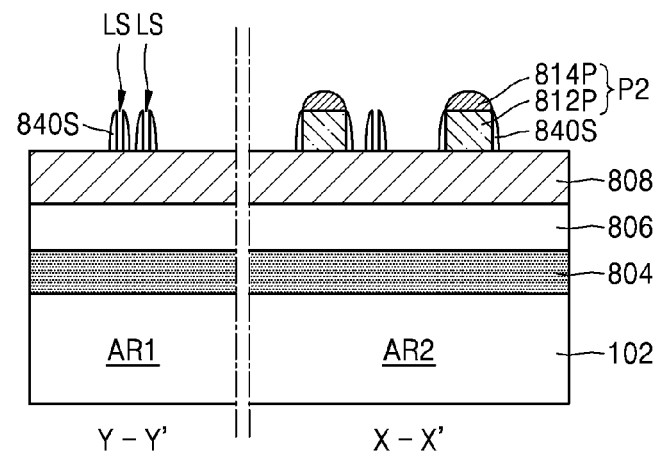

Referring to FIGS. 32A and 32B, only a portion of the second structure P2 that corresponds to the line structure LP3 (see FIGS. 31A and 31B) is selectively removed, in a manner similar to that described with reference to FIGS. 18A and 18B. For convenience of explanation, the fourth hard mask pattern 814P that covers the third hard mask pattern 812P is not shown in FIG. 32A.

In order to selectively remove only the portion of the second structure P2 that corresponds to the line structure LP3, a difference thickness of the fourth hard mask pattern 814P of the second structure P2 may be used. As a result, the third hard mask pattern 812P may be exposed on the portion of the second structure P2 that corresponds to the line structure LP3. Next, the line space LS defined by the second spacer 840S may remain by removing exposed portions of the third hard mask pattern 812P that correspond to the line structure LP3. In some embodiments, an isotropic dry etching process may be used to remove the exposed portions of the third hard mask pattern 812P that correspond to the line structure LP3.

While the exposed portions of the third hard mask pattern 812P that correspond to the line structure LP3 are removed, from among portions of the third hard mask pattern 812P that have relatively large widths and are covered by the fourth hard mask pattern 814P, a portion of the third hard mask pattern 812P that is adjacent to the line space LS may be removed due to the spread of an etching atmosphere, and thus the communication space CS that enables different line spaces LS that are spaced apart from each other to communicate with each other (by defining an electrically isolating space or cavity without obstructions therebetween) may be formed.

Figure 33A:
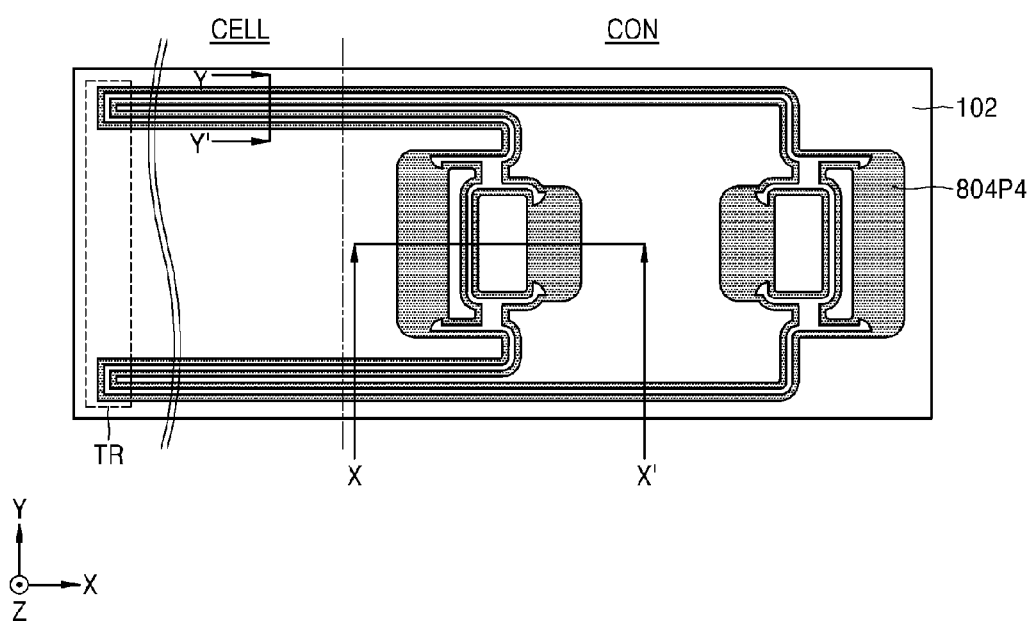
Figure 33B:
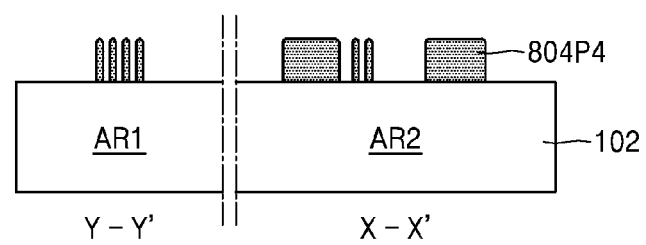

Referring to FIGS. 33A and 33B, the second hard mask pattern 808P is formed by etching the second hard mask layer 808 by using the second structure P2 and the second spacer 840S that remain in a resultant structure of FIGS. 32A and 32B as an etch mask and the first hard mask pattern 806P is formed by etching the first hard mask layer 806 by using the second hard mask pattern 808P as an etch mask, in a manner similar to that described with reference to FIGS. 19A through 20B. Next, a feature pattern 804P4 may be formed by etching the feature layer 804 by using the first hard mask pattern 806P as an etch mask, and the plurality of conductive lines L10 and the plurality of contact pads CP30 of FIG. 6 may be formed by removing unnecessary films remaining on the feature pattern 804P4 and removing some portions of the feature pattern 804P4, for example, portions "TR" of the feature pattern 804P4.

Although methods of manufacturing the integrated circuit device 300 of FIG. 6 have been described with reference to FIGS. 28A through 33B, the inventive concepts are not limited thereto. Various modifications and changes to the description of FIGS. 28A through 33B may be made without departing from the scope of the inventive concepts.

In the method of manufacturing an integrated circuit device of FIGS. 28A through 33B, when an integrated circuit device having a structure in which a plurality of contact pads share two conductive lines that are spaced apart from each other is formed, an additional trimming process for separating each contact pad into two in the connection region CON may be omitted. Accordingly, a process of manufacturing an integrated circuit device may be simplified and a sufficient process margin for forming a plurality of fine patterns may be ensured.

Figure 34:
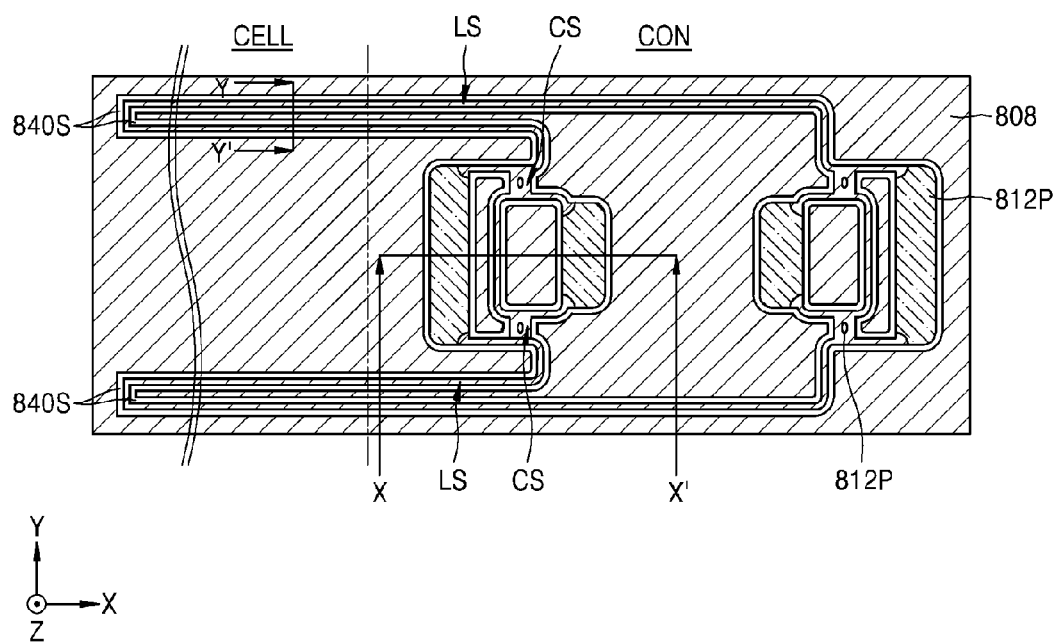
FIG. 34 is a plan view for explaining methods of manufacturing an integrated circuit device according to embodiments.

FIG. 34 is a plan view for explaining methods of manufacturing an integrated circuit device according to embodiments. Methods of manufacturing the integrated circuit device 300A of FIG. 7 will be explained with reference to FIG. 34. In FIG. 34, the same elements as those in FIGS. 1 through 33B are denoted by the same reference numerals, and thus a detailed explanation thereof will not be given.

Substantially the same method as that described with reference to FIGS. 28A through 33B may be used to manufacture the integrated circuit device 300A of FIG. 7. However, in a process of forming the communication space CS by removing a portion from among portions of the third hard mask pattern 812P that have relatively large widths while exposed portions of the third hard mask pattern 812P that correspond to the line structure LP3 are removed described with reference to FIGS. 32A and 32B, a part of the third hard mask pattern 812P may remain in an island shape in the communication space CS as shown in FIG. 34 by adjusting a removal amount of the third hard mask pattern 812P in the communication space CS.

Next, the integrated circuit device 300A further including the dummy pattern DP having an island shape as shown in FIG. 7 may be manufactured by performing methods described with reference to FIGS. 33A and 33B.

Figure 35A:
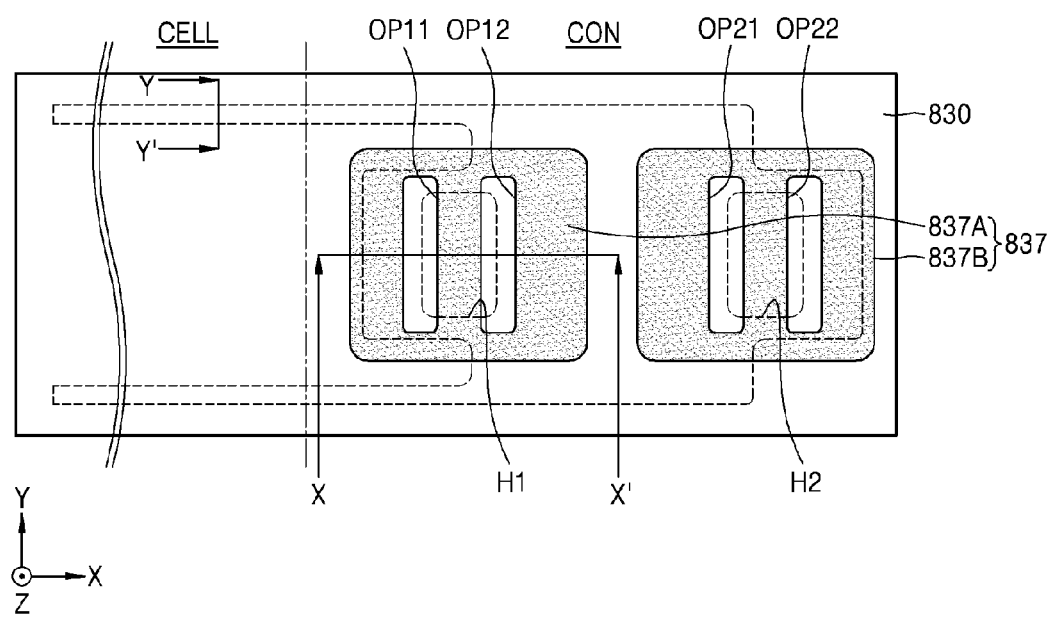
FIGS. 35A through 40B are views for explaining methods of manufacturing an integrated circuit device according to embodiments, FIGS. 35A, 36A, . . . , and 40A being plan views for explaining methods of manufacturing the integrated circuit device of FIG. 8 according to an example process order, FIGS. 35B, 36B, . . . , and 40B being cross-sectional views taken along lines X-X' and Y-Y' of FIGS. 35A, 36A, . . . , and 40A.

FIGS. 35A through 40B are views for explaining methods of manufacturing an integrated circuit device according to embodiments. FIGS. 35A, 36A, ..., and 40A are plan views for explaining methods of manufacturing the integrated circuit device 400 of FIG. 8. FIGS. 35B, 36B, ..., and 40B are cross-sectional views taken along lines X-X' and Y-Y' of FIGS. 35A, 36A, ..., and 40A. In FIGS. 35A through 40B, the same elements as those in FIGS. 1 through 34 are denoted by the same reference numerals, and thus a detailed explanation thereof will not be given.

Figure 35B:
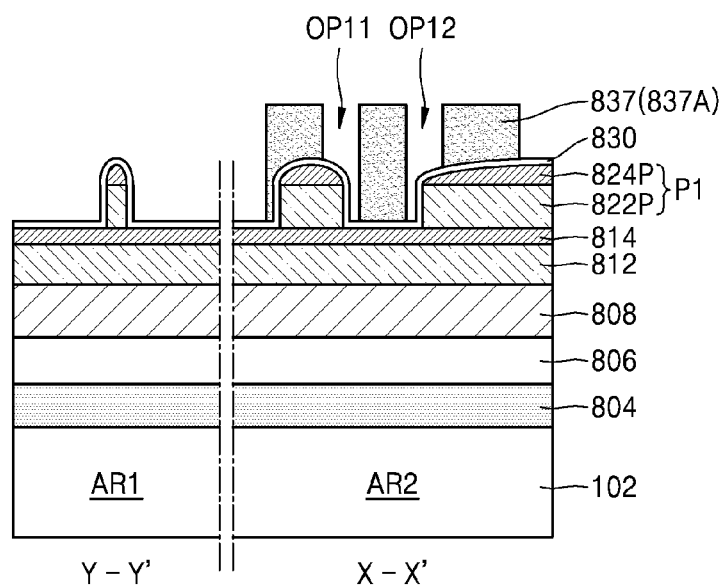

Referring to FIGS. 35A and 35B, the first spacer layer 830 that covers exposed surfaces of the first structure P1 and exposed surfaces of the fourth hard mask layer 814 to a uniform thickness is formed in a manner similar to that described with reference to FIGS. 11A through 13B, and then a pad defining mask 837 that covers the first structure P1 is formed on the first spacer layer 830.

The pad defining mask 837 is substantially the same as the pad defining mask 834 of FIGS. 14A and 14B. The pad defining mask 837 includes a first pad defining mask 837A that covers a part of one reference hole H1 from among the two reference holes H1 and H2 formed in the first structure P1 and a second pad defining mask 837B that covers a part of the other reference hole H2 from among the two reference holes H1 and H2. The first pad defining mask 837A and the second pad defining mask 837B may be separated from each other. However, unlike the pad defining mask 834 of FIGS. 14A and 14B, two first openings OP11 and OP12 that perpendicularly overlap a part of the reference hole H1 are formed in the first pad defining mask 837A of the pad defining mask 837 and two second openings OP21 and OP22 that perpendicularly overlap a part of the reference hole H2 are formed in the second pad defining mask 837B. In some embodiments, the pad defining mask 837 may include a photoresist pattern.

Figure 36A:
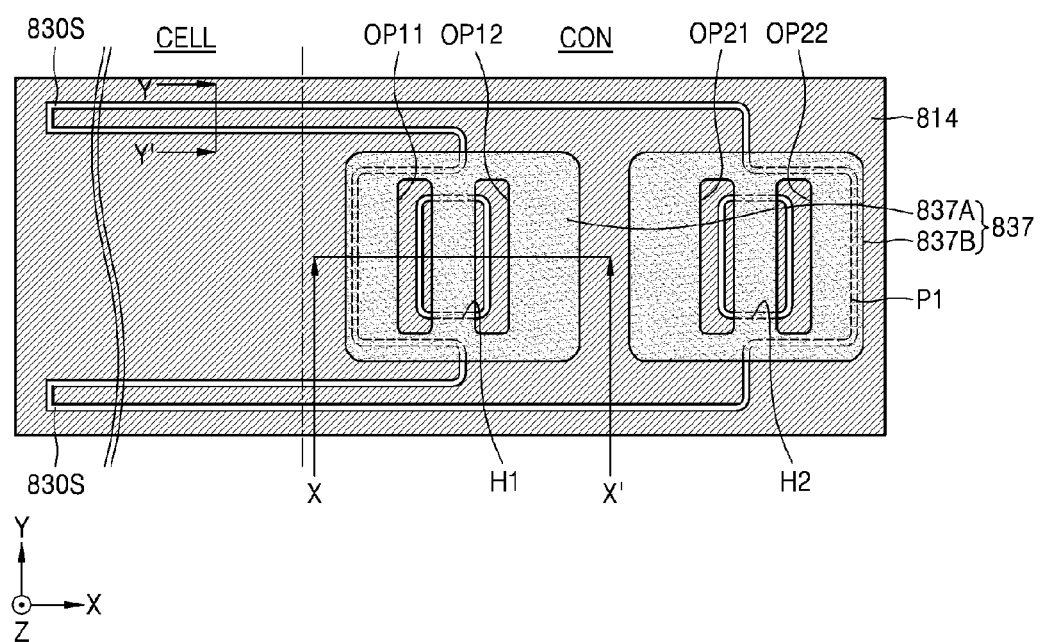
Figure 36B:
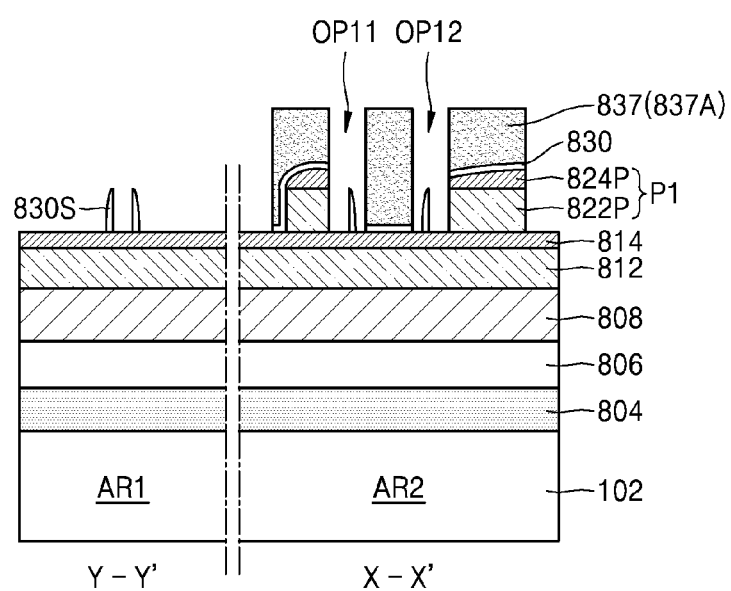

Referring to FIGS. 36A and 36B, the first spacer 830S is formed by performing etch-back on a part of the first spacer layer 830 that is exposed around the pad defining mask 837 by using the pad defining mask 837 as an etch mask and the fourth hard mask layer 814 is exposed around the first spacer 830S and the pad defining mask 837 by removing portions of the first structure P1 that are exposed around the pad defining mask 837, in a manner similar to that described with reference to FIGS. 15A and 15B.

A part of the first spacer 830S may be exposed through the two first openings OP11 and OP12 formed in the first pad defining mask 837A and the two second openings OP21 and OP22 formed in the second pad defining mask 837B.

Figure 37A:
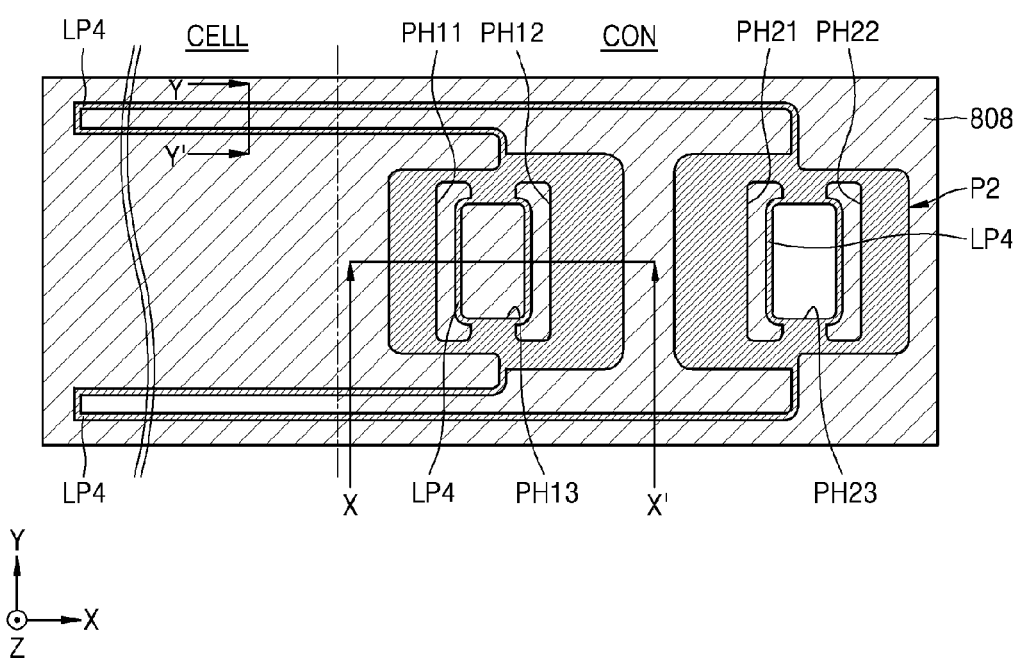
Figure 37B:
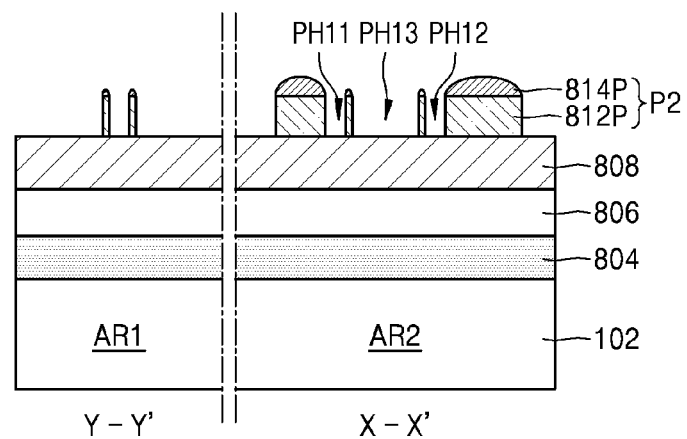

Referring to FIGS. 37A and 37B, the second structure P2 including the third hard mask pattern 812P and the fourth hard mask pattern 814P is formed by removing the pad defining mask 837 from a resultant structure of FIGS. 36A and 36B and sequentially etching the fourth hard mask layer 814 and the third hard mask layer 812 by using the first spacer 830S, a remaining portion of the first spacer layer 830, and a remaining portion of the first structure P1 as an etch mask, in a manner similar to that described with reference to FIGS. 16A and 16B.

Three pad holes, that is, a first pad hole PH11, a second pad hole PH12, and a third pad hole PH13, are formed in the second structure P2 to correspond to the reference hole H1 of the first structure P1 of FIG. 36A. Also, three pad holes, that is, a fourth pad hole PH21, a fifth pad hole PH22, and a sixth pad hole PH23, are formed in the second structure P2 to correspond to the reference hole H2 of the first structure P1. The second structure P2 includes a line structure LP4 having a shape corresponding to that of the first spacer 830S of FIG. 36A.

The third pad hole PH13 is formed between the first pad hole PH11 and the second pad hole PH12, and the line structure LP4 having a shape corresponding to that of the first spacer 830S of FIG. 36A is disposed between the first pad hole PH11 and the third pad hole PH13 and between the second pad hole PH12 and the third pad hole PH13.

The sixth pad hole PH23 is formed between the fourth pad hole PH21 and the fifth pad hole PH22, and the line structure LP4 having a shape corresponding to that of the first spacer 830S of FIG. 36A is disposed between the fourth pad hole PH21 and the sixth pad hole PH23 and between the fifth pad hole PH22 and the sixth pad hole PH23.

Figure 38A:
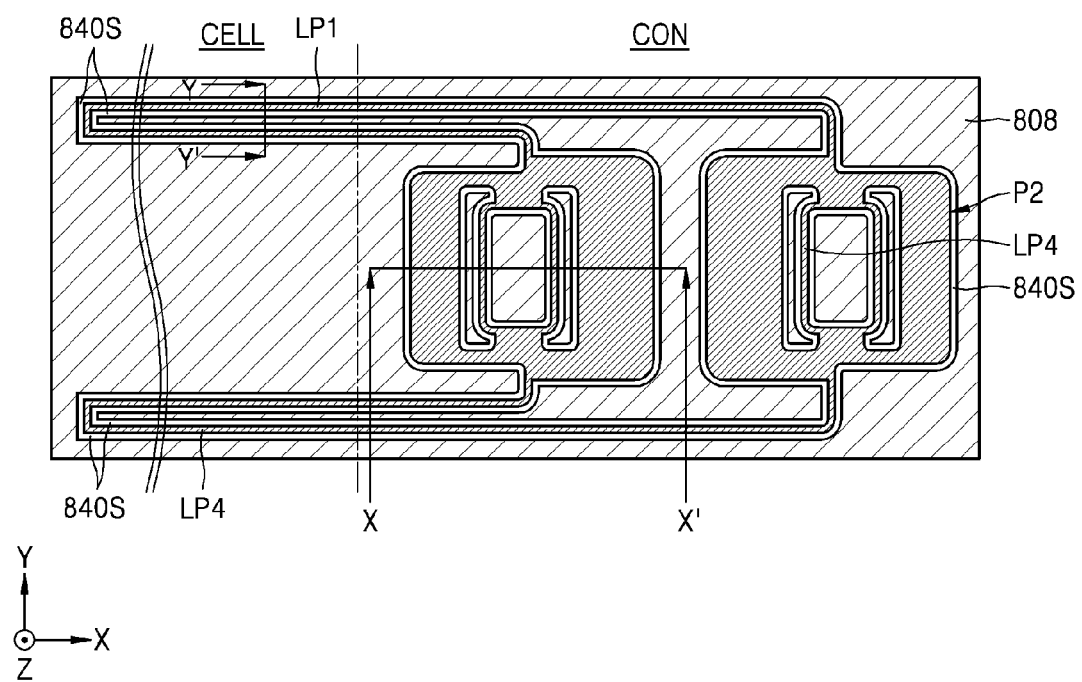
Figure 38B:
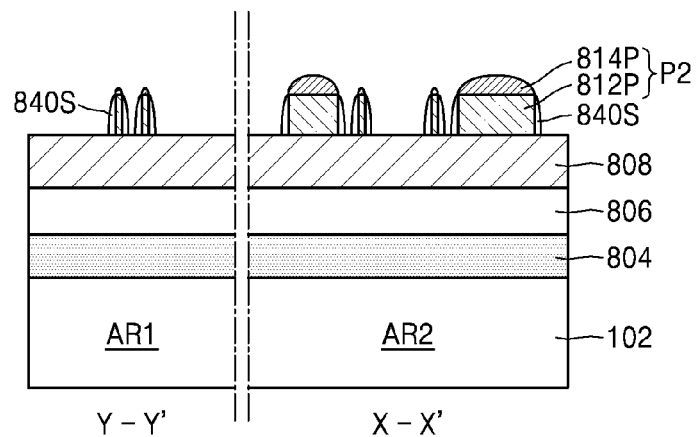

Referring to FIGS. 38A and 38B, the second spacer 840S that covers side walls of the second structure P2 is formed by forming a second spacer layer that covers exposed surfaces of the second structure P2 and the second hard mask layer 808 to a uniform thickness and then performing etch-back on the second spacer layer, in a manner similar to that described with reference to FIGS. 17A and 17B.

Figure 39A:
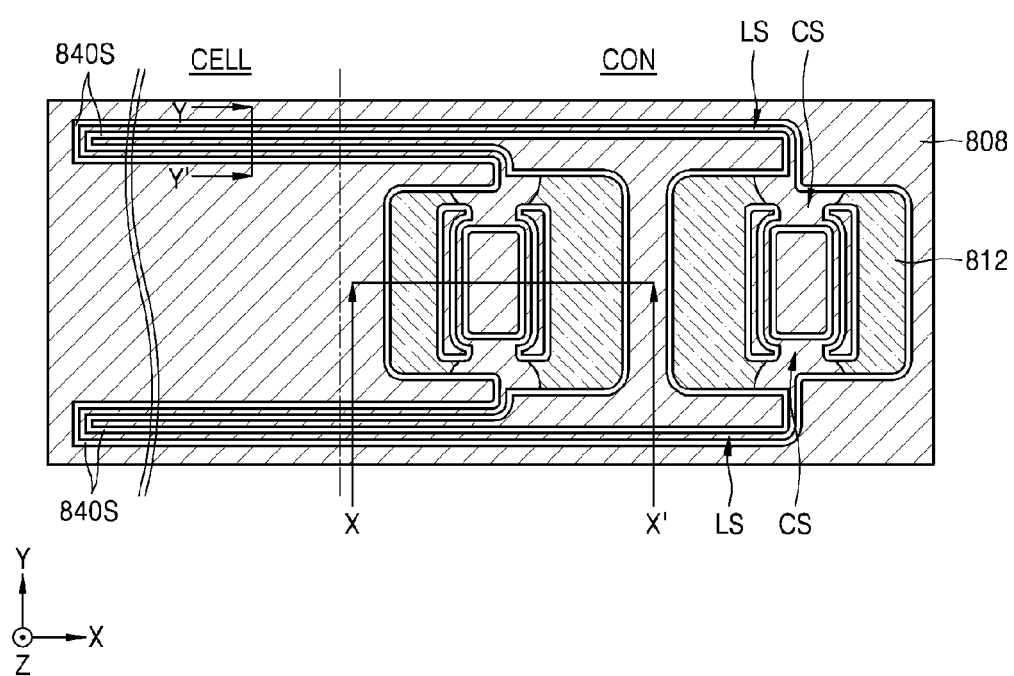
Figure 39B:
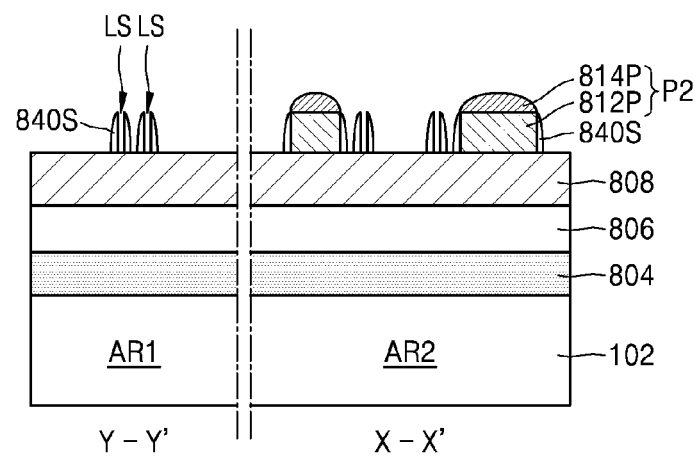

Referring to FIGS. 39A and 39B, only a portion of the second structure P2 that corresponds to the line structure LP4 (see FIGS. 38A and 38B) is selectively removed, in a manner similar to that described with reference to FIGS. 18A and 18B. For convenience of explanation, the fourth hard mask pattern 814P that covers the third hard mask pattern 812P is not shown in FIG. 39A.

In order to selectively remove only the portion of the second structure P2 that corresponds to the line structure LP4, a thickness difference of the fourth hard mask pattern 814P of the second structure P2 may be used. That is, the fourth hard mask pattern 814P may be removed by a predetermined thickness so that the third hard mask pattern 812P is covered by portions other than a portion of the fourth hard mask pattern 814P that corresponds to the line structure LP4 and the third hard mask pattern 812P is exposed on the portion of the fourth hard mask pattern 814P that corresponds to the line structure LP4. As a result, the third hard mask pattern 812P may be exposed on the portion of the second structure P2 that corresponds to the line structure LP4. Next, the line space LS defined by the second spacer 840S may remain by removing exposed portions of the third hard mask pattern 812P that correspond to the line structure LP4. In some embodiments, an isotropic dry etching process may be used to remove the exposed portions of the third hard mask pattern 812P that correspond to the line structure LP4.

While the exposed portions of the third hard mask pattern 812P that correspond to the line structure LP4 are removed, from among portions of the third hard mask pattern 812P that have relatively large widths and are covered by the fourth hard mask pattern 814P, a portion of the third hard mask pattern 812P that is adjacent to the line space LS may be removed due to the spread of an etching atmosphere, and thus the communication space CS that enables different line spaces LS that are spaced apart from each other to communicate with each other (by defining an electrically isolating space or cavity without obstructions therebetween) may be formed.

Figure 40A:
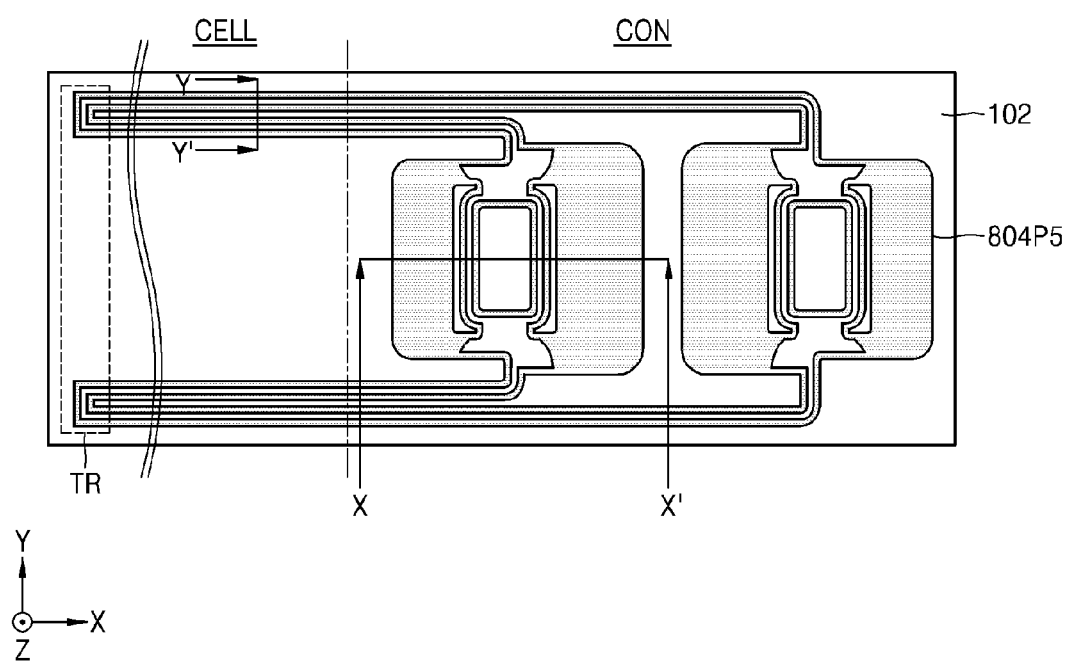
Figure 40B:
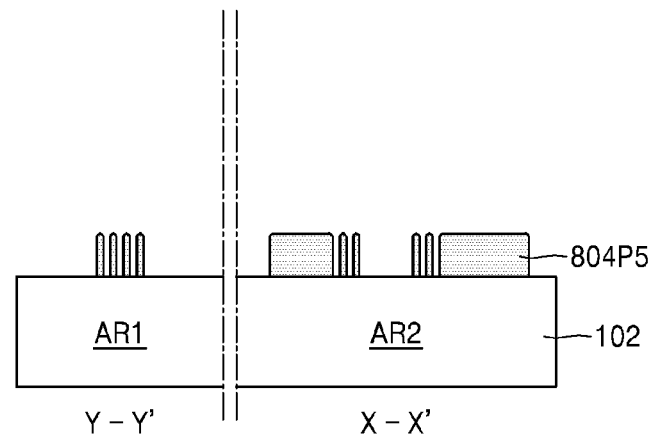

Referring to FIGS. 40A and 40B, the second hard mask pattern 808P is formed by etching the second hard mask layer 808 by using the second structure P2 and the second spacer 840S remaining in a resultant structure of FIGS. 39A and 39B as an etch mask and the first hard mask pattern 806P is formed by etching the first hard mask layer 806 by using the second hard mask pattern 808P as an etch mask, in a manner similar to that described with reference to FIGS. 19A through 20B. Next, a feature pattern 804P5 may be formed by etching the feature layer 804 by using the first hard mask pattern 806P as an etch mask, and the plurality of conductive lines L10, the plurality of contact pads CP40, the first dummy pad DP1, and the second dummy pad DP2 of FIG. 8 may be formed by removing unnecessary films remaining on the feature pattern 804P5 and removing some portions of the feature pattern 804P5, for example, portions "TR" of the feature pattern 804P5.

Although methods of manufacturing the integrated circuit device 400 of FIG. 8 have been described with reference to FIGS. 35A through 40B, the inventive concepts are not limited thereto. Various modifications and changes to the description of FIGS. 35A through 40B may be made without departing from the scope of the inventive concepts.

According to the method of manufacturing an integrated circuit device of FIGS. 35A through 40B, when an integrated circuit device having a structure in which a plurality of contact pads share two conductive lines that are spaced apart from each other is formed, an additional trimming process for separating each contact pad into two in the connection region CON may be omitted. Accordingly, a process of manufacturing an integrated circuit device may be simplified and a sufficient process margin for forming a plurality of fine patterns may be ensured.

Figure 41A:
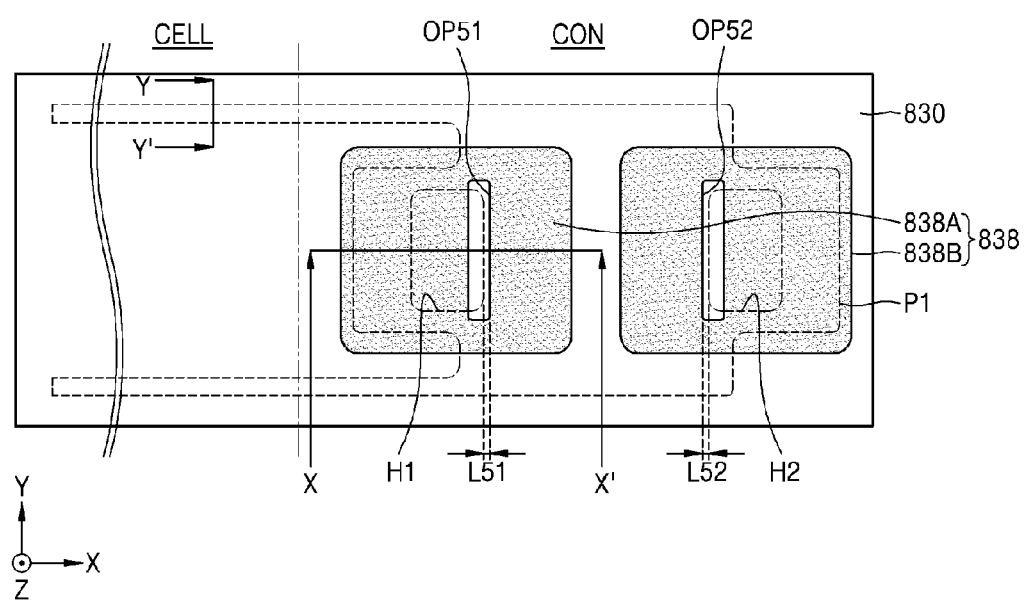
FIGS. 41A through 46B are views for explaining methods of manufacturing an integrated circuit device according to embodiments, FIGS. 41A, 42A, . . . , and 46A being plan views for explaining methods of manufacturing the integrated circuit device of FIG. 9 according to an example process order, FIGS. 41B, 42B, and 46B being cross-sectional views taken along lines X-X' and Y-Y' of FIGS. 41A, 42A, . . . , and 46A.

FIGS. 41A through 46B are views for explaining methods of manufacturing an integrated circuit device according to embodiments. FIGS. 41A, 42A, . . . , and 46A are plan views for explaining methods of manufacturing the integrated circuit device 500 of FIG. 9 according to an example process order. FIGS. 41B, 42B, . . . , and 46B are cross-sectional view taken along lines X-X' and Y-Y' of FIGS. 41A, 42A, . . . , and 46A. In FIGS. 41A through 46B, the same elements as those in FIGS. 1 through 40B are denoted by the same reference numerals, and thus a detailed explanation thereof will not be given.

Figure 41B:
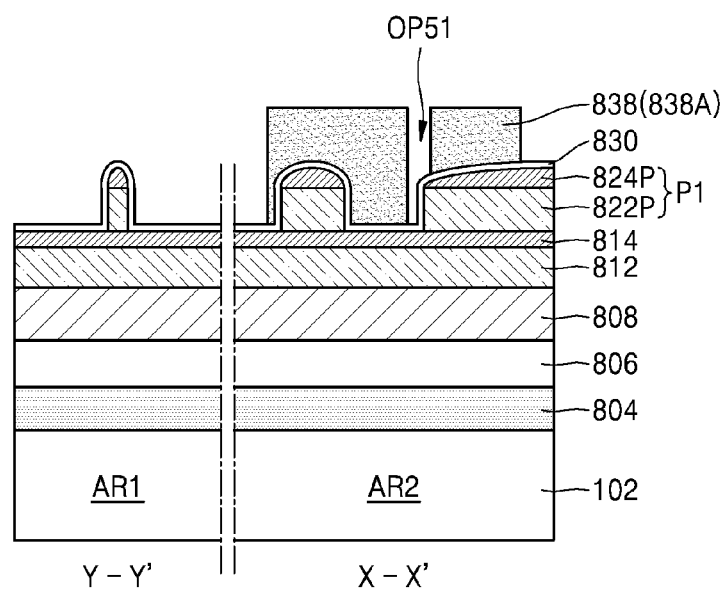

Referring to FIGS. 41A and 41B, the first spacer layer 830 that covers exposed surfaces of the first structure P1 and exposed surfaces of the fourth hard mask layer 814 to a uniform thickness is formed in the same manner as that described with reference to FIGS. 11A through 13B, and then a pad defining mask 838 that covers the first structure P1 is formed on the first spacer layer 830.

The pad defining mask 838 is substantially the same as the pad defining mask 834 of FIGS. 14A and 14B. However, widths of a first opening OP51 and a second opening OP52 of the pad defining mask 838 in the first direction (e.g., the X direction) are less than widths of the first opening OP1 and the second opening OP2 formed in the pad defining mask 834 of FIGS. 14A and 14B.

In detail, the pad defining mask 838 includes a first pad defining mask 838A that covers a part of one reference hole H1 from among the two reference, holes H1 and H2 formed in the first structure P1 and a second pad defining mask 838B that covers a part of the other reference hole H2 from among the two reference holes H1 and H2. The first opening OP51 that perpendicularly overlaps a part of the reference hole H1 is formed in the first pad defining mask 838A and the second opening OP52 that perpendicularly overlaps a part of the reference hole H2 is formed in the second pad defining mask 838B.

In some embodiments, referring to the plan view of FIG. 41A, each of a minimum distance L51 between an inner wall of the reference hole H1 and an inner wall of the first opening OP51 and a minimum distance L52 between an inner wall of the reference hole H2 and an inner wall of the second opening OP52 may be less than 2 F.

Figure 42A:
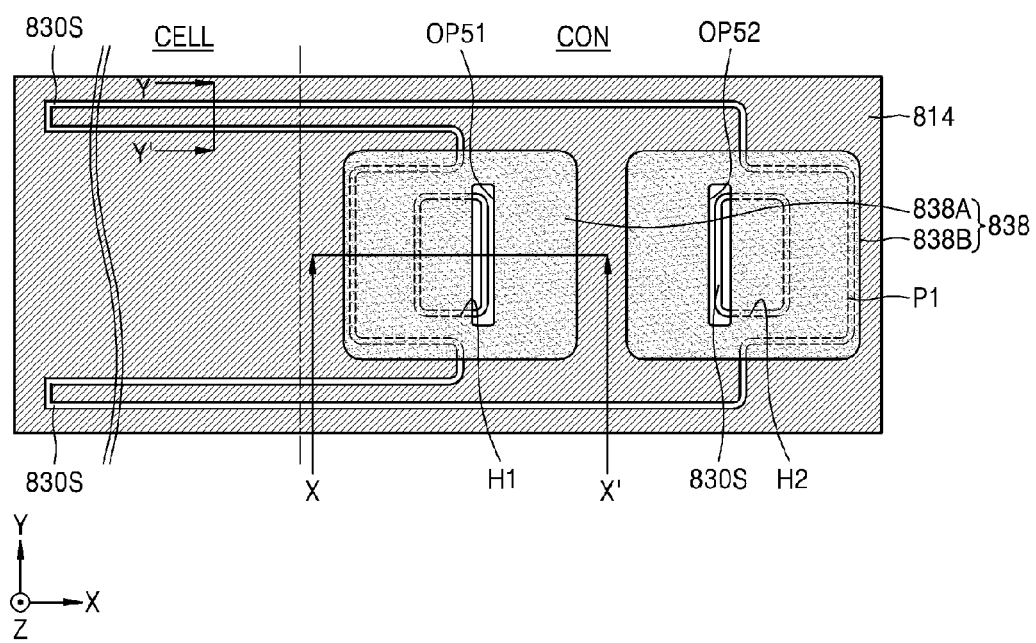
Figure 42B:
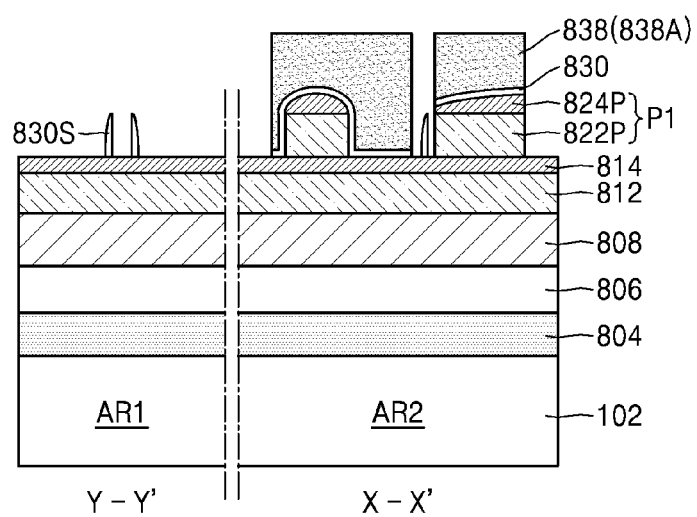

Referring to FIGS. 42A and 42B, the first spacer 830S is formed by performing etch-back on the first spacer layer 830 that is exposed around the pad defining mask 838 by using the pad defining mask 838 as an etch mask and the fourth hard mask layer 814 is exposed around the first spacer 830S and the pad defining mask 838 by removing portions of the first structure P1 that are exposed around the pad defining mask 838.

A part of the first spacer 830S may be exposed through the first opening OP51 formed in the first pad defining mask 838A and the second opening OP52 formed in the second defining mask 838B.

Figure 43A:
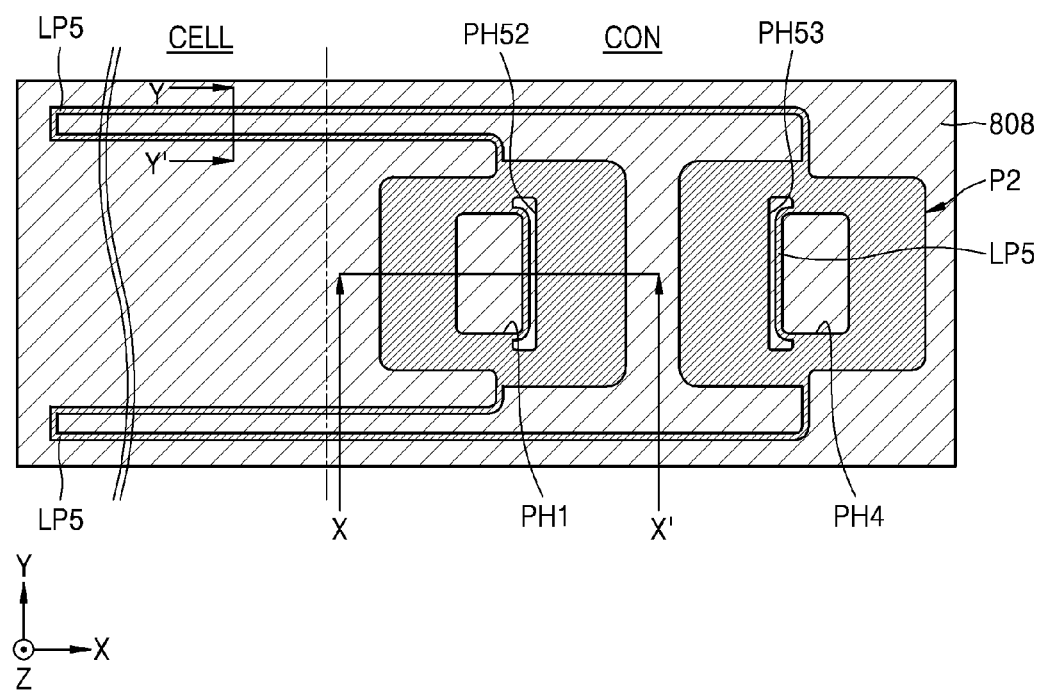
Figure 43B:
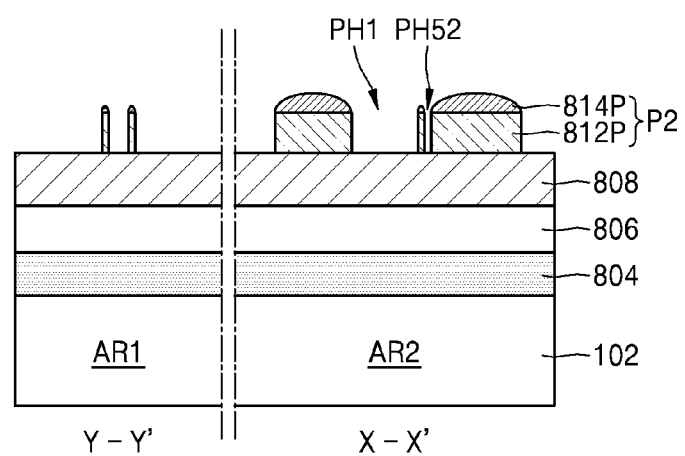

Referring to FIGS. 43A and 43B, the second structure P2 including the third hard mask pattern 812P and the fourth hard mask pattern 814P is formed by removing the first pad defining mask 838A and the second pad defining mask 838B from a resultant structure of FIGS. 42A and 42B and then sequentially etching the fourth hard mask layer 814 and the third hard mask layer 812 by using the first spacer 830S, a remaining portion of the first spacer layer 830, and a remaining portion of the first structure P1 as an etch mask.

A first pad hole PH1, a second pad hole PH52, a third pad hole PH53, and a fourth pad hole PH4 are formed in the second structure P2 to respectively correspond to the reference hole H1 of the first structure P1 of FIG. 42A, the first opening OP51 of the first pad defining mask 838A, the second opening OP52 of the second pad defining mask 838B, and the reference hole H2 of the first structure P1. Also, the second structure P2 includes a line structure LP5 having a shape corresponding to that of the first spacer 830S of FIG. 42A. The second pad hole PH52 and the third pad hole PH53 may have smaller widths than those of the second pd hole PH2 and the third pad hole PH3 of FIG. 16A.

Figure 44A:
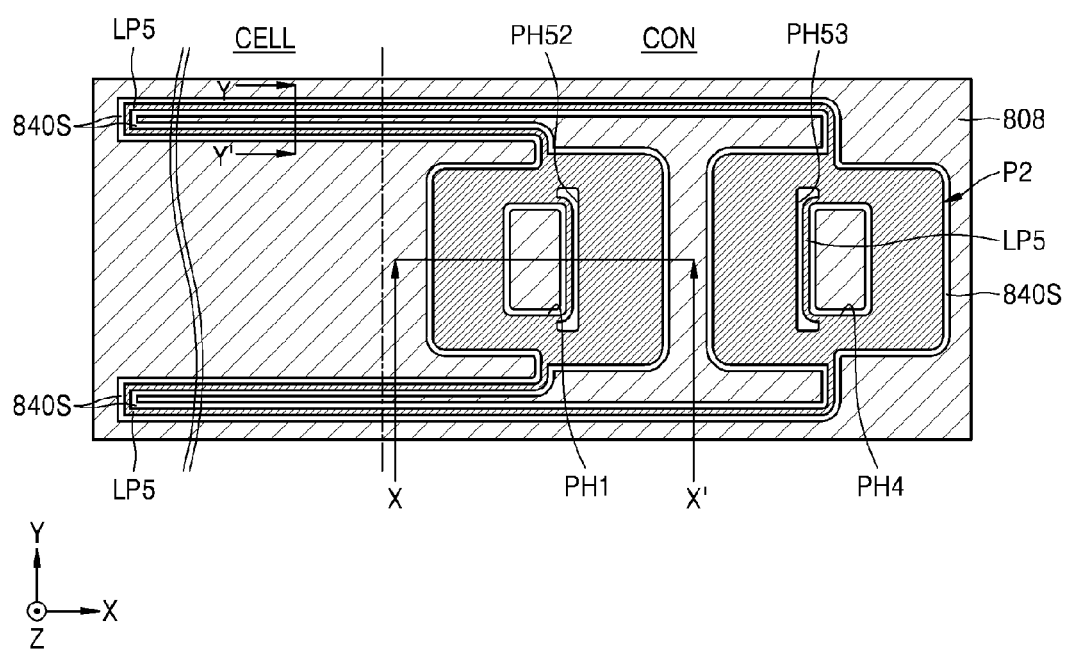
Figure 44B:
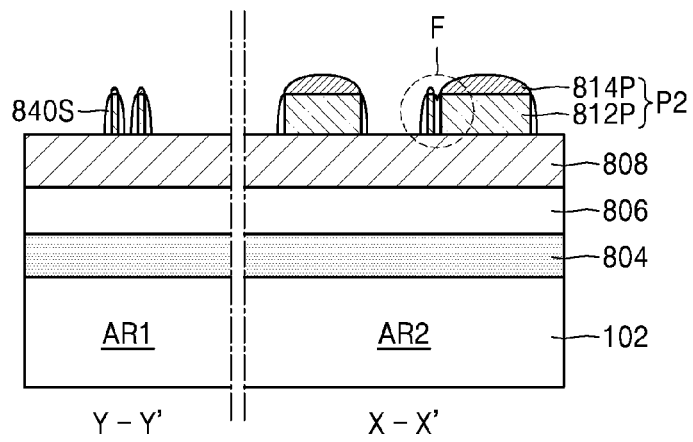

Referring to FIGS. 44A and 44B, the second spacer 840S that covers side walls of the second structure P2 is formed by forming a second spacer layer that covers exposed surfaces of the second structure P2 and the second hard mask layer 808 to a uniform thickness and then performing etch-back on the second spacer layer.

Since the second pad hole PH52 and the third pad hole PH53 of the second structure P2 have relatively small widths as shown in FIG. 43A, even after the second spacer layer is etched back, the second spacer layer may remain to fill the second pad hole PH52 and the third pad hole PH53 as shown on a portion "F" in FIG. 44B, and thus the second spacer 840S may not be formed on side walls of the second structure P2 in the second pad hole PH52 and the third pad hole PH53.

Figure 45A:
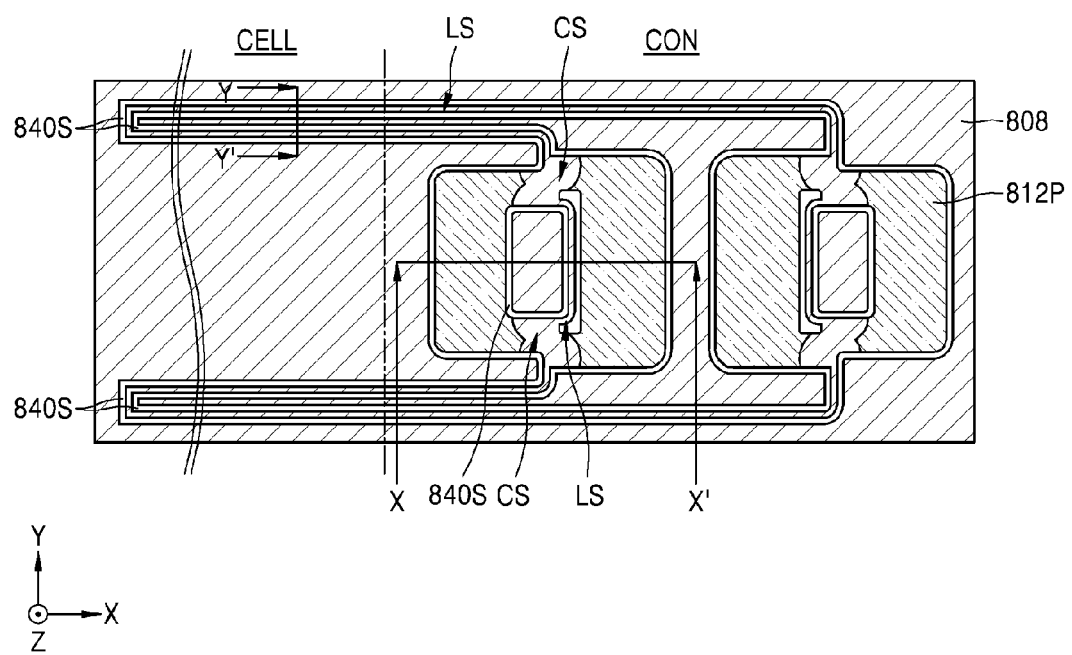
Figure 45B:
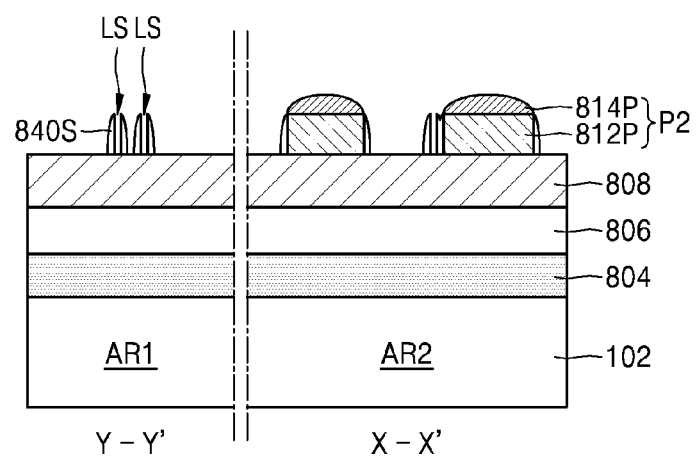

Referring to FIGS. 45A and 45B, only a portion of the second structure P2 that corresponds to the line structure LP5 (see FIGS. 44A and 44B) is selectively removed, in a manner similar to that described with reference to FIGS. 18A and 18B. For convenience of explanation, the fourth hard mask pattern 814P that covers the third hard mask pattern 812P is not shown in FIG. 45A.

In order to selectively remove only the portion of the second structure P2 that corresponds to the line structure LP5, a thickness difference of the fourth hard mask pattern 814P of the second structure P2 may be used. While only the portion of the second structure P2 that corresponds to the line structure LP5 is selectively removed, a portion from among portions of the third hard mask pattern 812P that have relatively large widths and are covered by the fourth hard mask pattern 814P may be removed, and thus the communication space CS that enables different line spaces LS that are spaced apart from each other to communicate with each other (by defining an electrically isolating space or cavity without obstructions therebetween) may be formed.

Figure 46A:
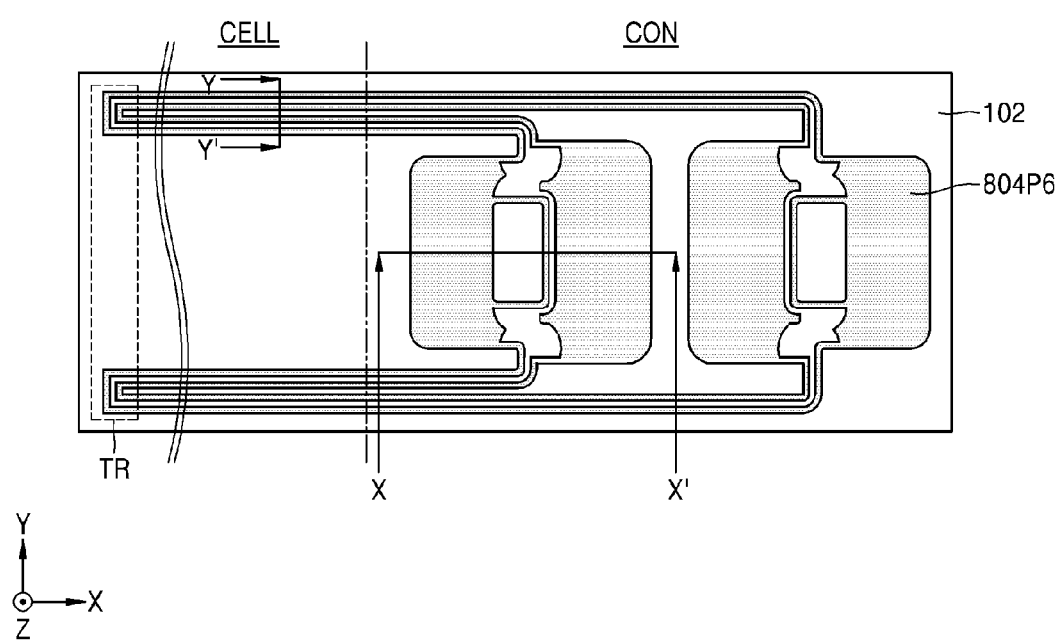
Figure 46B:
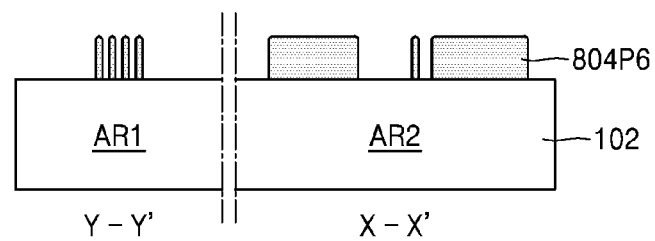

Referring to FIGS. 46A and 46B, the second hard mask pattern 808P is formed by etching the second hard mask layer 808 by using the second structure P2 remaining in a resultant structure of FIGS. 45A and 45B, a remaining portion of the second spacer layer filling the second pad hole PH52 and the third pad hole PH53, and the second spacer 840S as an etch mask and the first hard mask pattern 806P is formed by etching the first hard mask layer 806 by using the second hard mask pattern 808P as an etch mask, in a manner similar to that described with reference to FIGS. 19A through 20B. Next, a feature pattern 804P6 may be formed by etching the feature layer 804 by using the first hard mask pattern 806P as an etch mask and the plurality of conductive lines L10 and the plurality of contact pads CP50 of FIG. 9 may be formed by removing unnecessary films remaining on the feature pattern 804P6 and removing some portions of the feature pattern 804P6, for example, portions "TR" of the feature pattern 804P6.

Although methods of manufacturing the integrated circuit device 500 of FIG. 9 have been described with reference to FIGS. 41A through 46B, the inventive concepts are not limited thereto. Various modifications and changes to the description of FIGS. 41A through 46B may be made without departing from the scope of the inventive concepts.

According to the method of manufacturing an integrated circuit device of FIGS. 41A through 46B, when an integrated circuit device having a structure in which a plurality of contact pads share two conductive lines that are spaced apart from each other is formed, an additional trimming process for separating each contact pad into two in the connection region CON may be omitted. Accordingly, a process of manufacturing an integrated circuit device may be simplified and a sufficient process margin for forming a plurality of fine patterns may be ensured.

FIGS. 47A through 47F are plan views for explaining methods of manufacturing an integrated circuit device according to embodiments according to an example process order. Another method of manufacturing the integrated circuit device 100 of FIG. 4 will be explained with reference to FIGS. 47A through 47F. In FIGS. 47A through 47F, the same elements as those in FIGS. 1 through 46B are denoted by the same reference numerals, and thus a detailed explanation thereof will not be given.

Figure 47A:
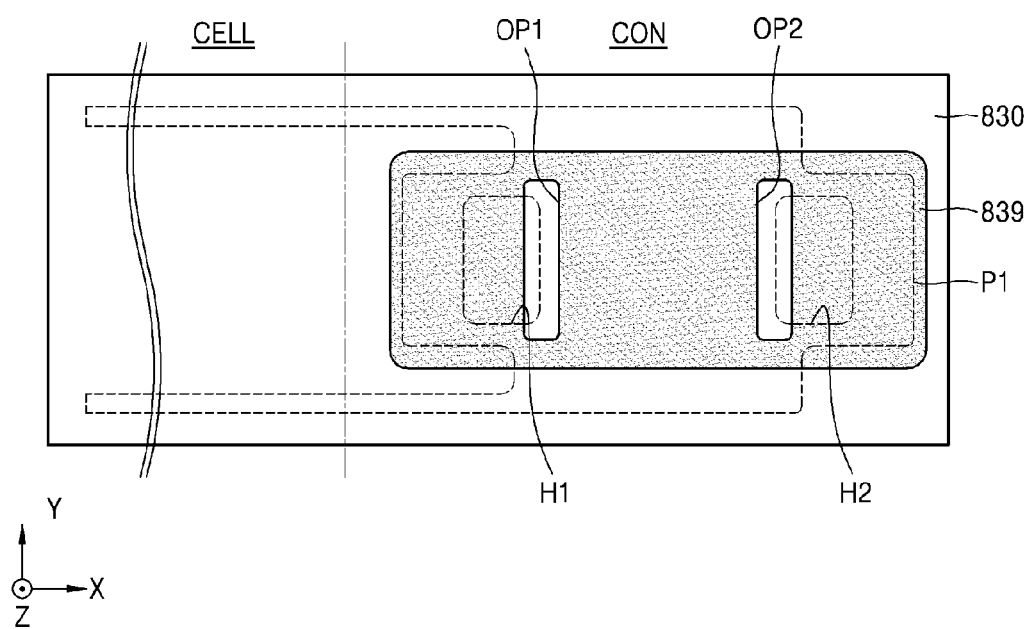
FIGS. 47A through 47F are plan views for explaining methods of manufacturing an integrated circuit device according to embodiments.

Referring to FIG. 47A, the first spacer layer 830 that covers exposed surfaces of the first structure P1 and exposed surfaces of the fourth hard mask layer 814 to a uniform thickness is formed in the same manner as that described with reference to FIGS. 11A through 13B, and then a pad defining mask 839 that covers the first structure P1 is formed on the first spacer layer 830.

The pad defining mask 839 extends to cover all of the two reference holes H1 and H2 formed in the first structure P1. Unlike in the pad defining mask 834 of FIG. 14A, two openings are formed in one pad defining mask 839. That is, the first opening OP1 that perpendicularly overlaps a part of the reference hole H1 and the second opening OP2 that perpendicularly overlaps a part of the reference hole H2 are formed in the pad defining mask 839. In some embodiments, the pad defining mask 839 may include a photoresist pattern.

Figure 47B:
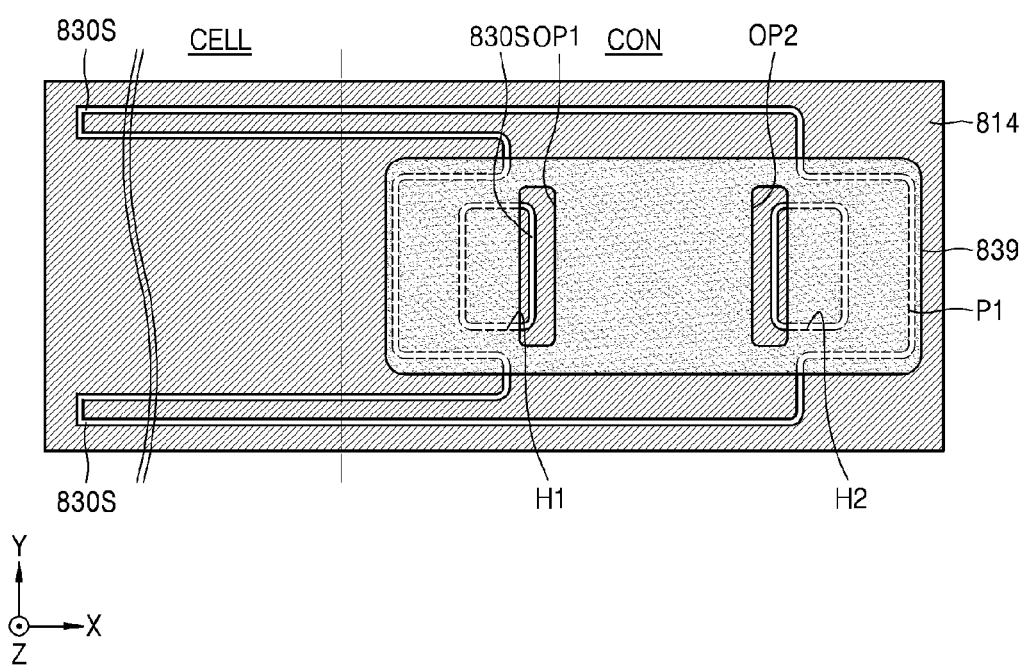

Referring to FIG. 47B, the first spacer 830S is formed by performing etch-back on the first spacer layer 830 that is exposed around the pad defining mask 839 by using the pad defining mask 839 as an etch mask and the fourth hard mask layer 814 is exposed around the first spacer 830S and the pad defining mask 839 by removing portions of the first structure P1 that are exposed around the pad defining mask 839, in a manner similar to that described with reference to FIGS. 15A and 15B.

A part of the first spacer 830S may be exposed through the first opening OP1 and the second opening OP2 formed in the pad defining mask 839.

Figure 47C:
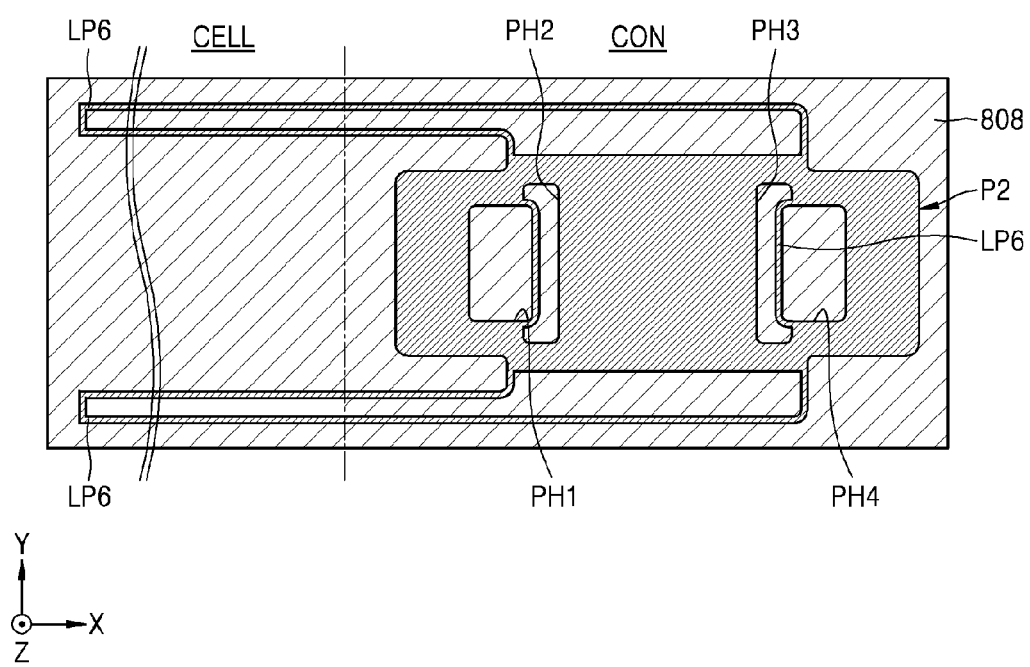

Referring to FIG. 47C, the second structure P2 including the third hard mask pattern 812P and the fourth hard mask pattern 814P is formed by removing the pad defining mask 839 from a resultant structure of FIG. 47B and sequentially etching the fourth hard mask layer 814 and the third hard mask layer 812 by using the first spacer 830S, a remaining portion of the first spacer layer 830, and a remaining portion of the first structure P1 as an etch mask.

The first pad hole PH1, the second pad hole PH2, the third pad hole PH3, and the fourth pad hole PH4 are formed in the second structure P2. Also, the second structure P2 includes a line structure LP6 having a shape corresponding to that of the first spacer 830S of FIG. 47B.

Figure 47D:
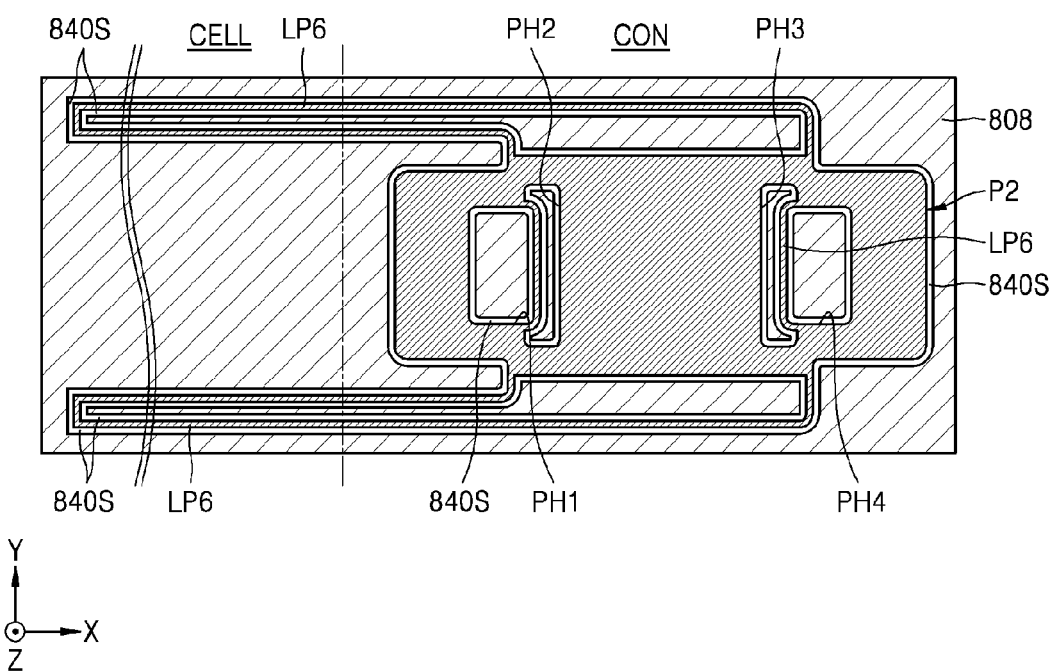

Referring to FIG. 47D, the second spacer 840S that covers side walls of the second structure P2 is formed by forming a second spacer layer that covers exposed surfaces of the second structure P2 and the second hard mask layer 808 to a uniform thickness and then performing etch-back on the second spacer layer.

Figure 47E:
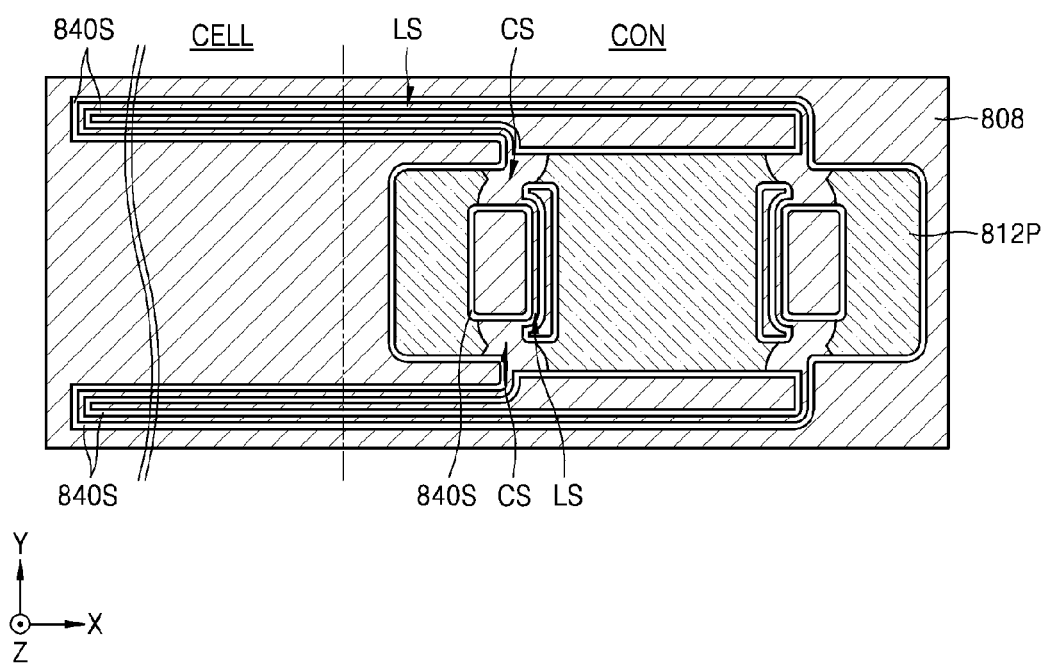

Referring to FIG. 47E, only a portion of the second structure P2 that corresponds to the line structure LP6 is selectively removed, in a manner similar to that described with reference to FIGS. 18A and 18B. For convenience of explanation, the fourth hard mask pattern 814P that covers the third hard mask pattern 812P is not shown in FIG. 47E.

In order to selectively remove only the portion of the second structure P2 that corresponds to the line structure LP6, a thickness difference of the fourth hard mask pattern 814P that corresponds to the second structure P2 may be used. While only the portion of the second structure P2 that corresponds to the line structure LP6 is selectively removed, a portion from among portions of the third hard mask pattern 812P that have relatively large widths and are covered by the fourth hard mask pattern 814P may be removed, and thus the communication space CS that enables different line spaces LS that are spaced apart from each other to communicate with each other (by defining an electrically isolating space or cavity without obstructions therebetween) may be formed.

Figure 47F:
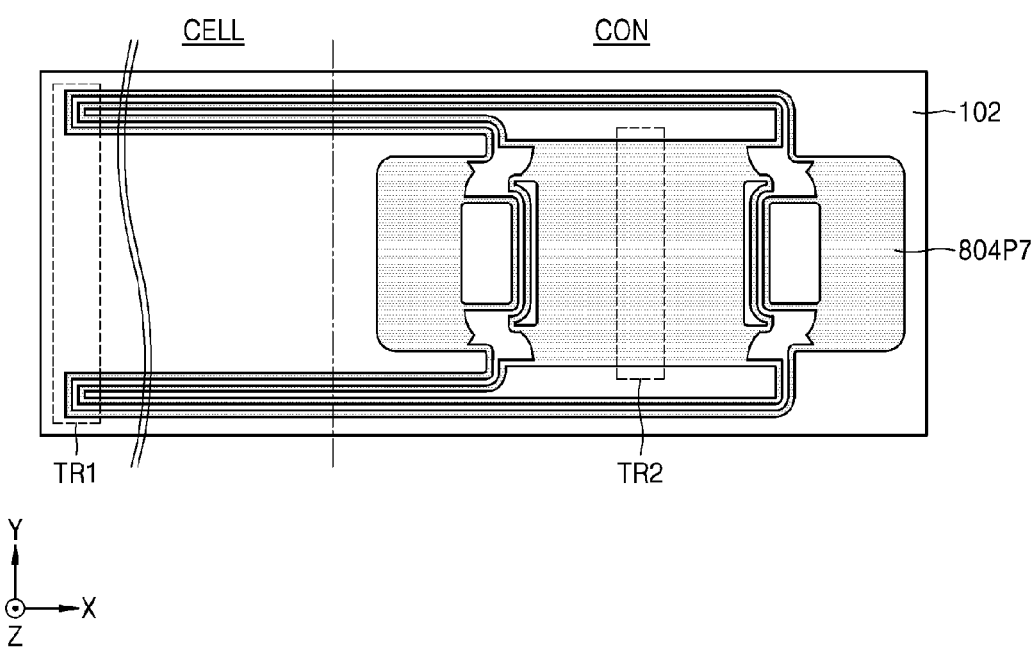

Referring to FIG. 47F, the second hard mask pattern 808P is formed by etching the second hard mask layer 808 by using the second structure P2 and the second spacer 840S as an etch mask and the first hard mask pattern 806P is formed by etching the first hard mask layer 8Q6 by using the second hard mask pattern 808P as an etch mask, in a manner similar to that described with reference to FIGS. 19A through 20B. Next, a feature pattern 804P7 is formed by etching the first hard mask pattern 806P as an etch mask and unnecessary films remaining on the feature pattern 804P7 are removed.

Next, the plurality of conductive lines L10 and the plurality of contact pads CP10 of FIG. 4 may be formed by removing some portions of the feature pattern 804P7, for example, portions "TR1" and "TR2" of the feature pattern 804P7, by using a trimming process.

Figure 48:
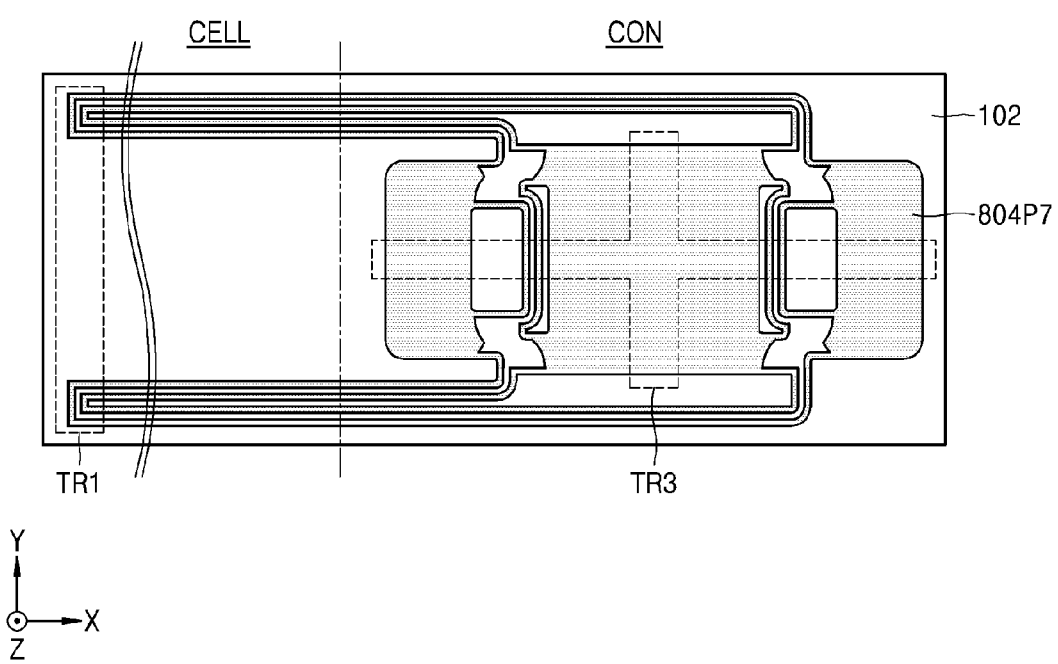
FIG. 48 is a plan view for explaining another method of manufacturing an integrated circuit device according to embodiments.

FIG. 48 is a plan view for explaining another method of manufacturing an integrated circuit device according to embodiments. Methods of manufacturing the integrated circuit device 600 of FIG. 10 will now be explained with reference to FIG. 48.

Referring to FIG. 48, processes described with reference to FIGS. 47A through 47F are performed. However, unlike in FIG. 47F, the plurality of conductive lines L10 and the plurality of contact pads CP60 of FIG. 10 may be formed by removing some portions of the feature pattern 804P7, for example, portions "TR1" and "TR3" of the feature pattern 804P7, to perform a trimming process on the feature pattern 804P7.

Figure 49:
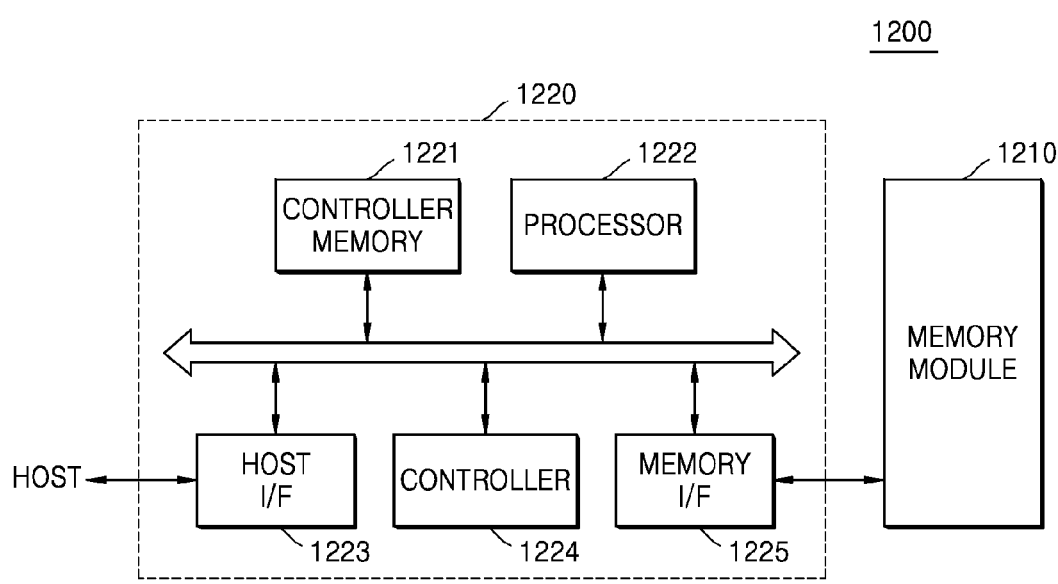
FIG. 49 is a block diagram of a memory card including an integrated circuit device formed according to embodiments.

FIG. 49 is a block diagram of a memory card 1200 including an integrated circuit device according to embodiments.

The memory card 1200 includes a memory controller 1220 that generates a command and an address signal and a memory module 1210, for example, a flash memory including one or plurality of flash memory devices. The memory controller 1220 includes a host interface 1223 that transmits a command and an address signal to a host or receives a command and an address signal from the host, and a memory interface 1225 that transmits a command and an address signal to the memory module 1210 or receives a command and an address signal from the memory module 1210. The host interface 1223, a controller 1224, and the memory interface 1225 communicate with a controller memory 1221 such as a static random-access memory (SRAM) and a processor 1222 such as a central processing unit (CPU) through a common bus.

The memory module 1210 receives a command and an address signal from the memory controller 1220, stores data in at least one memory device of the memory module 1210 in response, and searches at least one memory device for data. Each memory device includes a plurality of addressable memory cells and a decoder that receives a command and an address signal and generates a row signal and a column signal to access at least one of the addressable memory cells during program and read operations.

At least one of elements of the memory card 1200 including the memory controller 1220, electronic devices (e.g., 1221, 1222, 1223, 1224, and 1225) included in the memory controller 1220, and the memory module 1210 may include at least one of the integrated circuit devices 100, 200, 300, 300A, 400, 500, and 600 of FIGS. 1 through 10 and modifications thereof without departing from the scope of the inventive concepts.

Figure 50:
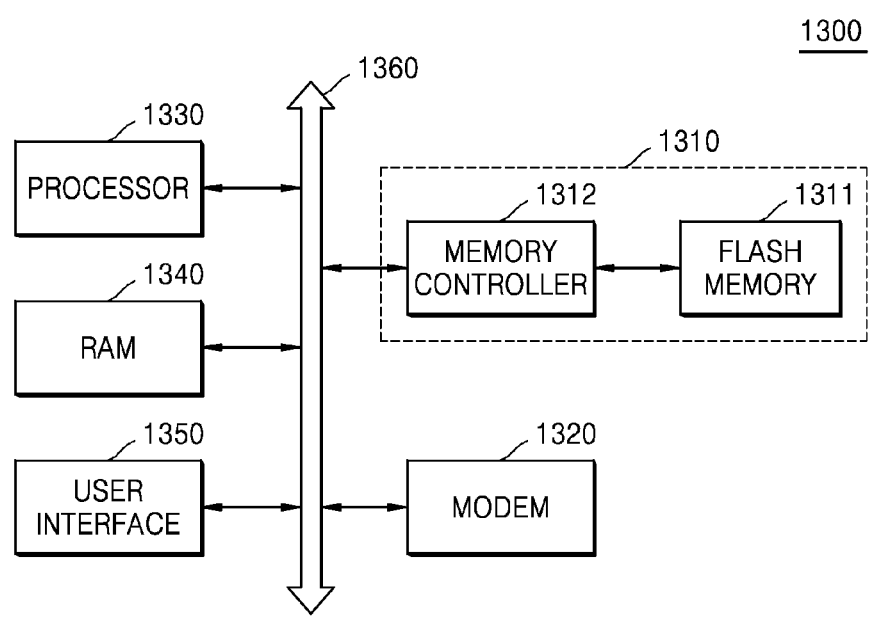

FIG. 50 is a block diagram of a memory system 1300 employing a memory card 1310 including an integrated circuit device according to embodiments.

The memory system 1300 may include a processor 1330 such as a CPU, a random-access memory (RAM) 1340, a user interface 1350, and a modem 1320 which communicate through a common bus 1360. Each device transmits a signal to the memory card 1310 and receives a signal from the memory card 1310 through the common bus 1360. At least one of elements of the memory system 1300 including the memory card 1310, the processor 130, the RAM 1340, the user interface 1350, and the modem 1320 may include at least one of the integrated circuit devices 100, 200, 300, 300A, 400, 500, and 600 of FIGS. 1 through 10 and modifications thereof without departing from the scope of the inventive concepts.

The memory system 1300 may be used in various electronic applications. For example, the memory system 1300 may be applied to solid-state drives (SSDs), CMOS image sensors (CISs), and computer application chip sets.

Memory systems and devices disclosed herein may be packaged into any of various device packages including, but not limited to, a ball grid array (BGA), a chip scale package (CSP), a plastic leaded chip carrier (PLCC), a plastic dual in-line package (PDIP), a multi-chip package (MCP), a wafer-level fabricated package (WFP), and a wafer-level processed stock package (WSP).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. The term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concept.

It will also be understood that when an element is referred to as being "on" or "connected to" another element, it can be directly on or connected to the other element, or intervening elements may be present. In contrast, when an element is referred to as being "directly on" or "directly connected to" another element, there are no intervening elements present. It will also be understood that the sizes and relative orientations of the illustrated elements are not shown to scale, and in some instances they have been exaggerated for purposes of explanation.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the inventive concepts have been particularly shown and described with reference to embodiments thereof, it will be understood that various changes in form and details may be made therein without departing from the spirit and scope of the following claims.

What is claimed is:

1. An integrated circuit device comprising:
    a first conductive line and a second conductive line that are spaced apart from each other and extend in a first direction to be parallel to each other; and
    a contact pad comprising a pad body comprising a first branch portion from which the first conductive line branches and a second branch portion from which the second conductive line branches and a loop branch portion that is located between the first branch portion and the second branch portion and protrudes from the pad body.

2. An integrated circuit device comprising:
    a plurality of conductive lines that are spaced apart from one another;
    a first contact pad shared by a first conductive line and a second conductive line selected from among the plurality of conductive lines and integrally connected with the first conductive line and the second conductive line; and a second contact pad shared by a third conductive line and a fourth conductive line selected from among the plurality of conductive lines and integrally connected with the third conductive line and the fourth conductive line, wherein the first contact pad comprises:
- a first pad body comprising a first branch portion from which the first conductive line branches and a second branch portion from which the second conductive line branches; and
- a first loop branch portion that protrudes from the first pad body toward the second contact pad and has respective ends integrally connected to the first pad body.

3. The integrated circuit device of claim 2, wherein the first, second, third, and fourth conductive lines extend in a first direction to be parallel to one another.

4. The integrated circuit device of claim 2, wherein a minimum distance between the first conductive line and the third conductive line is the same as a minimum distance between the second conductive line and the fourth conductive line.

5. The integrated circuit device of claim 2, wherein the first pad body faces the second contact pad with the first loop branch portion therebetween.

6. The integrated circuit device of claim 2, wherein the first contact pad is located in a space between the first conductive line and the second conductive line, and the second contact pad is located at a position beyond a space between the third conductive line and the fourth conductive line.

7. The integrated circuit device of claim 6, wherein the first conductive line and the second conductive line are located between the third conductive line and the fourth conductive line and extend in parallel to the third conductive line and the fourth conductive line.

8. The integrated circuit device of claim 2, wherein the first contact pad is located at a position beyond a space between the first conductive line and the second conductive line, and the second contact pad is located in a space between the third conductive line and the fourth conductive line.

9. The integrated circuit device of claim 8, wherein the third conductive line and the fourth conductive line are located between the first conductive line and the second conductive line and extend in parallel to the first conductive line and the second conductive line.

10. The integrated circuit device of claim 2, wherein the first loop branch portion has a shape that convexly curves toward the second contact pad.

11. The integrated circuit device of claim 2, wherein the first loop branch portion comprises a recess that concavely curves toward the first pad body.

12. The integrated circuit device of claim 2, wherein the second contact pad comprises:
- a second pad body comprising a third branch portion from which the third conductive line branches and a fourth branch portion from which the fourth conductive line branches; and
- a second loop branch portion that protrudes from the second pad body toward the first contact pad and has respective ends integrally connected to the second pad body.

13. The integrated circuit device of claim 2, wherein a minimum distance between the first conductive line and the third conductive line is the same as a minimum distance between the first contact pad and the second contact pad.

14. The integrated circuit device of claim 2, further comprising a dummy pad having a ring shape and located between the first contact pad and the second contact pad.

15. An integrated circuit device, comprising:
- conductive lines that extend parallel to one another from a memory cell region to a connection region having a lower pattern density than the memory cell region; and
- a first contact pad and a second contact pad in the connection region that are integrally connected to a first pair of the conductive lines and a second pair of the conductive lines, respectively, by respective branch portions that extend non-parallel to the conductive lines, wherein at least one of the first and second contact pads comprises a loop branch portion having opposing ends that are integrally connected thereto between the respective branch portions thereof, and wherein the loop branch portion extends away from the at least one of the first and second contact pads and toward another of the first and second contact pads in a space therebetween.

16. The device of claim 15, wherein the first pair of the conductive lines and the first contact pad are arranged in a nested configuration relative to the second pair of the conductive lines and the second contact pad such that the first contact pad is between the second pair of the conductive lines and the loop branch portion extends beyond the first pair of the conductive lines.

17. The device of claim 15, wherein the loop branch portion is a first loop branch portion having the opposing ends that are integrally connected to the first contact pad between the respective branch portions thereof, and wherein the second contact pad comprises a second loop branch portion facing the first loop branch portion and having opposing ends that are integrally connected to the second contact pad between the respective branch portions thereof.

18. The device of claim 17, wherein one of the first and second loop branch portions defines a concave shape, and wherein another of the first and second loop branch portions defines a convex shape that is matably adapted to fit the concave shape.

19. The device of claim 15, further comprising:
- at least one dummy conductive pattern that is arranged in the space between the first and second contact pads adjacent the loop branch portion thereof and is electrically isolated from the first and second contact pads.

20. The device of claim 15, wherein:
- the first contact pad comprises a first divided portion integrally connected to one of the first pair of the conductive lines, and a second divided portion integrally connected to another of the first pair of the conductive lines and separated from the first divided portion; and
- the second contact pad comprises a third divided portion integrally connected to one of the second pair of the conductive lines, and a fourth divided portion integrally connected to another of the second pair of the conductive lines and separated from the third divided portion.

* * * * *